United States Patent [19]
Murakami et al.

[11] Patent Number: 5,642,365
[45] Date of Patent: Jun. 24, 1997

[54] TRANSMITTER FOR ENCODING ERROR CORRECTION CODES AND A RECEIVER FOR DECODING ERROR CORRECTION CODES ON A TRANSMISSION FRAME

[75] Inventors: Tokumichi Murakami; Kazuhiro Matsuzaki; Yoshiaki Kato; Hideo Yoshida; Atsuhiro Yamagishi, all of Kanagawa, Japan

[73] Assignee: Mitsubishi Denki Kabushiki Kaisha, Tokyo, Japan

[21] Appl. No.: 255,364

[22] Filed: Jun. 8, 1994

[30] Foreign Application Priority Data

Jul. 5, 1993 [JP] Japan .................................. 5-165533
Oct. 22, 1993 [JP] Japan .................................. 5-264933

[51] Int. Cl.$^6$ .............................................. H03M 13/00
[52] U.S. Cl. ........................ 371/38.1; 371/37.7; 371/39.1
[58] Field of Search ............................ 371/37.1, 37.2, 371/37.4, 37.7, 38.1, 39.1

[56] References Cited

U.S. PATENT DOCUMENTS

| | | | |
|---|---|---|---|
| 5,010,553 | 4/1991 | Scheller et al. | 371/35 |
| 5,159,452 | 10/1992 | Kinoshita et al. | 358/141 |
| 5,179,560 | 1/1993 | Yamagishi et al. | 371/38.1 |

FOREIGN PATENT DOCUMENTS

| | | |
|---|---|---|
| 0208537 | 1/1987 | European Pat. Off. . |
| 0153333 | 7/1988 | European Pat. Off. . |
| 0516042 | 12/1992 | European Pat. Off. . |
| 61-090543 | 5/1986 | Japan . |
| 63-250738 | 10/1988 | Japan . |

OTHER PUBLICATIONS

Shacham, N., et al., "Packet Recovery in High-Speed Networks Using Coding and Buffer Management", *INFOCOM '90*, 1990, pp. 124–131.

Kishimoto, R., et al., "HDTV Transmission System Design in an SDH–based STM Network", *1991 IEEE Int'l. Conf. on Communications*, 1991, pp. 491–495.

Ohta, H., et al., "A Technique to Detect and Compensate Consecutive Cell Loss in ATM Networks", *INFOCOM '91*, 1991, pp. 781–790.

Kinoshita, T., et al., "Variable–Bit–Rate HDTV CODEC with ATM–Cell–Loss Compensation", *IEEE Trans. on Circuits and Systems for Video Technology*, vol. 3, No. 3, Jun. 1993, pp. 230–237.

Karlsson, G., et al., "Packet Video and Its Integration into the Network Architecture", *IEEE Journal on Selected Areas in Communication*, vol. 7, No. 5, Jun. 1989, pp. 739–751.

S. Honda, et al "DSD Concatenated FEC Scheme in Mobile Satellite Communication Systems" IEEE Oct. 1992.

John L. Ramsey "Realization of Optimum Interleaves", May 1970.

Houdoin, Cochennec & LeHir "Short term video on ATM networks" Centre National d–Etudes des Telecommunications Lannion, France.

International Telegraph & Telephone Consultative Committee "Study Group XVIII—Report R 116".

*Primary Examiner*—Stephen M. Baker
*Attorney, Agent, or Firm*—Wolf, Greenfield & Sacks, P.C.

[57] ABSTRACT

It is an object of this invention to carry out error correcting coding for random errors and cell loss effectively and to obtain a transmitter for coding error correction codes and a receiver for decoding error correction codes on a transmission frame which minimizes transmission delay. This apparatus includes several elements. A buffer memory divides N data symbols of a data transmission cell into p blocks and stores the p data blocks for each of L cells to form a transmission frame. A check code generator carries out the error correcting coding in the unit of p blocks in a direction orthogonal to the direction of transmission. A cell composer selects a specific cell of p blocks having N data symbols and generates a transmission cell. A counter appends an identifier to the top of cells in the transmission direction. The cell with the identifier is transmitted after being replaced with a part of the coding cells as requested.

53 Claims, 33 Drawing Sheets

FIG.42
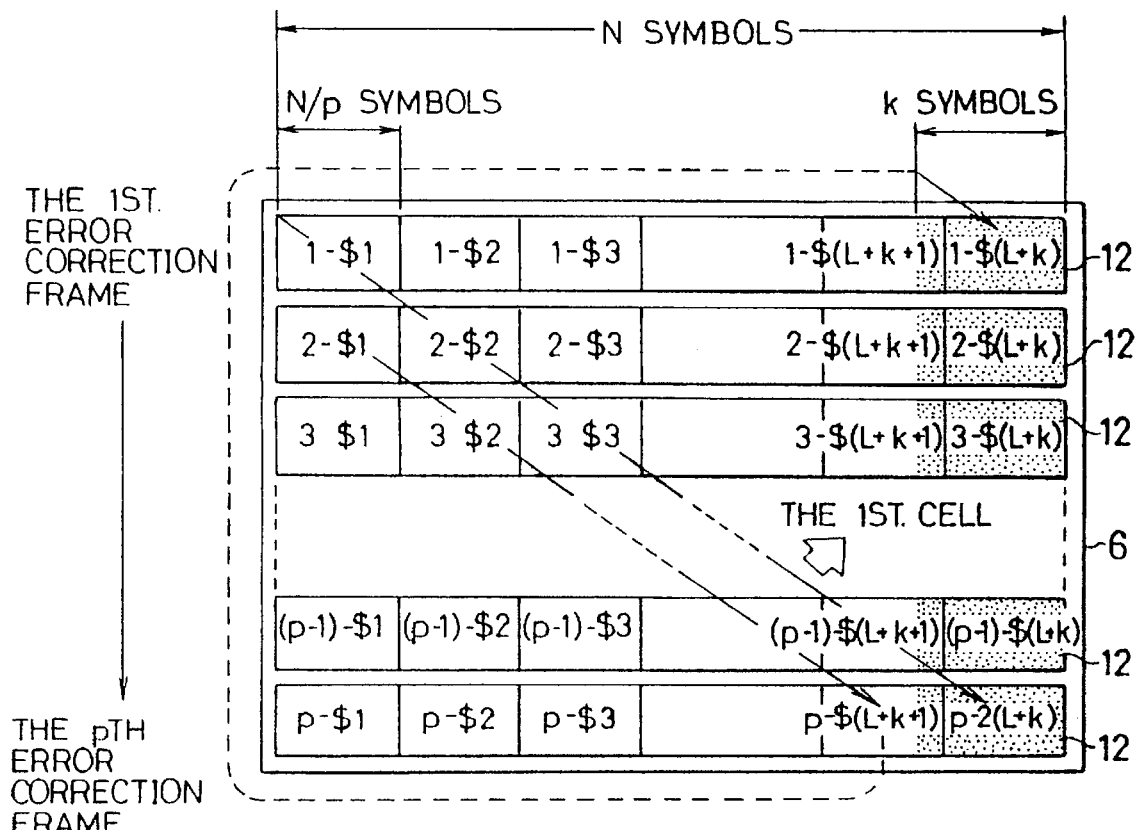
(a)
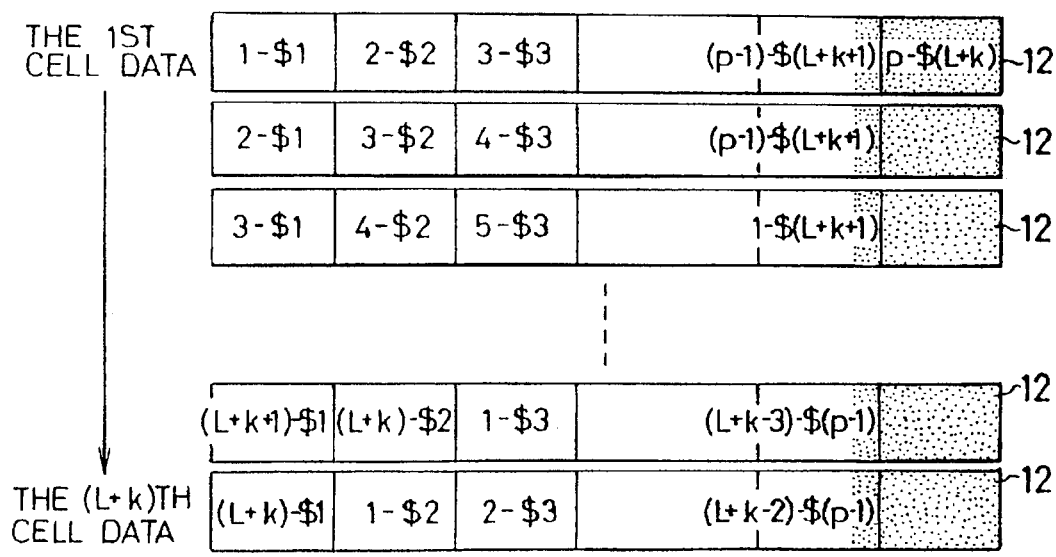
(b)

TRANSMITTER FOR ENCODING ERROR CORRECTION CODES AND A RECEIVER FOR DECODING ERROR CORRECTION CODES ON A TRANSMISSION FRAME

BACKGROUND OF THE INVENTION

1. Field of the Invention

The present invention relates to a transmitter for coding error correction codes and the receiver for decoding error correction codes on a transmission frame which transmits data in the units of cells (packets) in Asynchronous Transfer Mode. The Asynchronous Transfer Mode may especially generate burst errors caused by cell loss, adding to random errors.

2. Description of the Related Art

Conventionally, the transmitter and receiver for coding error correction codes in which random errors and burst errors may occur uses interleave methods. Symbols are set in two directions, which are the direction of transmission, and the orthogonal direction of transmission: Error correction codes are generated in the orthogonal direction of transmission.

FIG. 44 shows a transmission frame composed of cells which applies interleave methods. The interleave methods are described in page 220 "Hugo-riron (Code Theory)" written by Hideki Imai published by The Institute of Electronics Information and a Communication Engineers (Heisei 2).

L data cells 1 are composed of N data symbols, in FIG. 44. K check cells 2 are composed of N check symbols. The transmission frame has L data cells and K check cells. The transmission frame comprising (L+K) cells uses interleave method. Input data are set from point A in the upper left of the transmission frame to B, are set at C point in the direction of numeral 3, and ends at D point in the right.

The operation is explained as follows. In FIG. 44, error correction coding is carried out from L symbols in every data cell to the orthogonal direction of transmission, that is, the horizontal direction (the X direction in FIG. 44). Then, K check symbols are generated and stored in K check cells 2. The transmission frame is transmitted in cell units in the Y direction (the vertical direction), in FIG. 44. Assuming that error correction codes are Reed Solomon codes having a frame length for error correction of (L+k) symbols and K check symbols, errors of K/2 symbols (Omit fractions) can be corrected in the X direction. A maximum loss of K cells caused by transmission noise or congestion of network can be decoded, if the location of the lost data cells is identified.

The transmission frame includes data in an information field 42 between an information header 41 and an information trailer 43 as shown in FIG. 43. Problems to be Solved by the Invention As has been described in the related art, the conventional transmission frame composed of cells uses interleave methods in units of symbols for the error correcting coding. In order to correct errors effectively, it is necessary to set the length of (L+k) symbols for the transmission frame relatively long and transmit the frame after data of L cells is buffered. Decoding is carried out after all (L+k) cells are received. Therefore, in case slow-speed transmission is performed, the conventional art contains the problem of transmission delay being increased In addition, it has also no way of finding the location of the cell loss. It has also insufficient efficiency in coding because coding is done symbol by symbol.

The present invention is done so as to solve the foregoing problems. The transmission frame is transmitted before all (L+K) cells are buffered. In the present invention, transmission has started at an early stage. Then it maintains an effective error correcting ability for both random errors and burst errors caused by cell loss. And, it is an object of the present invention to provide an apparatus which can detect the location of cell loss easily, and has an effective error correcting ability.

SUMMARY OF THE INVENTION

The present invention is designed to solve the forgoing problems. It is a primary object of the present invention to provide an apparatus which can maintain an effective error correcting ability for both random errors and burst errors caused by cell loss, symbol loss or symbol change. Here, transmission of the transmission frame begins before all (L+k) cells are buffered, and the starting time for transmission can be set earlier than conventional systems.

Another object of the present invention is to detect the location of cell loss easily. Another object of the present invention is to have an effective error correcting ability.

Another object of the invention is to make the apparatus small in scale by performing error correcting coding in block units after dividing N data symbols into p blocks.

Another object of the invention is to detect the location of cell loss more easily by attaching identifiers to all the transmission cells including check cells.

Another object of the invention is to recover the missing block data using one frame for error correction which has just one error correction code in each cell in case of replacing one of data cells with one of check cells.

Another object of the invention is to increase reliability for recovering cell loss in the face of long disturbances by transmitting transmission data after the transmission frame is newly composed of cells exchanged between the present frame and the next one.

Another object of the invention is to recover cell loss more easily and minimize the scale of decoding or the process of decoding at the receiver site, using the same rule of coding that is applied at the transmitter site. That is, identifiers are detected and cells are divided into p blocks.

Another object of the invention is to detect synchronization easily even if no identifiers are appended.

Another object of the invention is to increase transmission efficiency and a function for detecting and correcting errors, providing an error detecting circuit in addition to an error correcting circuit by applying the interleave methods and the transmission cell which has attached identifiers and error detecting codes in the orthogonal direction of transmission. In this case, it is another object to obtain a transmitter which has a higher reliability.

And the other object is to detect errors with higher precision providing an error detecting circuit at the receiver site, corresponding to the transmitter site. In this case, it is another object to make the circuit small in scale by disconnecting the error correcting circuit as requested.

An error-correcting transmitter for storing data-cells of N×L symbols (N>=2, L>=2), and for transmitting the data-cells with k error-correction cells may include:

(A) a first buffer memory for storing the N symbols as a data-cell, and for sending the data-cell;

(B) a second buffer memory for receiving data-cells from the first buffer memory, for storing L number of the data-cells, and storing k number of the error-correction cells;

(C) a check-symbol generator for generating k number of the error-correction cells based on L number of the symbols to a direction of an error-correction frame in different direction from transmission in the second buffer memory, and for sending the error-correction cell to the second buffer memory; and, (D) a cell composer for composing the data-cell from the first buffer memory, for transmitting L number of the data-cells consecutively from the first buffer memory, and for transmitting the k number of the error-correction cells from the second buffer memory following to L number of the data-cells.

An error-correcting transmitter for storing (N/p)×p×L symbols (N>=2, p>=2, L>=2), in which the N/p is a data-block including N/p symbols, and for transmitting p×L data-blocks forming L number of data-cells with k error-correction cells as a unit of information-transmission, may include:

(A) a first buffer memory for storing and sending p number of the data-blocks as the data-cells;

(B) a second buffer memory for receiving the data-cell from the first buffer memory, for storing L number of the data-cells, and for storing k number of the error-correction cells;

(C) a check-symbol generator for generating k number of the error-correction cells based on L number of data-blocks in different direction of transmission in the second buffer memory by unit of data-block, and for sending the error-correction cells to the second buffer memory, in which data-blocks of L direction may form an error-correction frame; and, (D) a cell composer for transmitting L number of the data-cells from the second buffer memory before generating the k number of error-correction cells completely, and for transmitting k number of the error-correction cells following the L number of data-cells.

The error-correcting transmitter may further include an attacher for attaching cell-identifiers to each of the L data-cells.

In the error-correcting transmitter, a cell composer may exchange the cell-identifiers to each of the error-correction cells from the data-cells, and transmit each of the data-cells and the error-correction cells including the cell-identifier.

In the error-correcting transmitter, the cell composer may exchange the cell-identifiers to each of the error-correction cells from the data-cells in the same error-correction frame.

The error-correcting transmitter may further include a third buffer memory for storing the data-cells of a next information-transmission, in which a cell compose means alternately transmits the data-cell of the information-transmission from the second buffer memory and the data-cell of the next information-transmission from the third buffer memory.

An error-correcting receiver for receiving L number of p data-blocks including cell-identifiers (L>=2, p>=2) with k error-correction cells as a unit of information transmission, for correcting the data-blocks in error using an error-correction frame, and for decoding data from the data symbols, may include:

(A) a buffer memory for storing the L number of p data-blocks and the k error-correction cells including the cell-identifier in each p data-blocks and error-correction cell, in which each p data-block may form a data-cell including N data symbols;

(B) a cell-identifier detector for finding lost cells of the data-cells and error-correction cells by using the cell-identifiers; and, (C) an error-correction frame collector for collecting each data-block in one frame for error correction in a unit of each error-correction frame from the buffer memory, and, (D) an error-correction decoder for filling the lost cells in the buffer memory, for correcting data-blocks in error in the data-cells, and for decoding the N×L symbols of the data-blocks.

The error-correcting receiver may further include a synchronization detector for detecting synchronization state by monitoring the cell-identifiers.

The error-correcting receiver may further include a synchronization detector for detecting error status with plural error-syndrome detectors of each error-correction frame, and for detecting a synchronization state by monitoring outputs of the plural error-syndrome detectors.

An error-correcting transmitter for storing N×L data symbols (N>=2, L>=2), in which N data symbols may perform a data-cell, and for transmitting the data-cells with k error-correction cells as a unit of information-transmission may include:

(A) a buffer memory for storing L number of the data-cells, and for storing k number of the error-correction cells;

(B) an error-detection symbol generator for generating the error-detection symbol in each data-cell in the direction of transmission;

(C) a check-symbol generator for generating k number of the error-correction cells based on L number of the symbols to a direction of an error-correction frame in different direction from transmission in the buffer memory, and for sending the error-correction cell to the buffer memory; and, (D) a cell composer for composing the data-cell from the buffer memory including the error-detection symbol, for transmitting L number of the data-cells before generating the k error-correction cells completely, and for transmitting the k number of the error-correction cells from the buffer memory following to L number of the data-cells.

The error-correcting transmitter may further include an attacher for attaching cell-identifiers to each of the L data-cells.

In the error-correcting transmitter the error-detect-symbol generator may generate q×m error-detect symbols for q number of symbols.

An error-correcting receiver for receiving L data-cells of N×L data symbols including m error-detection symbols and cell-identifiers (N>=2, L>=2) with k error-correction cells as a unit of information-transmission, and for decoding data from the data symbols may include (A) a buffer memory for storing N×L data symbols including the cell-identifiers in each data-cell, and for storing k error-correction cells;

(B) a cell-identifier detector for detecting lost cells of the data-cells and error-correction cells by using the cell-identifiers;

(C) an error detector for detecting symbol error in the data-cells; and, (D) an error-correction decoder for filling the lost cells in the buffer memory, for correcting data symbols in the data-cells, and for decoding the N×L symbols of said data-cells.

The error-correcting receiver may further include an error-flag attacher for attaching an error-flag in case of detecting the symbol error in the data-cell.

An error-correcting receiver for receiving L data-cells of N×L data symbols including m error-detection symbols and cell-identifiers (N>=2, L>=2) with k error-correction cells as a unit of information-transmission, and for decoding data from the data symbols may include:

(A) a buffer memory for storing N×L data symbols including the cell-identifiers in each data-cell;

(B) a cell-identifier detector for detecting lost cells of the data-cells and error-correction cells by using the cell-identifiers;

(C) an error detector for detecting symbol error in the data-cells;

(D) an error-correction decoder for decoding the N×L symbols of the data-cells.

A method for transmitting N×L data symbols (N>=2, L>=2) with k error correction cells may include the steps of:

(A) storing N number of data for producing a data-cell;

(B) transmitting the data-cell; (C) storing L number of the data-cells for forming an error-correction frame in different direction from a transmission direction;

(D) generating error-correction symbols to perform error-correction cells based on the error-correction frame; and, (E) transmitting the error-correction cells.

The method may further include the step of attaching cell-identifiers in all data-cells and error-correction cells.

The method may include the step of attaching cell-identifiers to a symbol in all data cells and exchanging the cell-identifier in said data cell to an error-correction cell in the same error-correction frame.

BRIEF DESCRIPTION OF THE DRAWINGS

In the drawings,

FIG. 42 shows an explanatory view of the transmission frame of said twenty-seventh embodiment of the present invention;

DESCRIPTION OF THE PREFERRED EMBODIMENTS

Embodiment 1

Figure 1:
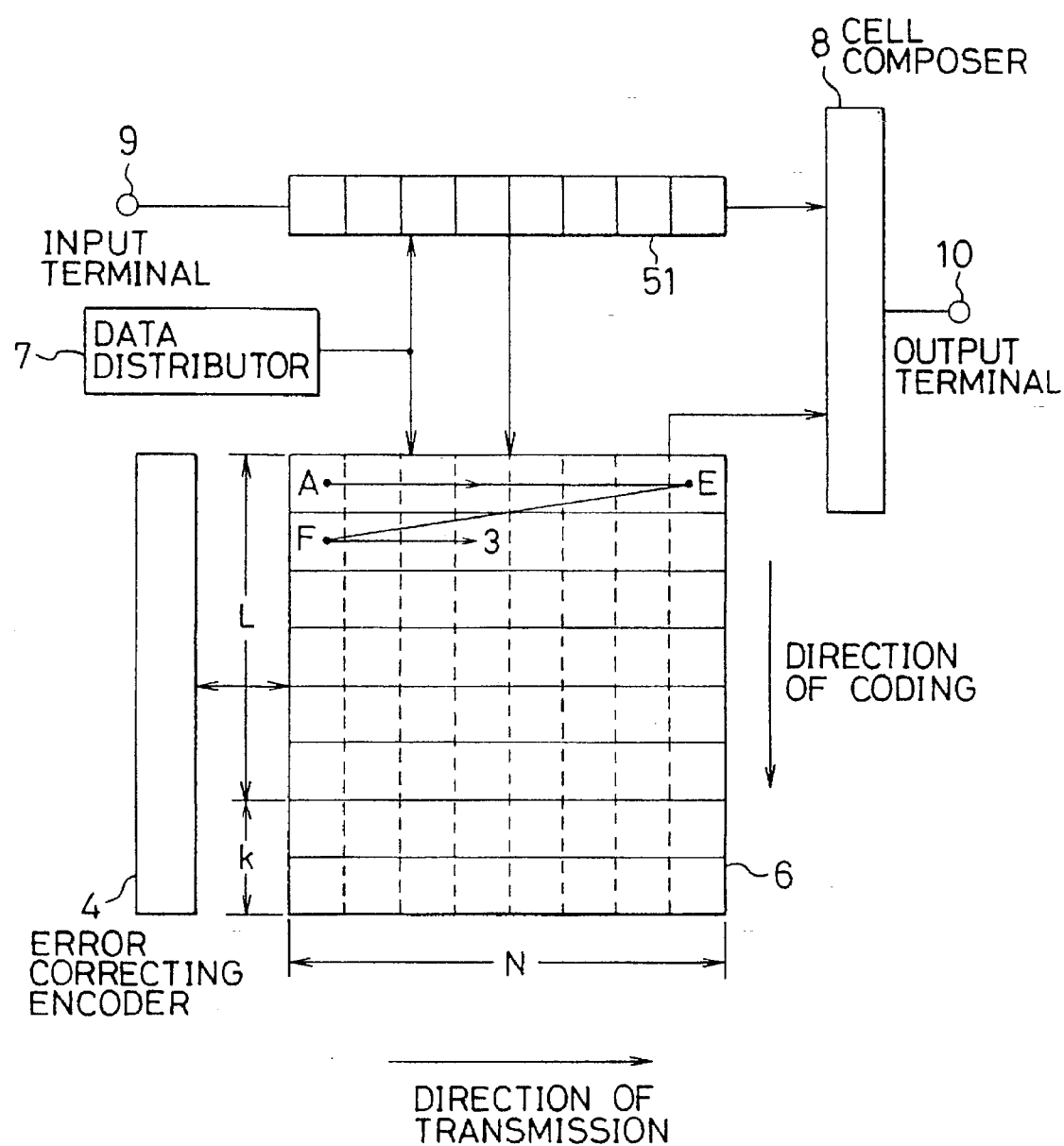
FIG. 1 shows a block diagram of the transmitter for coding error correction codes, according to a first embodiment of the present invention.

Embodiments of this invention will now be described hereinafter, referring to attached views. FIG. 1 shows an embodiment of the transmitter for coding error correction codes on the transmission frame based on the present invention. In the figure, an error correcting encoder 4 generates error correction codes having a frame length for error correction of (L+K) symbols and error correction length of K symbols; a register 51 temporarily stores data of N symbols; a buffer memory 6 stores entire input data as a transmission frame; a data distributor 7 indicates addresses of data in the buffer memory 6 transferred from the register 51; a cell composer 8 composes each transmission cell; and an input terminal 9 and an output terminal 10 transfer the data.

In the explanation of the present invention, data of N×(L+k) symbols are called a transmission frame, data of N×L symbols are called information of a transmission frame, data of (L+k) symbols are called a frame for error correction, and transmission data of N symbols are called a transmission cell.

The operation will now be described, and compared to conventional interleave methods. Here, the error correction codes are Reed Solomon error correction codes. As described in the related art, input data are filled into the buffer memory from point A, on the upper left of the transmission frame, in the direction of point E, and from point F in the direction of numeral 3, for forming the frame. In this embodiment, the width of the horizontal direction is assumed to be N symbols, and the data of N symbols are regarded as a transmission unit. Check symbols are generated in the vertical direction, that is, the orthogonal direction of transmission.

In the embodiment shown in FIG. 1, data through the input terminal 9 are temporarily stored in the register 51 in units of N symbols, then transferred to the cell composer 8 for generating the transmission cell. At the same time, the data of N symbols are transferred to the first row in the vertical direction in the buffer memory 6.

The next data of N symbols are transferred to the cell composer 8 as well as to the second row in the buffer memory 6. When block data of L cells are stored in the buffer memory 6, the error correcting encoder 4 forms a frame for error correction (FEC), which refers to the buffer memory, and generates k check symbols 2. After storing the check symbols in the assigned addresses of the buffer memory 6, check symbols 2 in k frames for error correction are read out in the horizontal or transmission direction and transmitted through the cell composer 8 as the transmission cell.

Thus, the apparatus based on the present invention has the advantage of the interleave methods and eliminates the transmission delay.

Figure 2:
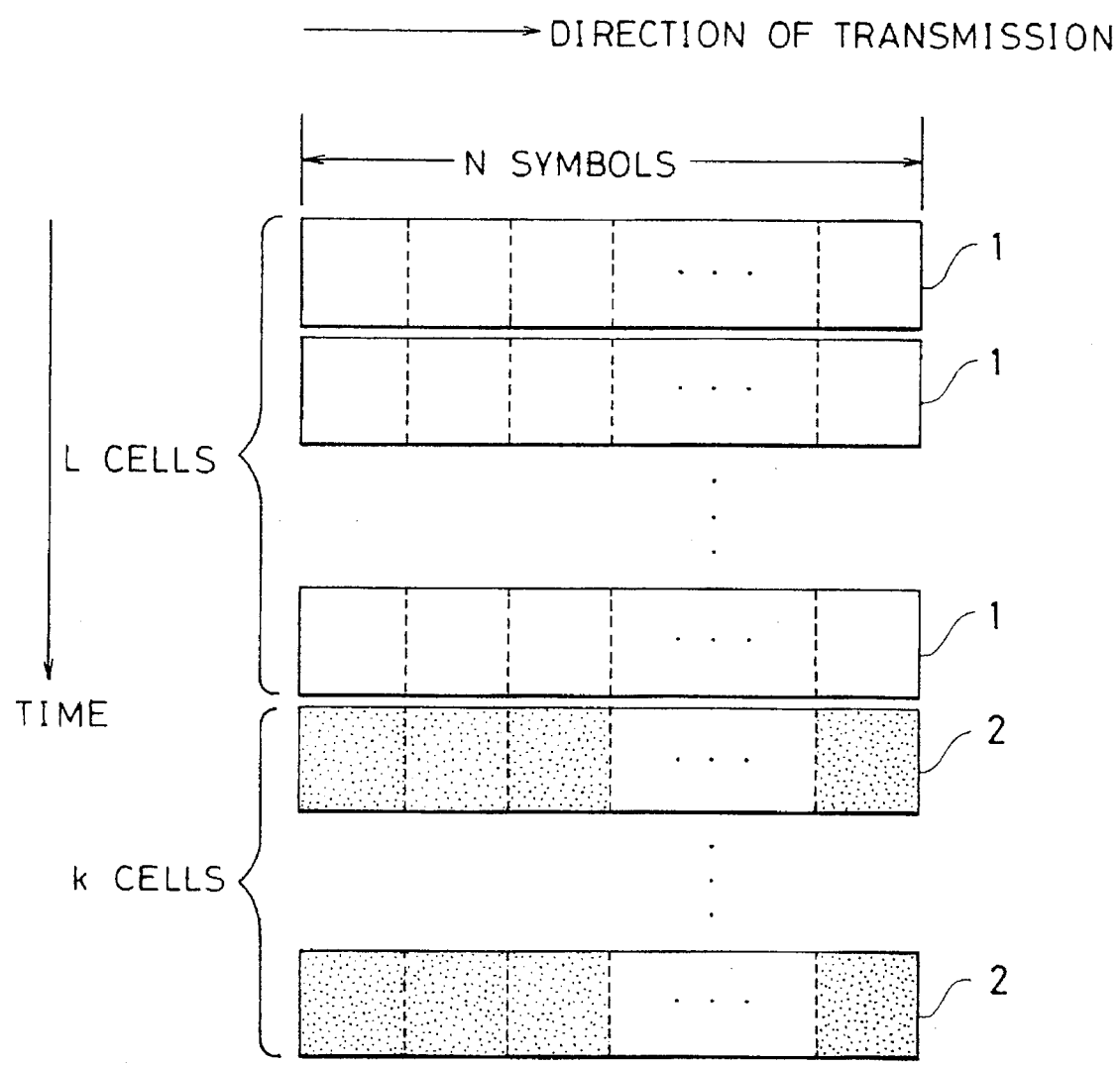
FIG. 2 shows a configuration of the transmission frame according to said first embodiment of the present invention.

FIG. 2 illustrates an array of block data in the buffer memory 6 as well as the configuration of the transmission frame in this embodiment. In the figure, numeral 1 shows a data cell, 2 shows a check cell. In this embodiment, error correction coding is performed in the orthogonal direction of transmission, by using L data cells and k check cells as one unit.

The transmitter for coding error correction codes on the transmission frame in this invention generates transmission data of N symbols as well as stores data completely for coding.

Embodiment 2

Figure 3:
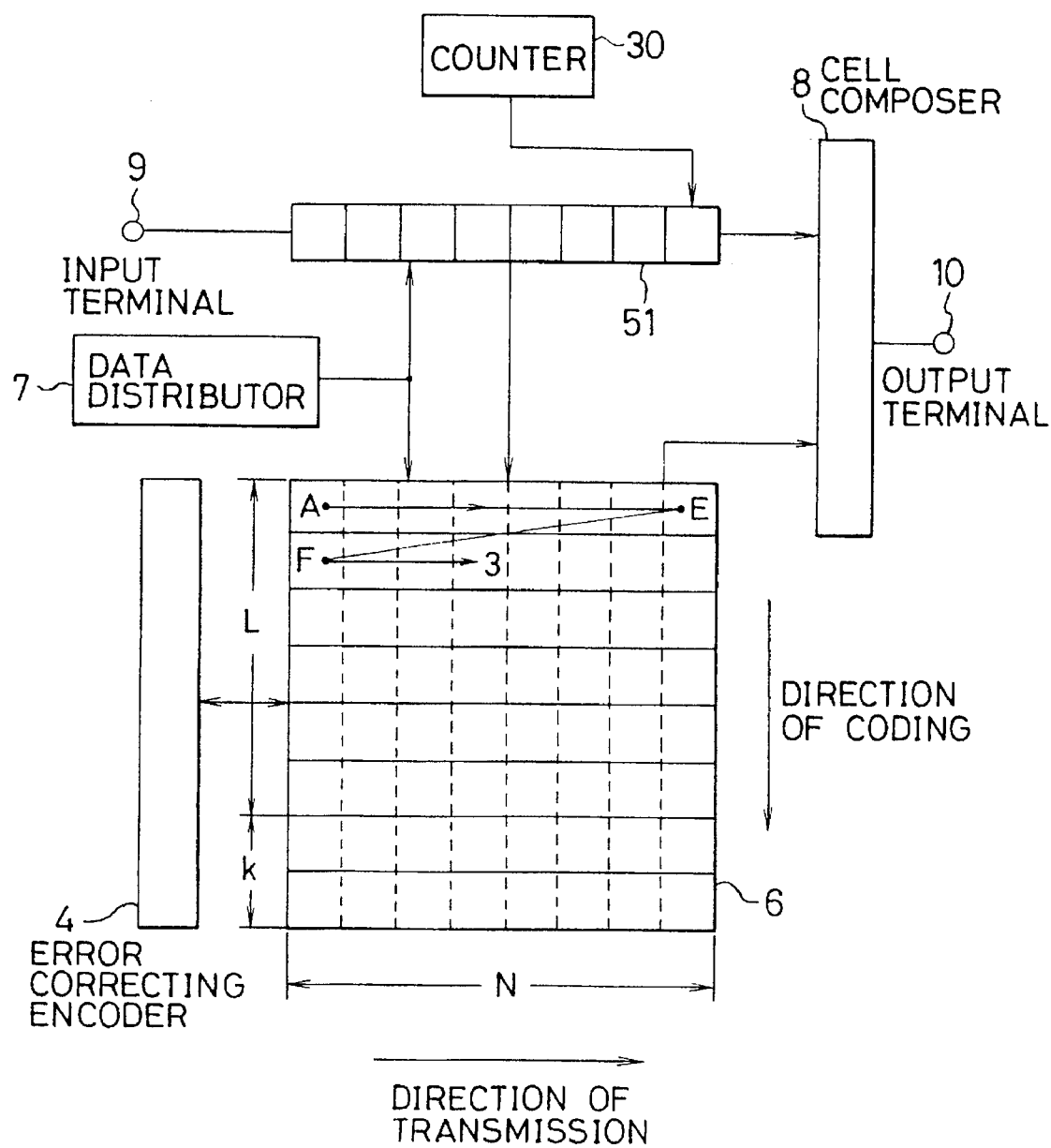
FIG. 3 shows a block diagram of the transmitter for coding error correction codes on the transmission frame according to a second embodiment of the present invention.

FIG. 3 shows a second embodiment of the transmitter for coding error correction codes on the transmission frame based on the present invention.

Numeral 30 shows a counter which generates identifiers so as to identify sequential headers of each transmission cell. The counter attaches the identifier of n bits to the top of each cell at the time of transmission.

The operation will now be described. Error correction codes are assumed here to be Reed Solomon error correction codes. The direction of transferring data to the buffer memory, the transmission direction, and the coding direction are the same as in Embodiment 1. Input data are partially shifted to the next frame by the identifiers of (L×n) bits. Consequently, in the present embodiment, though transmission efficiency is decreased, cell losses are detected more easily.

In the embodiment described in connection with FIG. 3, the shift register 51 attaches an identifier of n bits generated in the counter 30 (an attach means for attaching cell-identifiers) to each set of input data of (N−n) symbols received through the input terminal 9. Data of N symbols are transmitted as the transmission cell thorough the cell composer 8 as well as transferred to the buffer memory 6. The other processes are the same as in Embodiment 1.

Figure 4A:
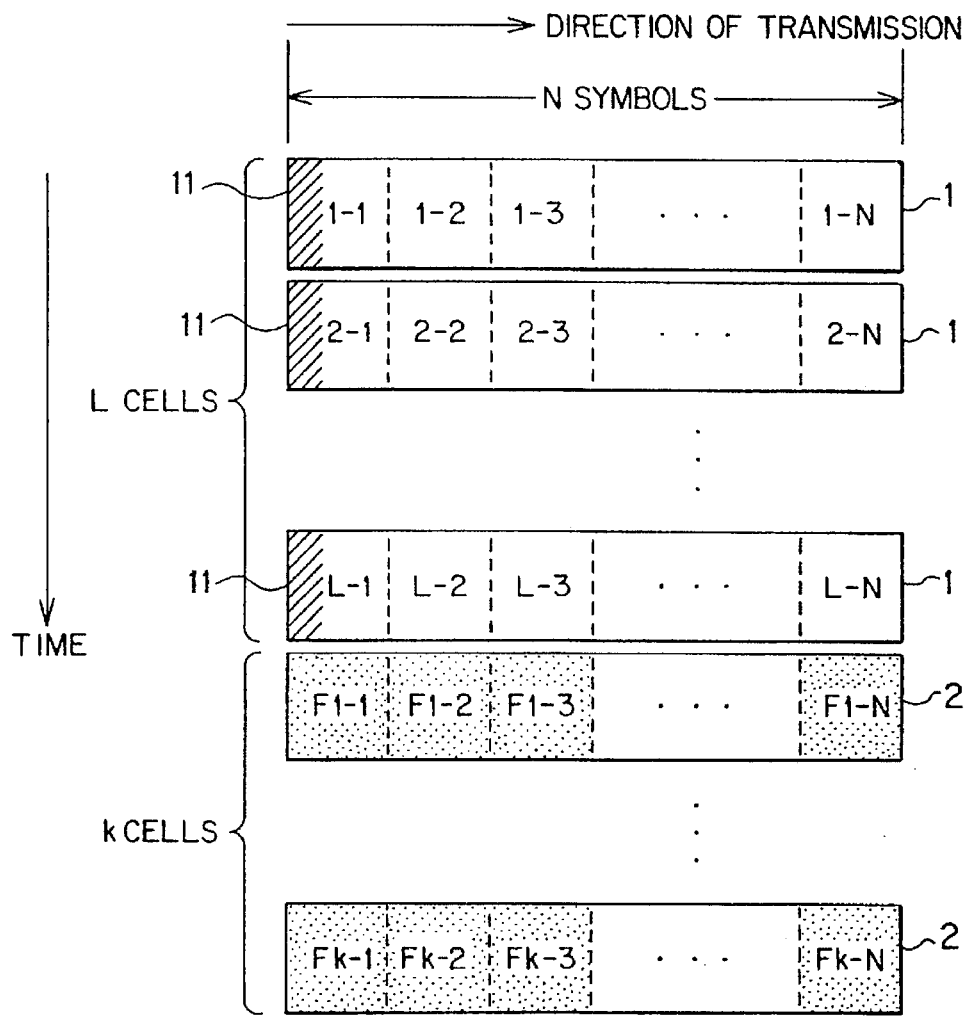
FIGS. 4(a) and (b) show a configuration of the transmission frame and identifiers according to said second embodiment of the present invention.

FIG. 4(a) illustrates an array of the block data in the buffer memory as well as a configuration of the transmission frame in this embodiment. In the figure, 11 shows an identifier of n symbols. Assuming that N symbols would be N bytes and n symbols would be 2 bits, transmission efficiency is decreased by only 2/8N, that is, 1/4N reduction. Because the counter 30 covers L data cells, it gives cell numbers from 0 to (L−1) corresponding to the L data cells.

Figure 4B:
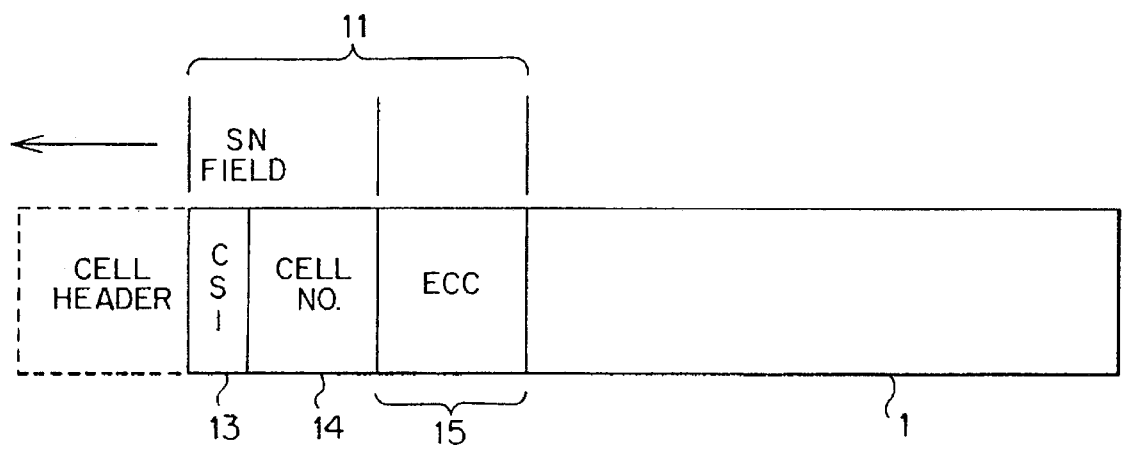

FIG. 4(b) illustrates another embodiment of the identifier. The identifier is composed of a cell number, an indicator for a block header 13, a sequence number 14, and an error correction code 15. The identifier can be put into the cell header, but the identification process can be simplified by putting it into the data area.

Embodiment 3

Figure 5:
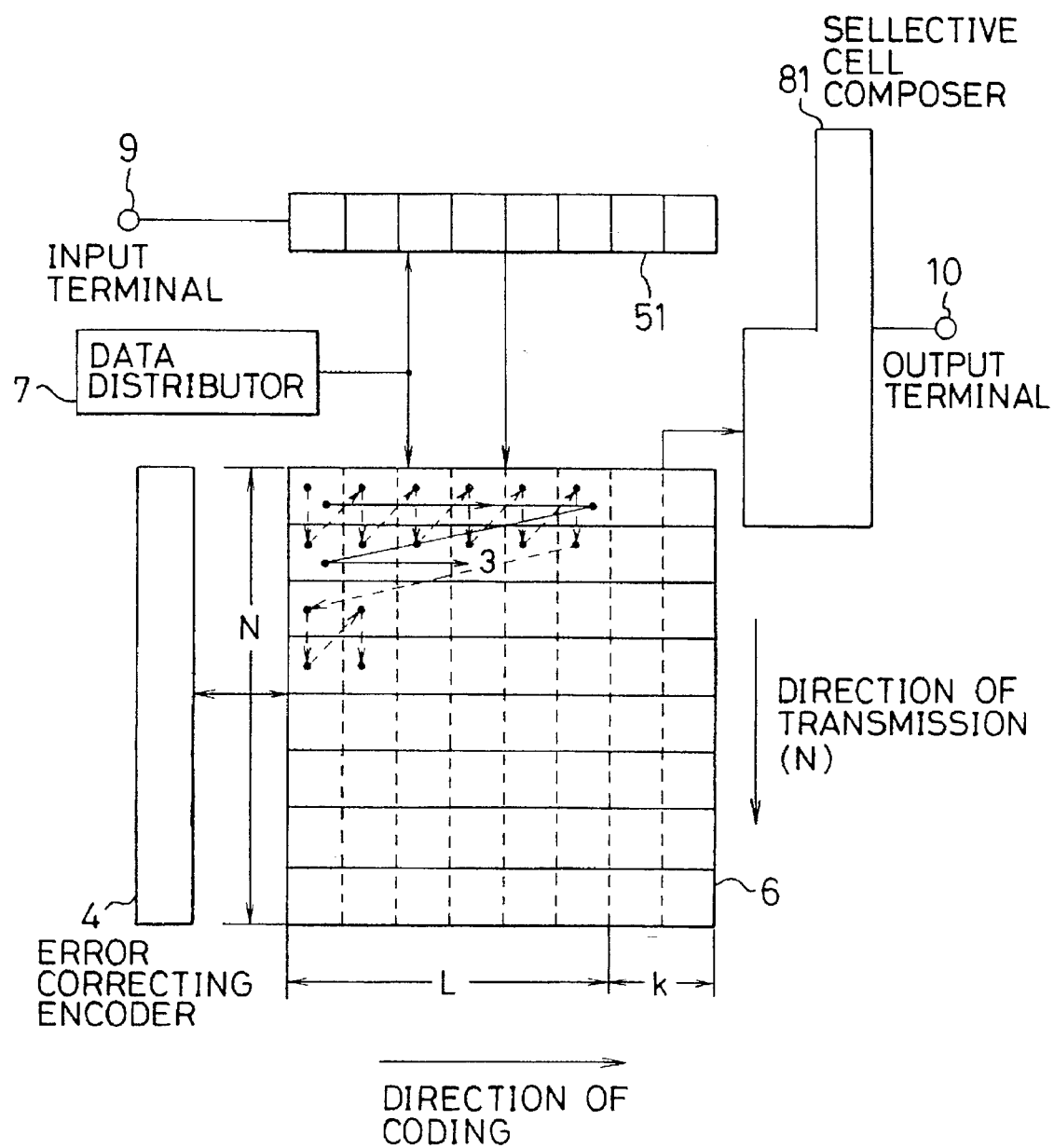
FIG. 5 shows a block diagram of the transmitter for coding error correction codes on the transmission frame according to a third embodiment of the present invention.

There is shown another embodiment of the transmitter for coding error correction codes on the transmission frame based on the present invention in connection with FIG. 5.

In the figure, numerals 1 to 10 and 51 are the same elements in FIG. 1. The input data is filled from the upper left of the transmission frame to the upper right and from the left of the next row to the right as described in Embodiment 1. A selective cell composer 81 operates as follows; The selective cell composer 81 scans input data in the buffer memory 6 to the vertical direction by N/p symbols in the first column. Then it scans from the top of the next column by N/p symbols. Thus, the scan by every N/p symbol is repeated to the horizontal direction until a cell of N symbols is generated, as shown in doted line in FIG. 5.

The operation will now be described, referring to FIG. 5. In this embodiment, as described in the related art, the horizontal direction shows the coding direction. Data transferred from the input terminal 9 are stored in the assigned position in the buffer memory 6, temporarily. But, when data of N/p blocks in the vertical direction, that is, the transmission direction, are provided p times, one transmission cell composed of p×(N/p) data symbols is transmitted.

The error correcting encoder 4 operates in the conventional ways. The advantage of the interleave methods is preserved because the coding is performed in the orthogonal direction of transmission.

Figure 6:
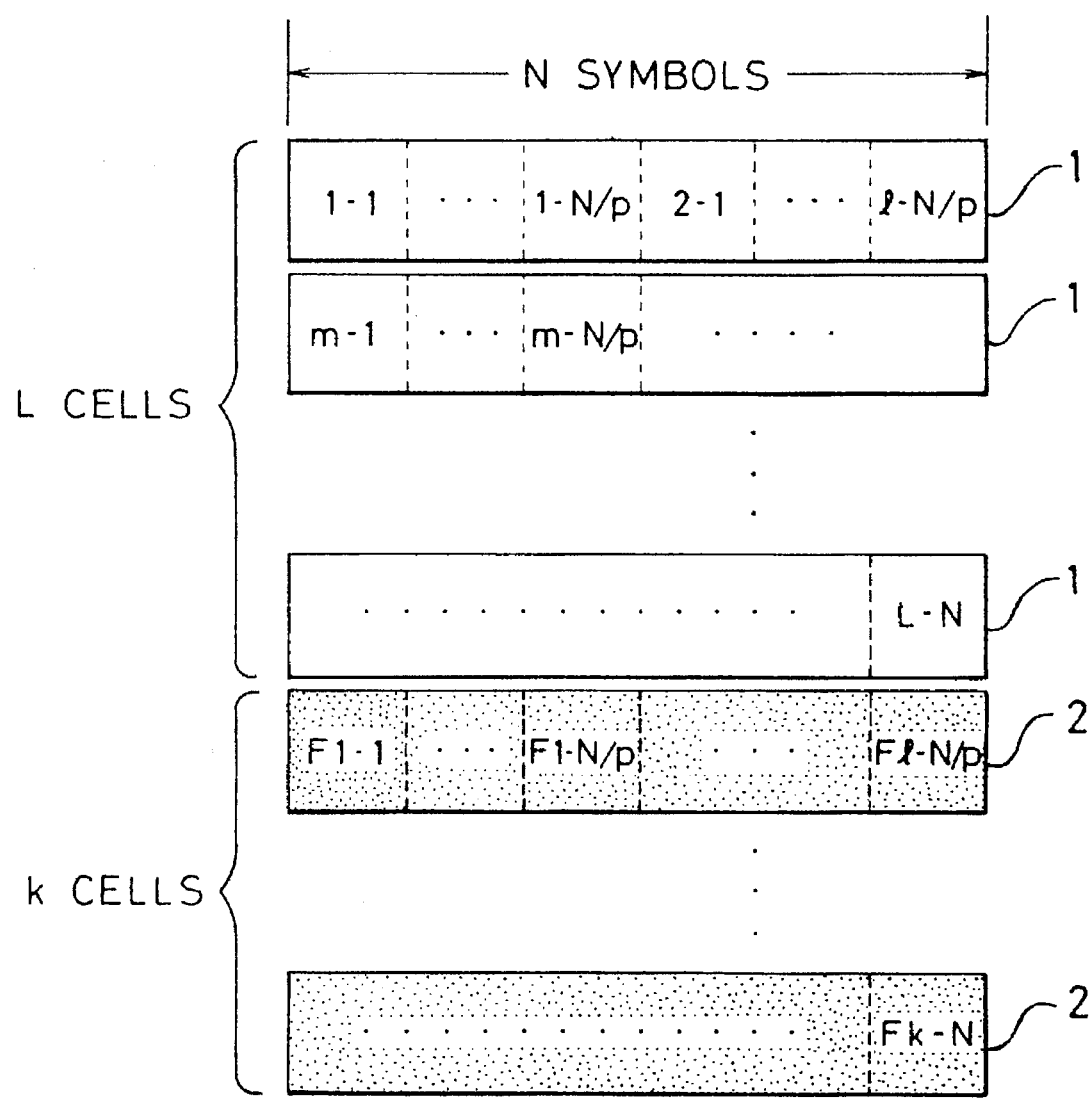
FIG. 6 shows an explanatory view of the transmission frame in which one cell is divided into p block data according to a fourth embodiment of the present invention.

In FIG. 6, there is shown the configuration of the transmission frame in this embodiment. Here, N/p is supposed to be divided by integers. One cell is composed of (N/p) data symbols in the vertical direction of buffer memory 6 in FIG. 5 being collected by p times in the coding direction. Thus, time required for starting transmission is reduced by 1/p times, comparing to the related art.

In this embodiment, after data being stored in the buffer memory, transmission cells are generated selectively through the selective cell composer at the time of transmission. On the other hand, after data corresponding to the transmission cell are distributed and stored, coding can be performed in the orthogonal direction of transmission in accordance with this distribution. That is, coding is performed in every N/p data symbols which are stored in the buffer memory. In other words, it is possible to store the data blocks first in a dotted line in FIG. 5 and read out the data in a solid line for transmission.

Embodiment 4

Figure 7:
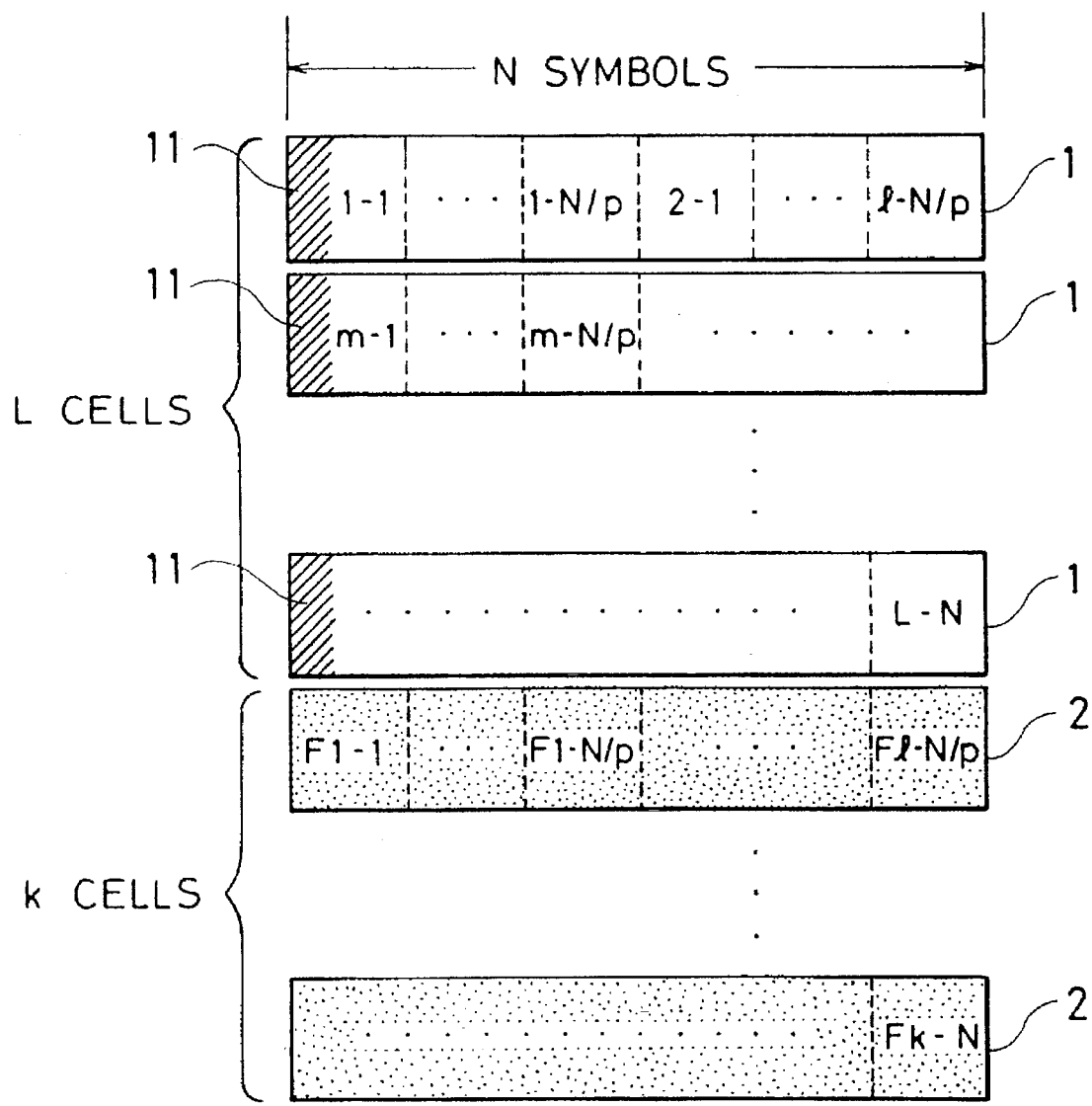
FIG. 7 shows another explanatory view of the transmission frame of said fourth embodiment of the present invention.

There is shown in FIGS. 6 and 7 another embodiment of the transmitter for coding error correction codes on the transmission frame. In this embodiment, an identification bit as discussed in Embodiment 2, which identifies a sequential header of the transmission cell, is attached to the top of the transmission cell of Embodiment 3. The configuration is similar to FIG. 5, except that the counter 30 is added. Data is transferred to the buffer memory 6 as described in Embodiment 1.

The operation will now be described. As described in Embodiment 3, data is stored in the buffer memory and a transmission cell is transmitted. That is, the selective cell composer 81 scans input data in the buffer memory 6, by N/p times in the vertical direction, and from the top of the next column it scans only by N/p times. Thus, the scan is repeated in the horizontal direction until a cell of N data symbols is generated, as shown in FIG. 6.

In FIG. 7 there is shown the configuration of the transmission frame of the present embodiment. The identification bit is attached to the top of the transmission frame in FIG. 6.

The transmitter for coding error correction codes on the transmission frame attaches identifiers on the top of each transmission cell. And it transmits the data of N symbols just as transmission number of symbols needed for transmission before complete coding.

Embodiment 5

Figure 8:
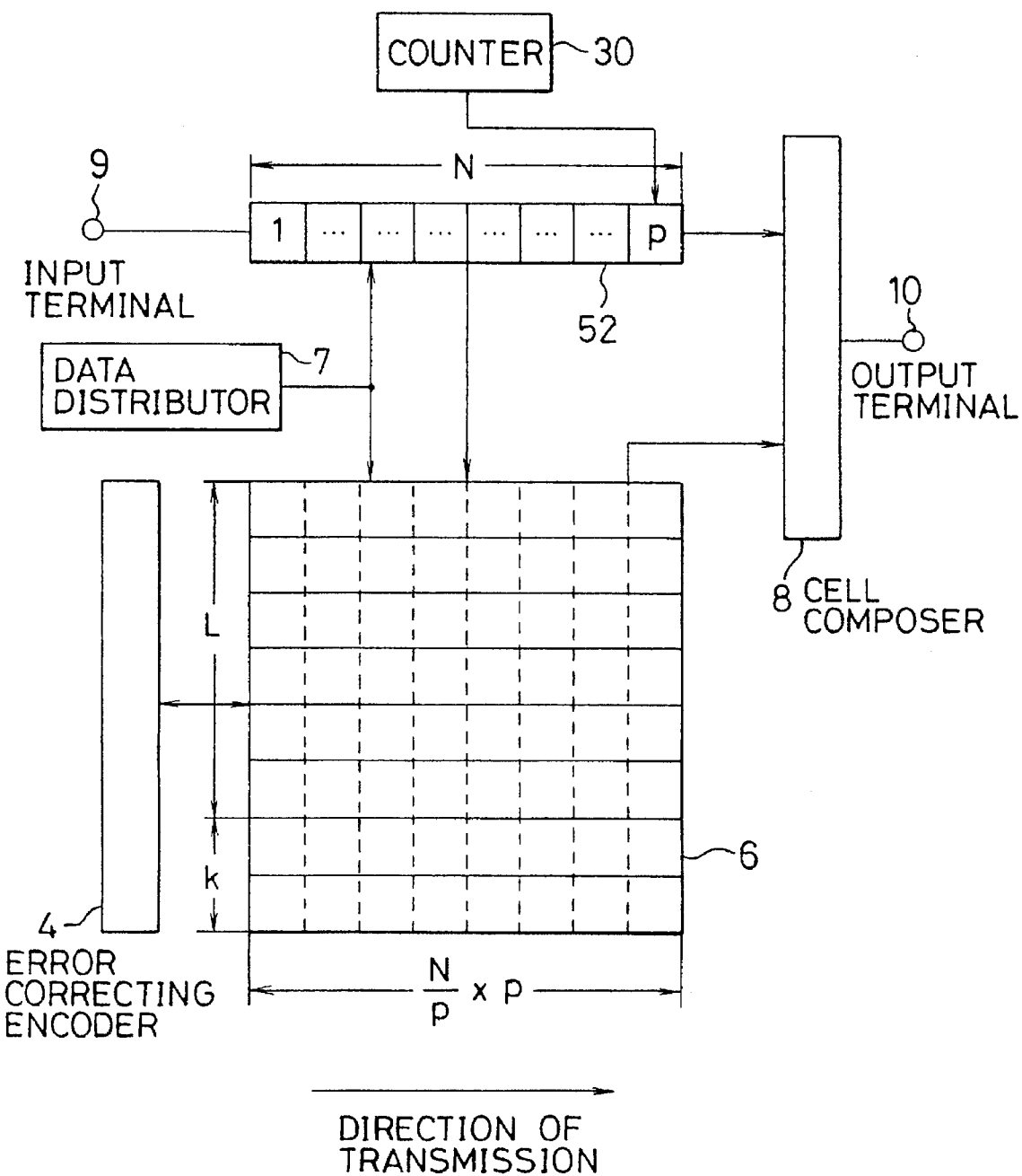
FIG. 8 shows a block diagram of the transmitter for coding error correction codes on the transmission frame according to a fifth embodiment of the present invention.

FIG. 8 Illustrates a fifth embodiment of the transmitter for coding error correction codes on the transmission frame based on the invention.

In FIG. 8, 52 shows a dividing circuit which divides data having symbol length N into p blocks equally. The other elements are the same as in FIG. 3. However, the counter 30 is not necessary in this embodiment.

The operation will now be described. Error correction codes are assumed here to be Reed Solomon error correction codes, and symbol length N divided into p blocks.

Figure 9:
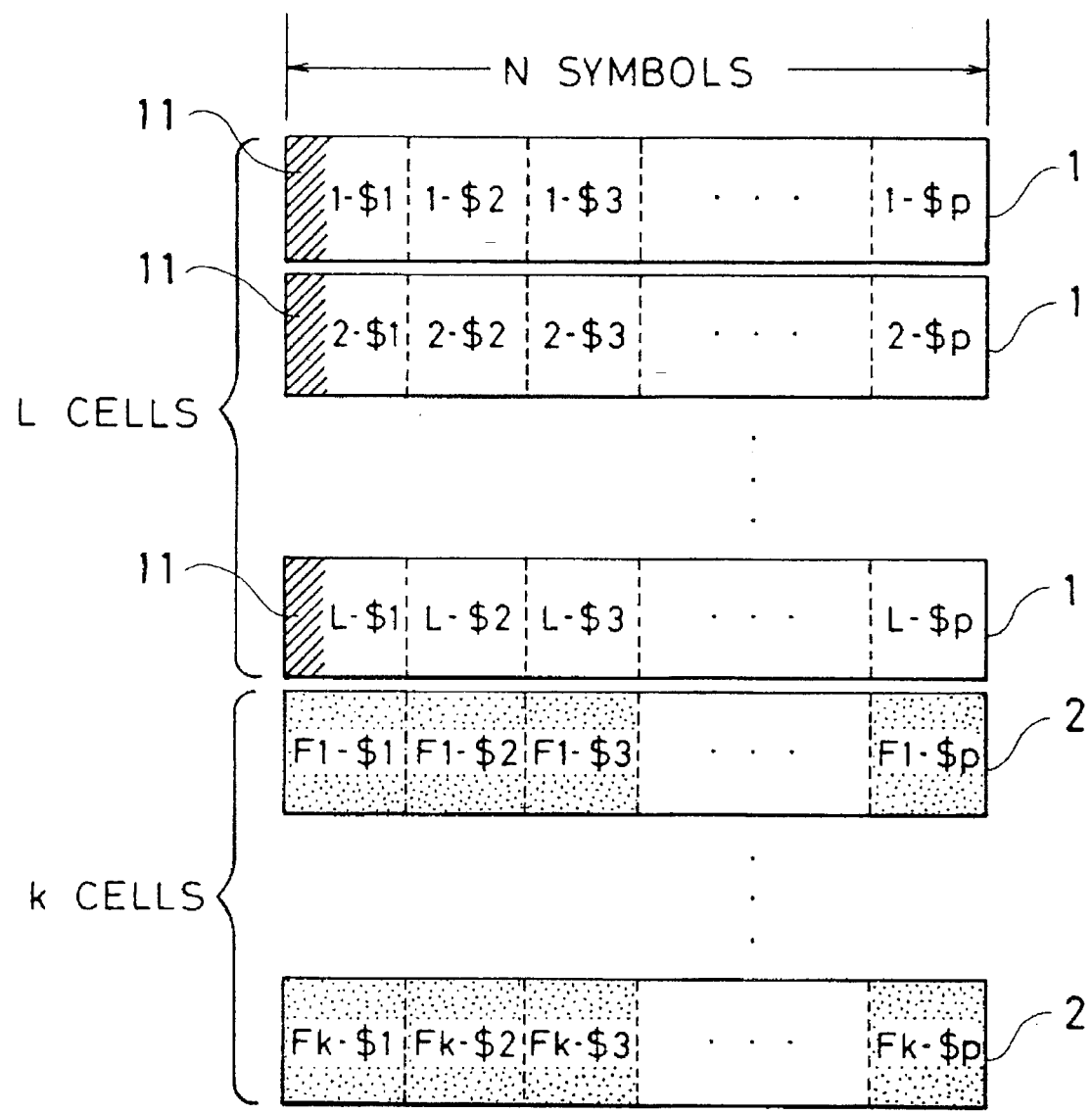
FIG. 9 shows an explanatory view of the transmission frame of said fifth embodiment of the present invention.

The transmission frame, shown in FIG. 9, is composed in units of (L+K) cells. In the figure, 11 shows the identifier, which is not necessary. This embodiment is characterized in that error correcting coding is performed in units of divided blocks after data of N symbols are divided into p blocks. That is, because the coding is performed in N/p symbols units, the scale of the error correcting encoder becomes smaller by N/p times.

In the transmission frame shown in FIG. 9, the error correcting encoder of k cells encodes in units of the divided blocks. And the scale of the error correcting encoder becomes smaller by N/p times, compared to other error correcting encoders in units of N data symbols.

Further, to divide data symbols equally is effective in minimizing the check symbol length needed for coding.

The transmitter for coding error correction codes on the transmission frame based on Embodiment 5 divides data of N symbols into p blocks. After being stored in the buffer memory for coding, the data is transmitted in units of p blocks equivalent to N symbols.

The transmitter for coding error correction codes on the transmission frame stores data in the buffer memory and attaches identifiers on the top of each of the transmission cells. After being stored in the buffer memory temporarily for coding, the data is divided into p blocks and transmitted in units of p blocks equivalent to N symbols.

Embodiment 6

Figure 10:
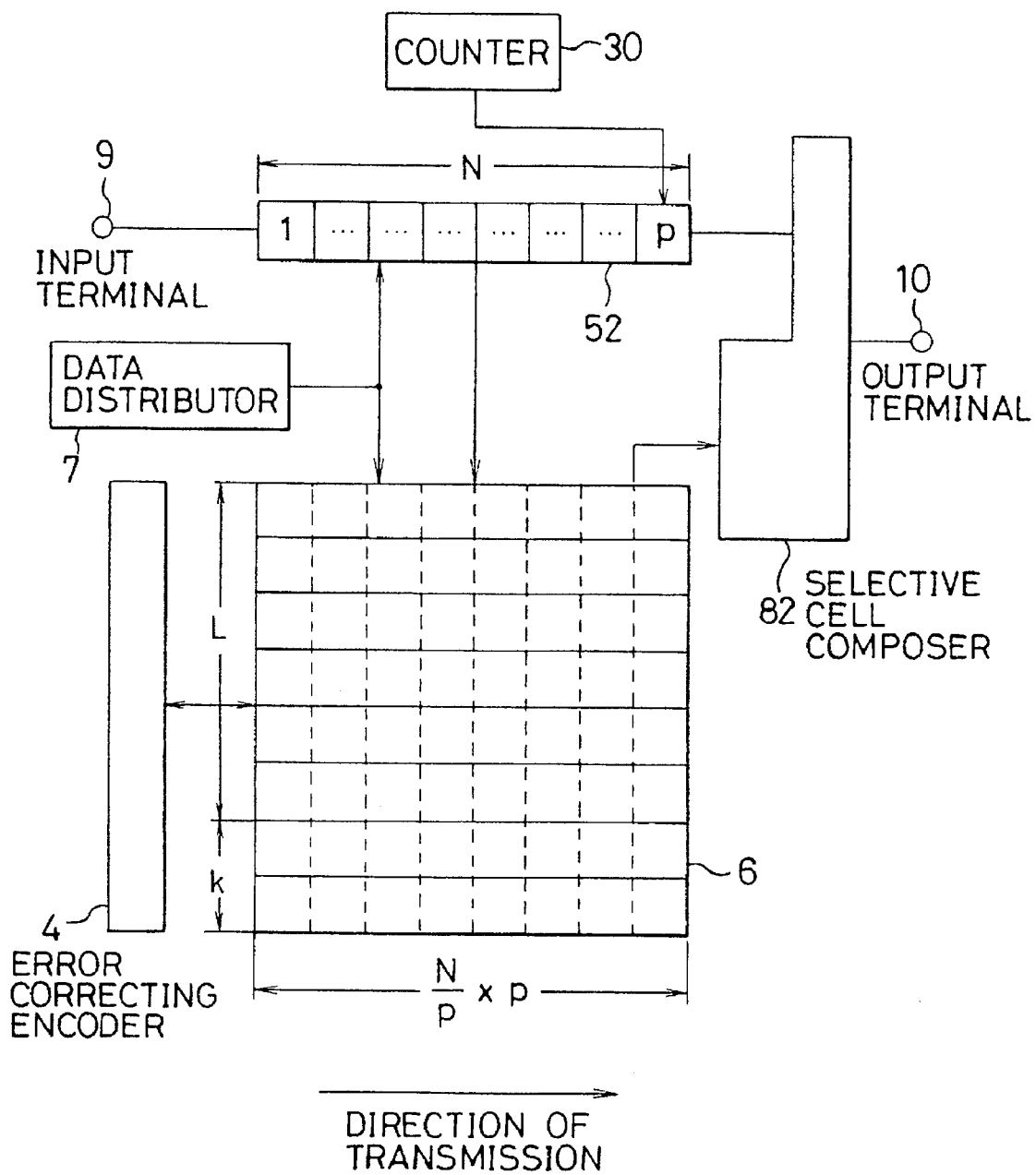
FIG. 10 shows a block diagram of the transmitter for coding error correction codes on the transmission frame according to a sixth embodiment of the present invention.

FIG. 10 illustrates a sixth embodiment of the transmitter for coding error correction codes on the transmission frame based on the invention.

In FIG. 10, 82 shows a selective cell composer which generates the transmission cell by replacing one data symbol or block with one error-correction symbol or block. Output data of the counter 30 are transferred into plural symbols or blocks of a cell in this embodiment. The other elements are the same as in FIG. 8.

The operation will be described hereinafter. N data symbols are transmitted in units of divided p blocks. Symbol length N is determined to be divided by the block number p.

Figure 11:
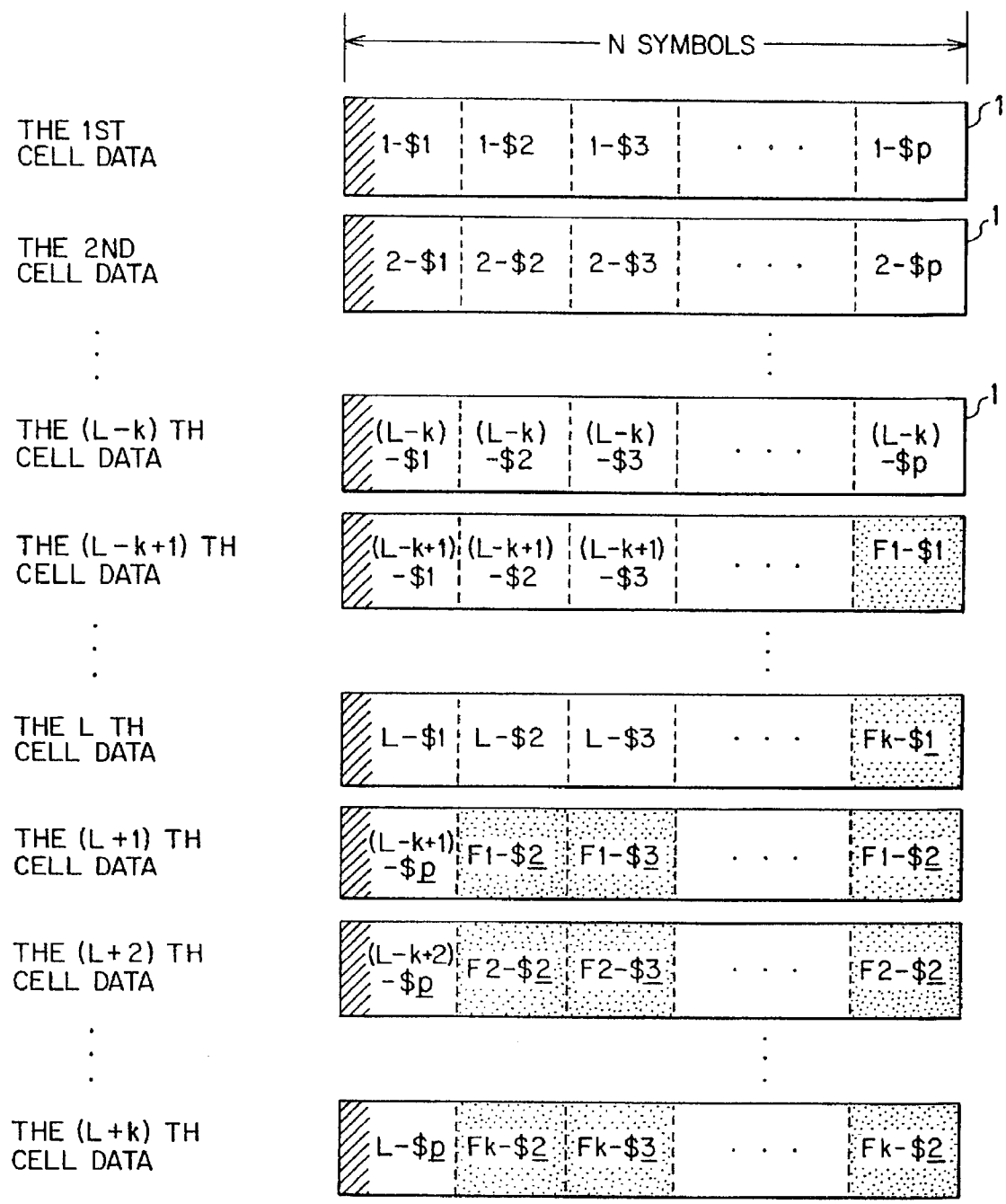
FIG. 11 shows an explanatory view of the transmission frame of said sixth embodiment of the present invention.

A temporary frame is composed in units of (L+K) cells as shown in FIG. 9. However, cells from the (L−k+1) th to the L th have identifiers in two different data blocks. The transmission frame shown in FIG. 11 is composed through the selective cell composer 82 by exchanging one block of check symbols with one block of data symbols which has an identifier. This embodiment is characterized in that identifier 11 is stored in an assigned position of each cell.

In the transmission frame in FIG. 11, data from the first cell to the (L−K) th cell are composed of (N−n) data symbols received from the input terminal 9 and an identifier of n symbols is attached by the dividing circuit 52. The total N data symbols of each cell from the first cell to the (L−k) th cell is divided into p data blocks equally and stored in assigned addresses in the buffer memory 6.

Further, each of the data cells after the (L−k+1) th cell is composed of (N−2n) symbols received from the input terminal 9 and two identifiers 11 of n symbols each are attached by the dividing circuit 52. Then, each of the cells of N data symbols is divided into p data blocks and stored in assigned addresses in the buffer memory 6.

Thereafter, one of data blocks having an attached identifier 11 in the (L−k+1) th cell to the L th cell is exchanged with the first block of the (L+1) th cell to the (L+k) th cell.

Thus, transmission cells after the replacement are shown in FIG. 11. Thereby, identifiers are incorporated into the check cells, the (L+1) th cell to the (L+k) th cell.

Figure 12:
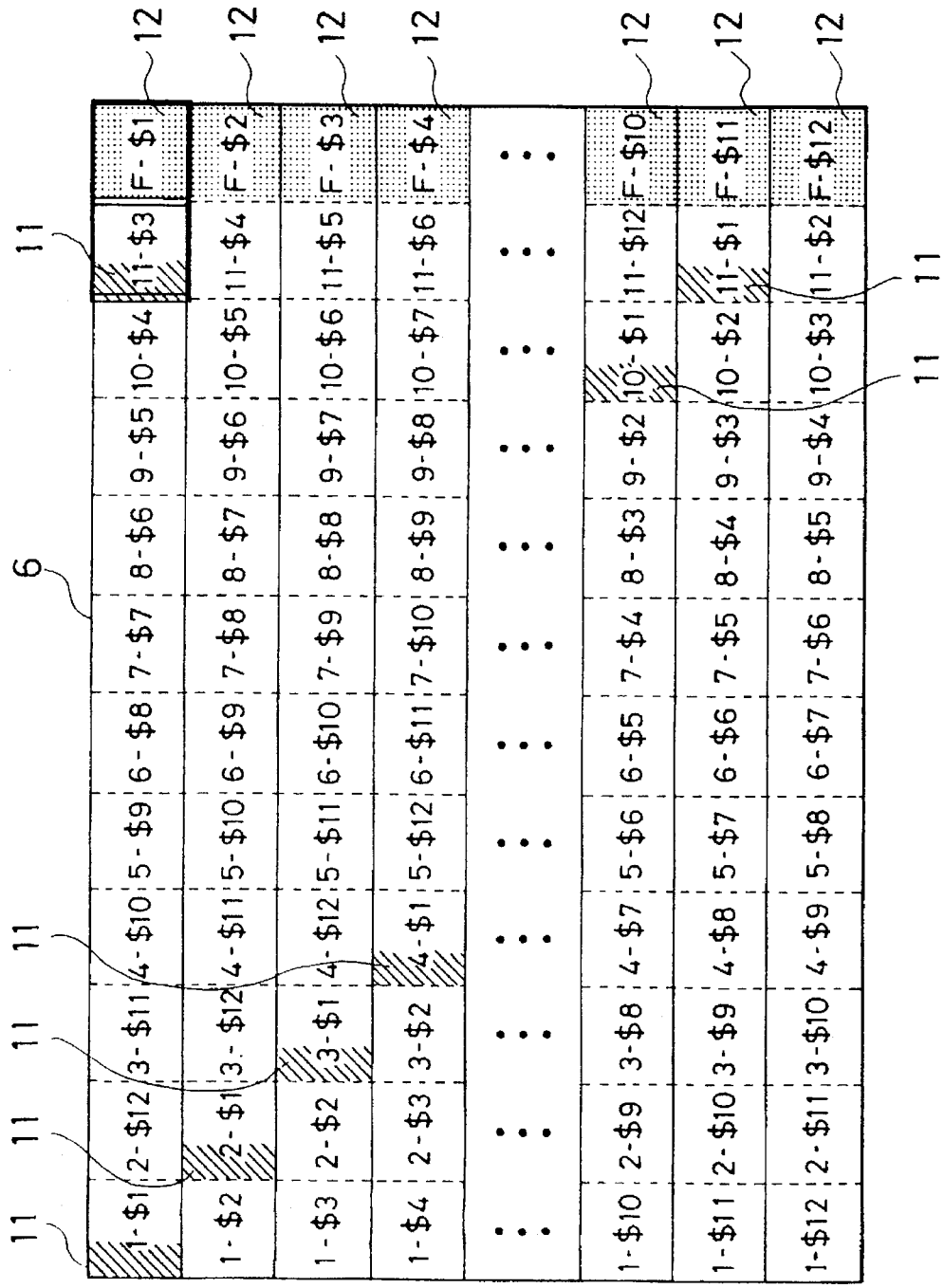
FIG. 12 shows an array of the block data stored in the second buffer memory according to said sixth embodiment of the present invention.

The operation will now be described by using numerical data in FIG. 12 and FIG. 13. FIG. 12 shows an example of the temporary frame of block data in the buffer memory 6 of this embodiment, in which N=48, p=12, L=11, and k=1. That is, there is shown the case in which p=L+k. Numeral 11 shows identifiers and 12 shows check symbols in the figure.

In an array of block data shown in FIG. 12, the frame for error-correction is composed of block data in the horizontal direction. For example, block data (1-$1, 2-$12, 3-$11, 4-$10, 5-$9, 6-$8, 7-$7, 8-$6, 9-$5, 10-$4, 11-$3, F-$1) composes one frame for error-correction.

Figure 13:
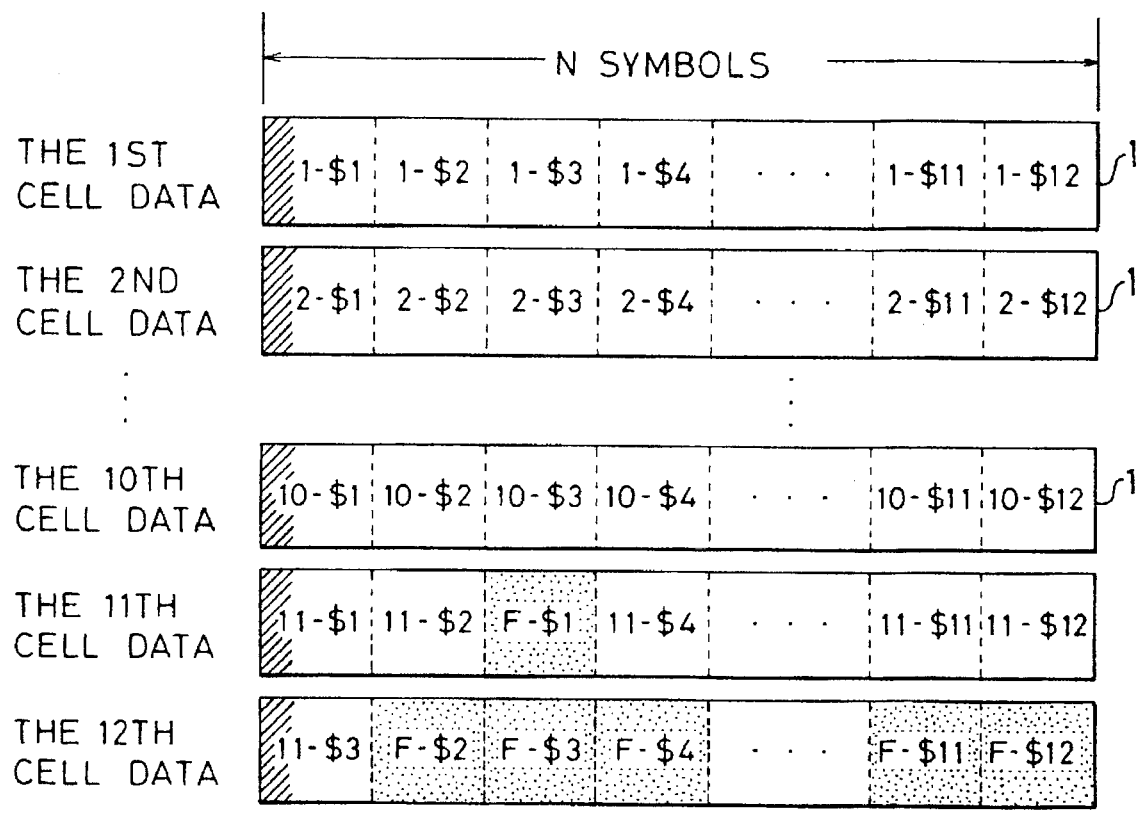
FIG. 13 shows a configuration of the frame for error-correction after changing the position of identifiers in FIG. 12.

In FIG. 13, there is shown a configuration of the transmission frame in this embodiment. The transmission frame is composed in units of 12 cells, in which L=11, k=1. In Embodiments through 1 or 4, the transmission frame is composed of L data cells 1 and k check cells 2. In this embodiment, cells are regenerated by exchanging block data between data cells 1 and check cells 2 so that the identifiers 11 might be stored at the assigned positions of each cell. In FIG. 13, the identifiers 11 are appended to two data blocks of the 11th cell (11-$1) and (11-$3). Then, data blocks (11-$3) and (F-$1) are exchanged between the 11th cell and the 12th check cell.

In this embodiment, data composing a transmission cell are divided into plural data blocks and arranged separately on the plural frames for error correction. In case that cell loss is detected, decoding process for the lost cell is performed by correcting lost block data in each frame for error correction related to the block data in the lost cell. Therefore, in order to correct cell loss, each frame for error correction should have a capability to correct errors of the block data in the related cell if any cell is lost.

For example, in order to correct loss of one block data of N/p symbols whose location is identified by using Reed Solomon Codes, data having more than N/p symbols are required for the check symbol length. And, in order to correct loss of two block data whose locations are identified by using Reed Solomon Codes, data having more than 2 N/p symbols are needed for the check symbol length when each of the block data length is N/p symbols. Further, in order to correct random errors whose location are not detected by using Reed Solomon Codes, data having more than 2 N/p symbols are required for the check symbol length for correcting errors of one block data of N/p symbols.

In case that all the data block length has 2 N/p symbols and Reed Solomon Codes in which check symbol length k=2 N/p symbols are used, it should be settled that plural block data in the related cell are not contained in each frame for error correction to correct errors of one lost cell whose location is already identified.

In an array of block data, shown in FIG. 12, as described before, a frame for error correction is composed of block data in the horizontal direction and a transmission cell is composed of block data in the vertical direction. However, because as to a check cell located on the right side in FIG. 12, the identifier 11 of the transmission cell isn't attached, cell loss detection by using the identifier 11 can't be performed. Therefore, according the present embodiment, as shown in FIGS. 12 and 13, the identifiers 11 are attached on the block data "11-$3" and "11-$1" and the block data "11-$3" is replaced by the block data "F-$1" Thus, because the identifiers 11 are attached to all the cells, cell loss detection can be performed for any cell by using the identifier 11. Further, because block data "11-$3" is replaced by the block data "F-$1" in the same frame for error correction, the replacement process doesn't cause to change the error correction ability.

In the present embodiment, one frame for error-correction doesn't have plural block data included in the same cell. That is, one cell doesn't have plural block data included in the same frame for error correction. It also means that each error correction frame has one data block from each data cell and error correction cell. Generally, in case of detecting one cell loss previously, at least one block data is required for the error correcting coding. If Reed Solomon error correction codes are employed to correct the loss of one block data, k check symbols not less than N/p symbols are required. Here, data can be recovered from the cell loss because one frame for error-correction has Just one block data included in each cell. As shown in FIG. 12, block data (11-$3) and (F-$1) are in one frame for error-correction. That is, one frame for error correction has just one block data of each cell. Therefore, each of the block data in check cells is replaced with one of the block data with identifiers in the transmission cell in each of the same frames for error correction. That is, the transmission cell including the data block which is replaced with the block data in the check cell has two identifiers. Thereby, error correction coding can be performed so as to correct either random errors or cell loss, and transmission efficiency is increased. In another embodiment, the N data symbols aren't divided into p blocks. One symbol of the N data symbols is replaced by one symbol of the check symbols. A detailed explanation is omitted, for the configuration and the operation can be easily understood by, referring to the description of Embodiment 1 in connection with FIGS. 11 to 13.

The transmitter for coding error correction codes on the transmission frame attaches identifiers on the top of each transmission cell and stores the data completely for coding. One of the check symbols is replaced with one of the data symbols including identifiers. Then, transmission is carried out in units of N data symbols.

Embodiment 7

A seventh embodiment has a configuration of the buffer memory as in FIG. 3; However, the buffer memory has a capability to store the R th and the (R+1)th transmission frame. The transmission order of cells is exchanged by replacing the readout order from the buffer memory 6.

Figure 14:
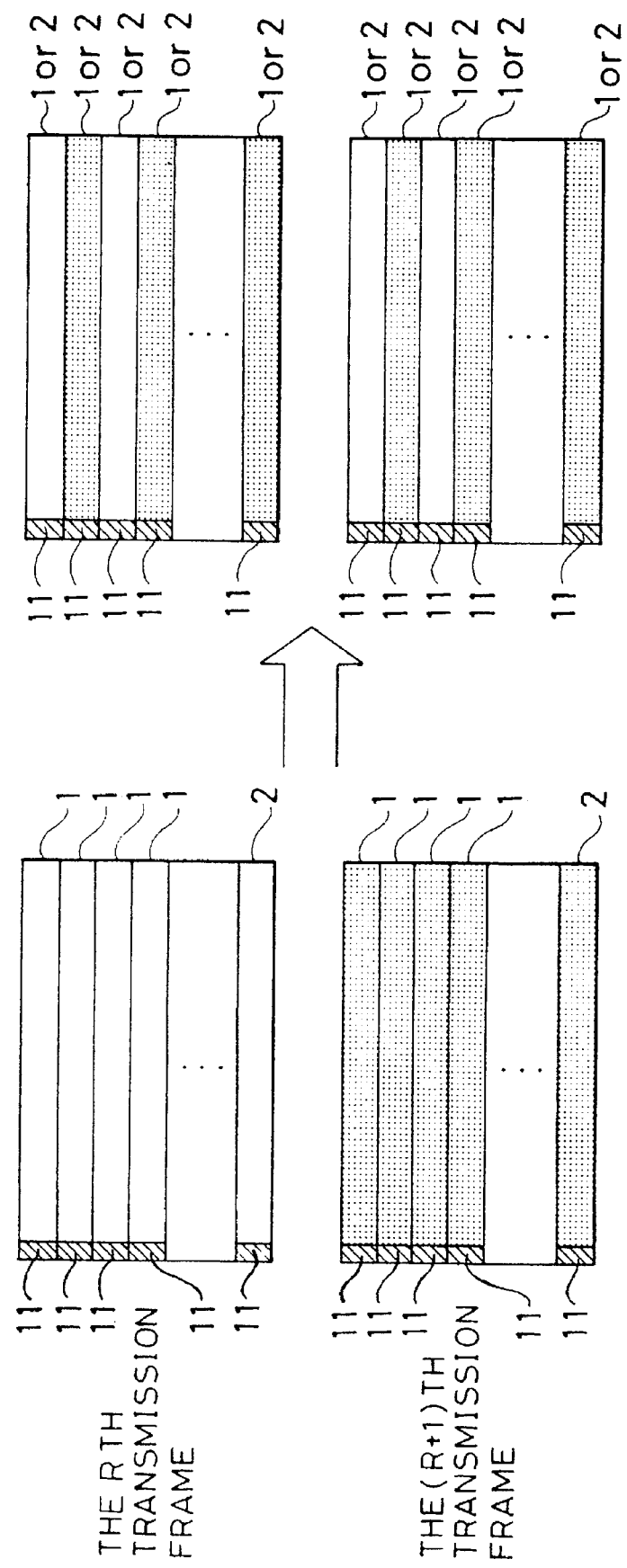
FIG. 14 shows the process of replacing transmission cells in R th and (R+1) th frame according to a seventh embodiment in the present invention.

FIG. 14 illustrates the way of exchanging the transmission order of cells in this embodiment. A new transmission frame is composed of cells of the R th and the (R+1) th transmission frames set one after the other. And the identifier 11 distinguishes specific cells from the two transmission frames.

In the previously described embodiments, error correcting coding is performed after N data symbols composing one cell are divided into assigned number and distributed to the frames for error correction.

But, hereupon, a frame length for error correction need not have the length of N symbols. That is, error correcting coding can be performed for N' divided data symbols composing plural cells. For example, in Embodiment 6, assuming that data of one cell would be 48 symbols (bytes), Reed Solomon error correction codes are thought as follows; RS (48,44), which has a frame for error correction of 48 symbols and 4 check symbols. Here, with transmitting in the unit of 48 symbols by dividing 96 data symbols of 2 cells, error correcting coding can be performed for the 96 data symbols of 2 cells by using Reed Solomon error correction codes, RS (96,88), which has a frame for error correction of 96 symbols and 8 check symbols. Of course, it is possible to perform error correction coding for the frame for error correction composed of further plural cells. In other case, assuming that a frame length for error-correction would be half of 48 symbols composing one cell, RS (24,22) can be employed as error correction codes. Of course, it is possible to perform error correction coding for further short length of the frame for error correction.

In some preceding embodiments, N data symbols composing one cell are divided into p frames for error-correction. But, the number of divisions is not necessarily equal to that of frames for error-correction.

In Embodiment 7 in connection with FIG. 14, transmission cells are exchanged between two transmission frames but can be exchanged in units of further plural transmission frames.

The transmitter for coding error correction codes on the transmission frame of Embodiment 7 transmits alternately the transmission cell of the present transmission frame and the corresponding cell of the next transmission frame.

Embodiment 8

Figure 15:
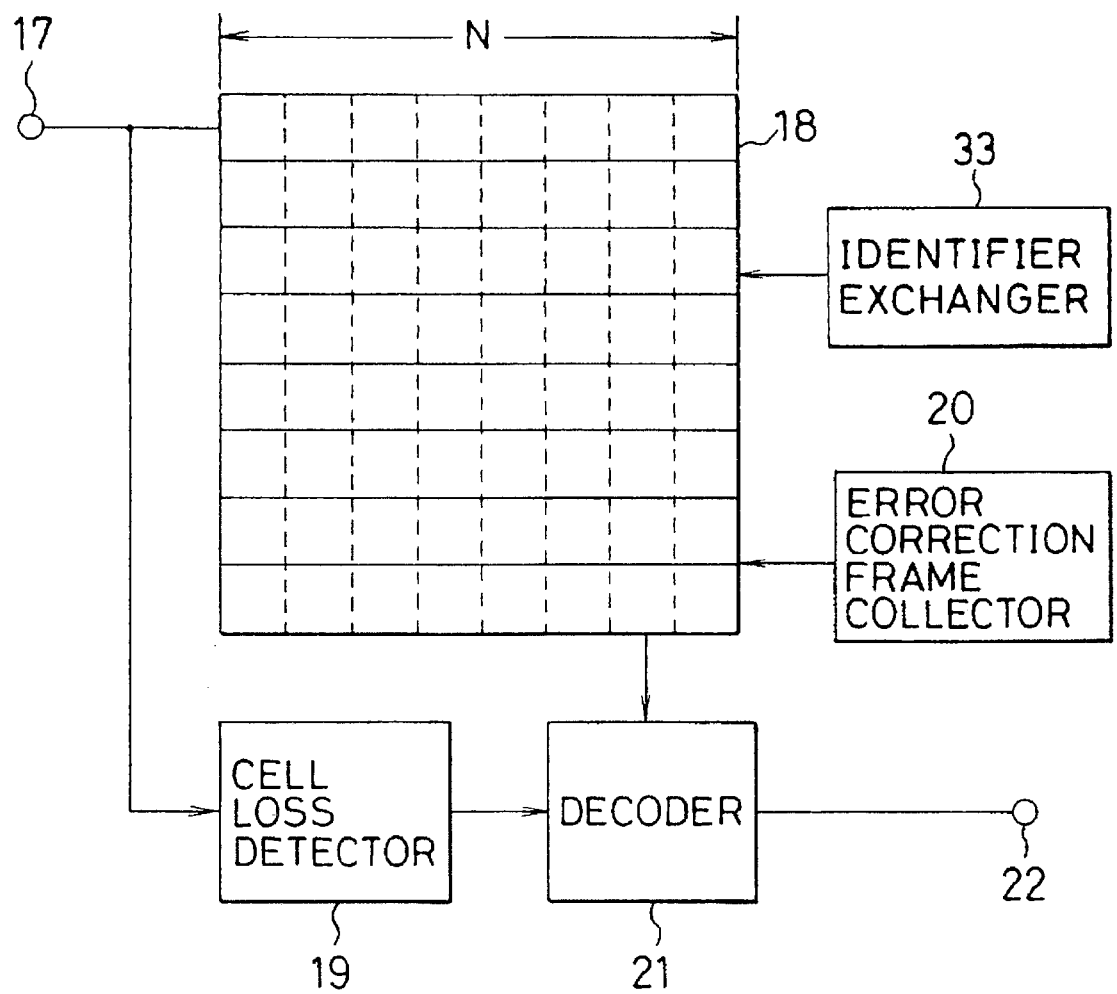
FIG. 15 shows a block diagram of the receiver for decoding error correction codes on the transmission frame according to an eighth embodiment of the present invention.

There is shown a configuration and operation of the receiver for decoding error correction codes on the transmission frame based on this invention, referring to FIG. 15.

FIG. 15 illustrates a block diagram of the receiver for decoding error correction codes on the transmission frame of N symbols.

In FIG. 15, numeral 17 denotes a data input terminal; 18 is a buffer memory in which N×L data symbols can be stored; 19 is a cell loss detector for detecting cell loss; 20 is an error correction frame collector which collects each symbol in one frame for error correction in units of each error correction frame from the buffer memory 18. In the error correction frame collector, L data symbols and k check symbols are collected together to the decoder. Numeral 21 is a decoder in which error correcting coding is performed for cell loss or some errors by using cell loss information from the cell loss detector and information collected from the collector 20 via the buffer memory; 22 is an output terminal from which corrected data is transmitted; and 33 is an identifier exchanger.

The operation will now be described. Error correction codes are assumed here to be Reed Solomon error correction codes. The configuration of the transmission frame in units of N×L symbols is as shown in FIG. 4.

In FIG. 15, when the transmission frame consists of N×L symbols, L cells of N symbols are received through the input terminal 17 and stored in the buffer memory 18. Further, N×k symbols are received and stored. For each cell, the cell loss detector 19 monitors the identifier 11 shown in FIG. 4. If the assigned identifier 11 could not be received, the location of the missing cell No. is identified and restored. Further, an identifier exchanger replaces the identifier of the check cell and the data cell in response to the transmitter site.

When N×L data symbols of one transmission frame are received, the error correction frame collector 20 collects (L+k)×N/p data symbols in the unit of a frame for error correction from the buffer memory 18 and transferred to the decoder 21. Here, one block data of N/p symbols is generated by dividing N data symbols into p. The decoder 21 operates as follows. If the cell loss detector 19 doesn't detect any cell loss, the decoding procedure is performed in the conventional ways. On the other hand, if cell loss is detected, the location of the missing data symbol in a frame for error correction is guessed from the other data symbols in the same frame for error correction and error correction coding is performed for the missing data for recovering cell loss. In this case, check symbols of each Reed Solomon error correction codes shown in FIG. 4 can correct errors for data blocks of k×N/p symbols if the check symbols have the length of k×N/p symbols. That is, in case the location of the missing block symbol in a frame for error correction is notified, error correction for the missing data is performed as described above. Then, decoded data is transmitted from the output terminal 22.

The receiver for decoding error correction codes on the transmission frame based on Embodiment 8 receives data cells and replaces one of data symbols by one of the check symbols in accordance with the rules at the transmitter site. Then if it detects cell loss it recovers the lost cells. After the error correcting procedure, the decoded N×L data symbols can be obtained.

Embodiment 9

Figure 16:
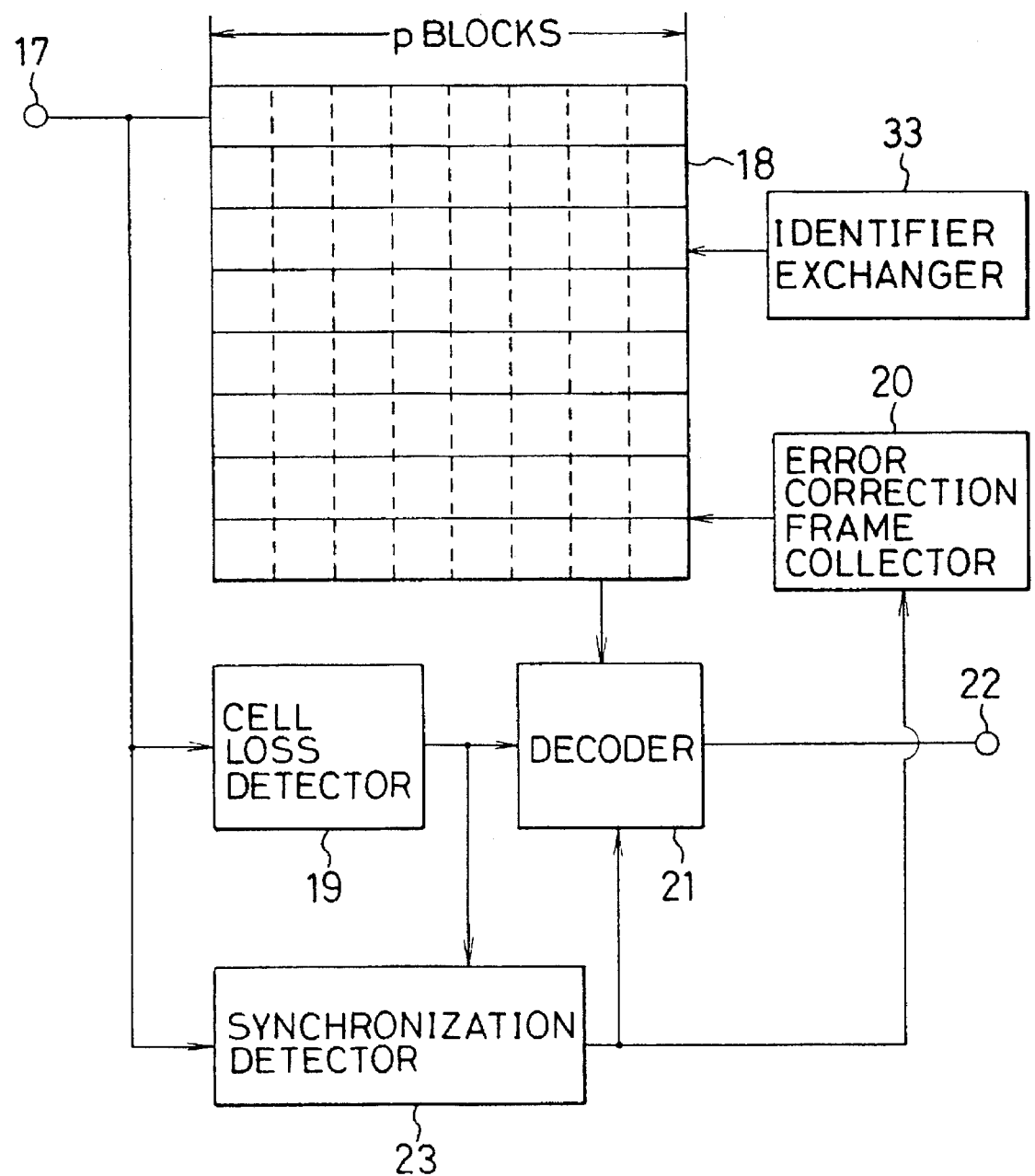
FIG. 16 shows a block diagram of the receiver for decoding error correction codes on the transmission frame according to a ninth embodiment of the present invention.

In FIG. 16, a synchronization detector to synchronize the transmission frame is provided with the error correcting receiver on the transmission frame described in Embodiment 8.

Figure 17:
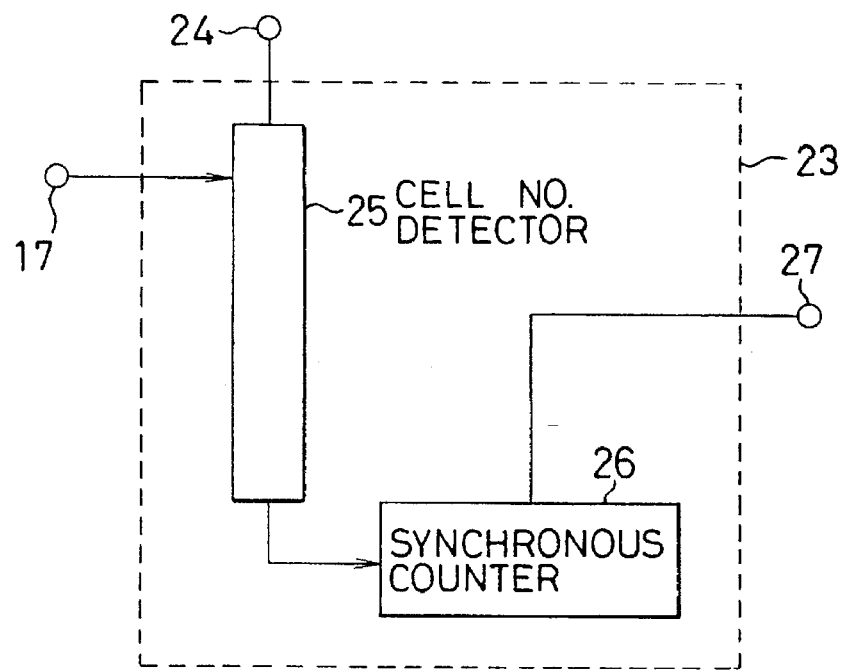
FIG. 17 shows an example of the synchronization detector of said ninth embodiment of the present invention.

In FIG. 17 there is shown an embodiment of the synchronization detector.

In FIG. 16, numeral 17-22 are the same elements in FIG. 15. 23 is a synchronization detector. In FIG. 17, 24 is an input terminal through which cell loss information is transferred from the cell loss detector 19; 25 is a cell No. detector for detecting cell-identifier 11 shown in FIG. 4. A synchronous counter 26 controls synchronization. Synchronization information is transmitted from an output terminal 27.

The operation will now be described. In this embodiment, N data symbols divided into p blocks are received to the receiver. As for replacing identifiers, the processing is the same in Embodiment 8. The processing is performed in blocks of N/p symbols. That is, the receiver corresponds to the transmitter in FIGS. 6, 7 and 9. Therefore, data are received in units of p blocks in the direction of transmission and a frame for error correction is composed in units of (L+k) data blocks. Further, decoding is performed in units of blocks of N/p symbols. On the other hand, when a transmission frame of N×L symbols is transmitted for coding, a transmission frame of N×L symbols should be surely received at the receiver site. Therefore, synchronization is needed in frame units. Then, the synchronization detector 23 shown in FIG. 16 is provided in the above embodiment, referring to FIG. 15. The synchronization detector 23 monitors cell data from the input terminal 17 and performs the synchronization. After that, the synchronization detector 23 transfers the synchronous information into the collector 20 and the decoder 21 for controlling the operation.

First, the operation of the synchronization detector 23 will be described. In this case, cell 1 has the identifier 11 on the top shown in FIG. 4. When the synchronous detector 23 recognizes the first cell of the transmission frame of N×L symbols to be transferred, the synchronization detector 23 refreshes itself by resetting the synchronous counter 26 according to the cell header. Here, the refreshed output information is recognized to be the synchronous information and transferred from the output terminal 27.

If cell loss information can be got, the corresponding cell is skipped, and data is stored without it in the buffer memory.

Later, the lost cell is filled with error correction codes and stored in the buffer memory. In the present embodiment, one transmission cell consists of p data blocks and data lost by random or burst errors are recovered in the unit of data blocks.

The receiver for decoding error correction codes on the transmission frame, receives N data symbols divided into p blocks and replaces one of the data blocks by one of the check blocks in accordance with the rules at the transmitter site. And if it detects cell loss it recovers the lost cell. After the error correcting procedure, the decoded N×L data symbols can be obtained.

Embodiment 10

Figure 18:
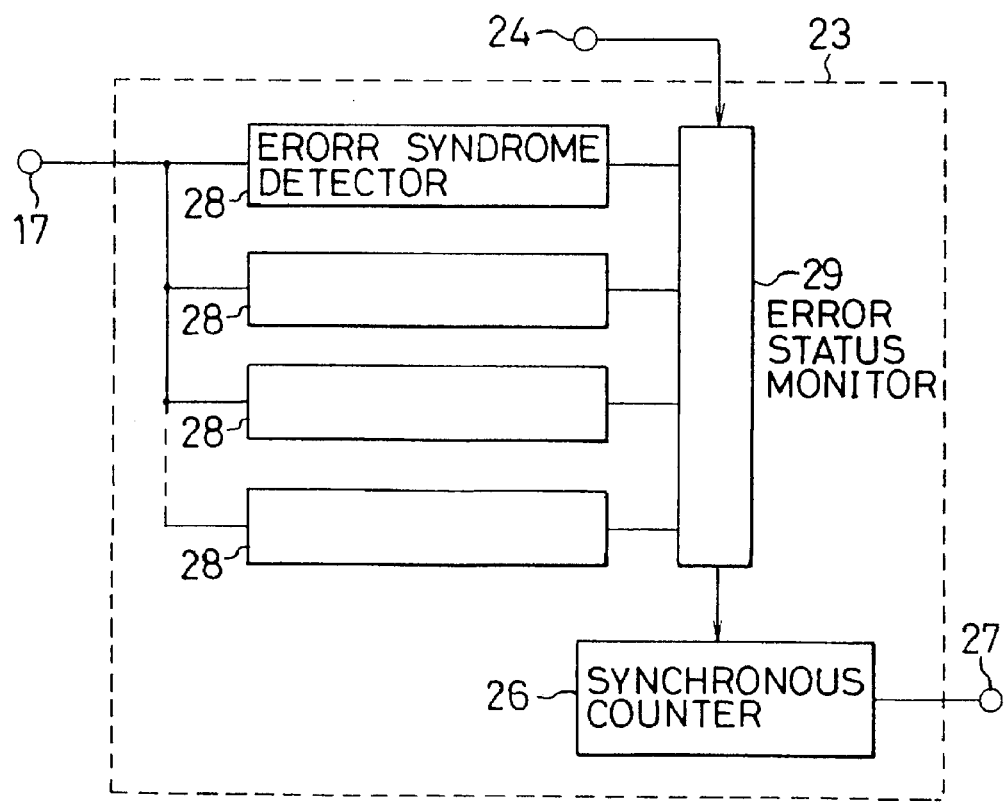
FIG. 18 shows another example of the synchronization detector according to a tenth embodiment of the present invention.

The synchronization detector 23 of Embodiment 10, shown in FIG. 18 works as follows. It is useful especially in cases when the cell 10 has no identifiers 11 as shown in FIG. 2. P error syndrome detectors 28 are provided for detecting errors of each L data cell in the orthogonal direction in one transmission frame having N×L symbols. The way of calculating syndrome is effective for Reed Solomon error correction codes. The error syndrome detector 28 detects error states from each block of data of N/p symbols in each of the L transmission cells. Thus, in detecting errors in the L data blocks corresponding to the transmission frame, the data before the (L+1) th cell, that is, data in the past transmission frame don't have influence over the detection. Cell loss information transferred from the input terminal 24 and errors detected by any of the error syndrome detectors 28 are monitored through the error status monitor 29 shown in FIG. 18. For, as stated above, L data blocks are coded in the corresponding transmission frame and aren't influenced by the data block in the past transmission frame. Therefore, when errorless block data is detected corresponding to p×N/p symbols, the first cell of the transmission frame having N×L symbols is recognized to be received. Then, the synchronization detector 23 refreshes itself by resetting the synchronous counter 26 according to the information of the first cell. Here, the output data after being refreshed is recognized to be the synchronous information and transferred from the output terminal 27.

In the above-stated embodiments, Reed Solomon error correction codes have been used as an example but other error correction codes can be used. For example, BCH codes can be employed, which have the check symbol length K more than the length of each of the block data of p×N/p symbols. In this case if burst errors are caused by the cell loss, error correction procedure can be performed for the cell loss, and if there are no cell losses, random errors can be corrected.

In the above embodiments, information of one transmission frame of N×L symbols is settled to have block data having one symbol or N/p symbol length. Further, N is determined to be divided into p blocks. However, these conditions are not necessarily needed. The needed ones are as follows; First, a frame for error correction is composed in the direction of L cells. And, check symbols which can recover the block data in L cells by the error correction coding are provided. Further, N data symbols need not be divided equally.

In the above embodiments, error correcting coding using data blocks of p×N/p symbols is performed for the identifier shown in FIG. 4 in each of the L cells as an object of coding. But, error correcting coding can be performed in the transmission cell which doesn't include the identifier.

The transmitter for coding error correction codes on the transmission frame based on Embodiment 10, provides a frame synchronization position by the error-syndrome decoder, instead of distinguishing a specific cell as in Embodiment 9.

Embodiment 11

Figure 19:
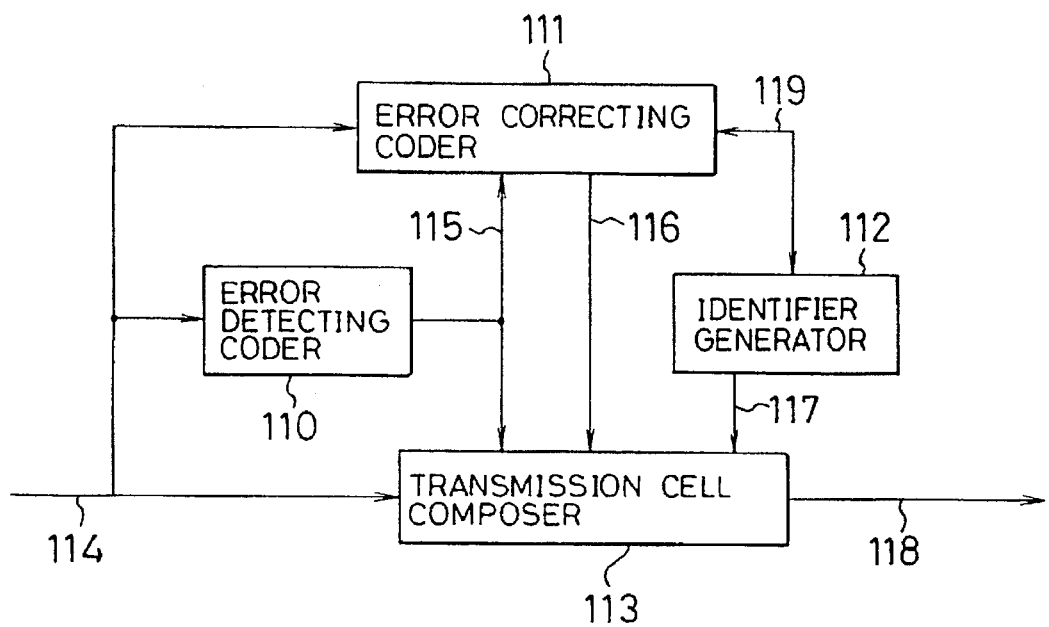
FIG. 19 shows a block diagram of the transmitter for coding error correction codes on the transmission frame according to an eleventh embodiment of the present invention.
Figure 20:
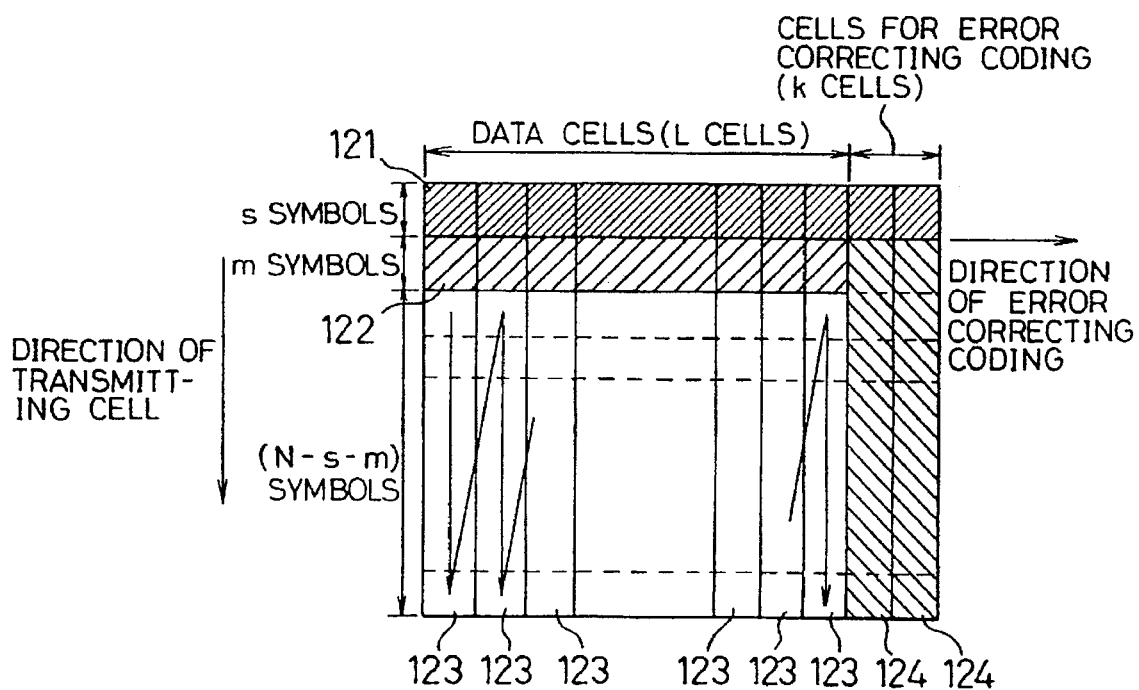
FIG. 20 shows a configuration of the transmission frame according to said eleventh embodiment of the present invention.

There is shown another embodiment of this invention, referring to FIG. 19 and FIG. 20. In FIG. 19, there is shown an embodiment of the transmitter for coding error correction codes on the transmission frame. FIG. 20 shows a configuration of the transmission frame.

In FIG. 19, numeral 110 denotes an error detecting coder which generates error detecting codes 115 in the transmission data 114; 111 is an error correcting encoder which generates error correcting codes 116 by using interleave methods in the transmission data 114; 112 is an identifier generator which generates identifier 117 which can recognize the transmission order (the location of transmission) of transmission cell 118 at the receiver site; and 113 is a transmission cell composer which composes the transmission cell 118.

In the present embodiment, error detecting codes generated to the orthogonal direction of error correction coding are appended. As a result, the reliability of the transmission data is increased.

Generally, the way of generating error correcting codes in two-dimensional space is well known. But in this embodiment, the apparatus can be small in scale by using error detecting codes which cannot correct but only detect errors. And it has also an advantage of setting the starting time of transmission earlier.

In FIG. 20, numeral 123 shows a data cell (frame) of N symbols which includes an identifier field 121 having identifier 117 of s symbols and a field 122 for the error detecting codes 115 of m symbols, in addition to the transmission data 114 of (N–s–m) symbols. 124 is a cell for error correcting codes 116 which includes the field of identifier 121. Here, L data cells 123 and k cells for error correcting coding 124, namely (L+k) cells, are determined to be the transmission frame.

The operation will now be described. In FIG. 19, the coded transmission data 114 used in the video or audio are transferred to the error detecting coder 110. The transmission data 114 are divided into (N–s–m) symbols and error detecting codes 115 of m symbols (numeral 122 in FIG. 20) are generated. As error detecting codes, cyclic redundancy check codes (CRC) and parity check codes can be employed. The way of generating these codes is well known.

The error detecting codes 115 are transferred to the composer of the transmission cell composer 113. The transmission cell composer creates a data cell 123 of N symbols, composed of the transmission data 114, the error detecting codes 115, and the identifier 117 (121 in FIG. 20) of s symbols transferred from the identifier generator 112. The data cell 123 is transmitted as a transmission cell 118. The identifier 117 indicates the transmission order (the location of the transmission cell) in the transmission frame of (L+k) cells. In the identifier 117, sequence numbers which count numerical values one by one can be used for example with the cyclic counter in which numerical values are renewed by every transmission frame.

In the error correcting encoder 111, L cells of the transmission data 114 having length of (N–s–m) symbols are collected and used to generate error correcting codes 116 having length of k symbols by using interleave methods. That is, in L×(N–s–m) data symbols arranged in two-dimensional space shown in FIG. 20, error correcting coding is performed from the divided L symbols and error correction codes 116 of k symbols are generated. In case of using Reed Solomon error correction codes, random errors of K/2 symbols (omit fractions) can be corrected in L symbols. If the location of errors can be detected by using the identifier 117, it is possible to perform the error correction of k symbols. Further, after L error detecting codes 115 (122, in FIG. 20) are collected from the error detecting coder 110 for error correcting coding, the error correcting codes 116 of k symbols are generated as stated above.

The error correcting encoder 111 sends a synchronous signal 119 to the identifier generator 112. Here, a synchronous signal 119 indicates the division of L cells of (N–s–m) symbols which will be interleaved. That is, it indicates the division between the L th cell and the (L+1) th cell. In response to the signal 119 from the error correcting encoder 111, numerical values of the identifier 117 are reset 0. Also, after the identifier generator 112 sends the synchronous signal 119 to the error correcting encoder 111 in units of (L+k) cells, interleave methods can be started in response to the signal 119.

At the transmission cell composer 113, k cells for error correcting coding 124 are also generated with error correcting codes 116 and the identifier 117 shown in FIG. 20. In FIG. 20, error correction coding is performed in units of symbols, but can be performed in units of blocks of N/p symbols.

The transmitter for coding error correction codes on the transmission frame based on Embodiment 11 attaches an identifier on every transmission cell. In addition, in the transmission direction, error detecting codes of m symbols which cannot correct but can detect errors are generated and attached. Further, error correcting codes which can recover errors of k symbols are generated in the orthogonal direction of transmission and transmitted as data cells.

Embodiment 12

In Embodiment 11, the direction for generating error correction codes and the direction for generating error detecting codes are configurated on the orthogonal way. But these directions can be the same.

Figure 21:
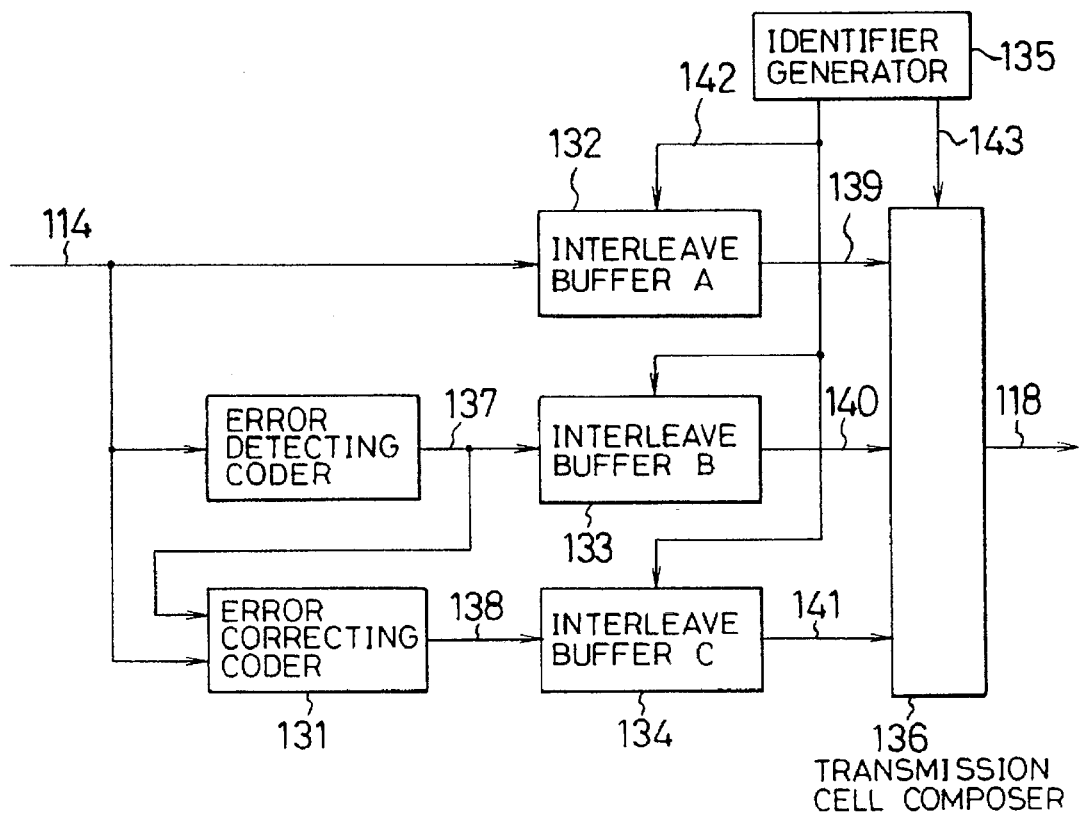
FIG. 21 shows a block diagram of the transmitter for coding error correction codes on the transmission frame according to a twelfth embodiment of the present invention.
Figure 22:
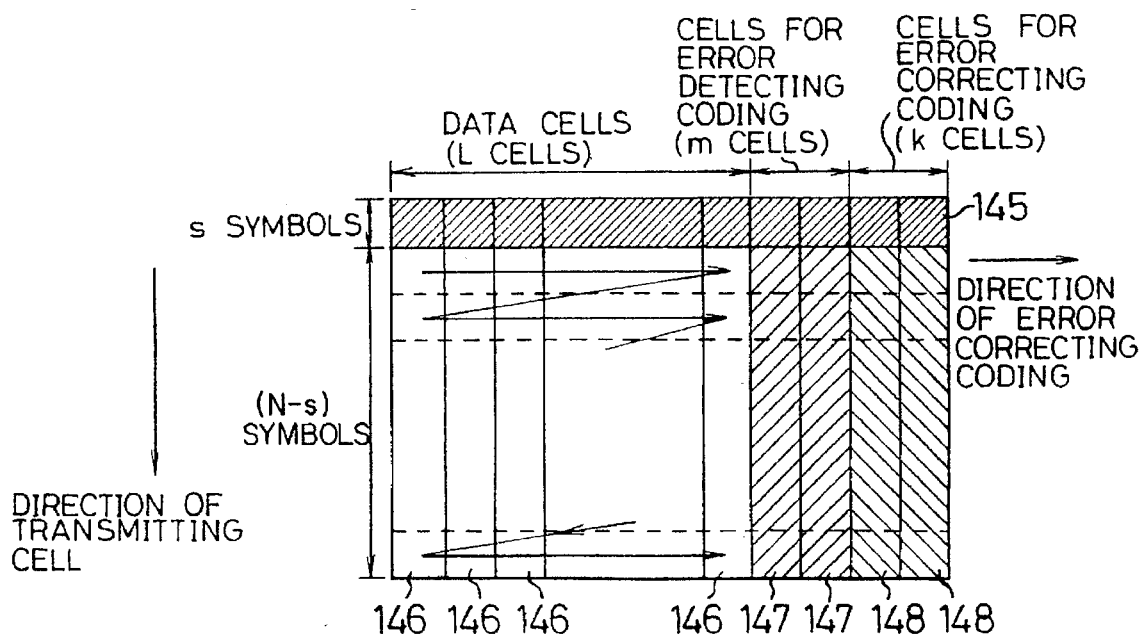
FIG. 22 shows the configuration of the transmission frame according to said twelfth embodiment of this invention.

In FIG. 21, there is shown another embodiment based on this invention of the transmitter for coding error correction codes on the transmission frame. FIG. 22 shows a configuration of the transmission frame for this embodiment. In FIG. 21, 130 donates an error detecting coder; 131 is an error correcting encoder; 132 is an interleave buffer A; 133 is an interleave buffer B; 134 is an interleave buffer C; 135 is an identifier generator; and 136 is a transmission cell composer.

The operation will now be described. In FIG. 21, coded transmission data 114 which is used in video or audio is transferred to the error detecting generator 130 and divided by every L symbol. Then error detecting codes 137 of m symbols are generated. In the error correcting encoder 131, the error correcting coding is performed for (L+m) symbols including the transmission data 114 divided by L symbols and the corresponding m error detecting codes 137. Then error correcting codes 138 of k symbols are generated.

In the interleave buffer A 132 which has a capability to store L×(N–s) symbols, transmission data 114 having length of L symbols are stored. Once data of L×(N–s) symbols (all data cells 146 shown in FIG. 22) are stored, L transmission data cell 139 are read out to the transmission cell composer 136, in the orthogonal direction of input in units of (N–s) symbols. Then, an identifier of s symbols from the identifier generator 135 is attached and the cell is transmitted as the transmission cell.

In the interleave buffer B 133 which has a capability to store (N–s)×m symbols, error detecting codes 137 having length of m symbols generated in the error detecting coder 130 are stored. When data of m×(N–s) symbols are stored, the error detecting codes 140, included in cells 147 in FIG. 22, are read out to the transmission cell composer 136 in the orthogonal direction of input in units of (N–s) symbols. In the interleave buffer C 134 which has a capability to store (N–s)×k symbols, the error correcting codes 138 having length of k symbols generated in the error correcting coder 131 are stored. When data of (N–s) symbols are stored, the error correcting codes 141 included in k cells are read out to the transmission cell composer 136 in units of (N–s) data symbols in the orthogonal direction of the input order. Then, identifiers from the identifier generator 135 are attached to the error correcting codes and the cells are transmitted as the transmission cells.

The control of writing and reading out into these interleave buffers is performed in accordance with the control signal 142 from the identifier generator 135.

In the transmission cell composer 136, the transmission frame 118 is generated based on the configuration of the transmission frame shown in FIG. 22 with the identifier 143 of s symbols from the identifier generator 135. That is, the identifier 143 is transferred to the identifier field 145 shown in FIG. 22, according to the order of transmission cells. Then, the transmission data 139 are arranged in L data cells 146 and the error detecting codes 140 are arranged in m cells 147 for error detecting codes and the error correcting codes 141 are arranged in k cells 148 for error correcting codes.

Because transmission order of data cells 146, cells for error detecting codes 147, cells for error correcting codes 148 is recognized by the identifier 143 included in each transmission cell, these cells need not be transmitted in accordance with the order of numerical values of the identifier 143.

In addition, the identifiers aren't necessarily situated on the top.

In FIG. 22, error correction coding is performed in units of symbols but can be performed in units of blocks of N/p symbols. Thus, it is possible to make the error correcting generator small in scale.

Embodiment 13

In the present invention, either error detecting codes or error correcting codes can be generated first. If error correcting codes are generated first, errors can be detected with greater precision with the use of the error detecting system because error correcting system has a facility for detecting errors. On the other hand, if error detecting codes are generated first, it is possible to detect errors even though the receiver comprises no error correcting circuit.

Figure 23:
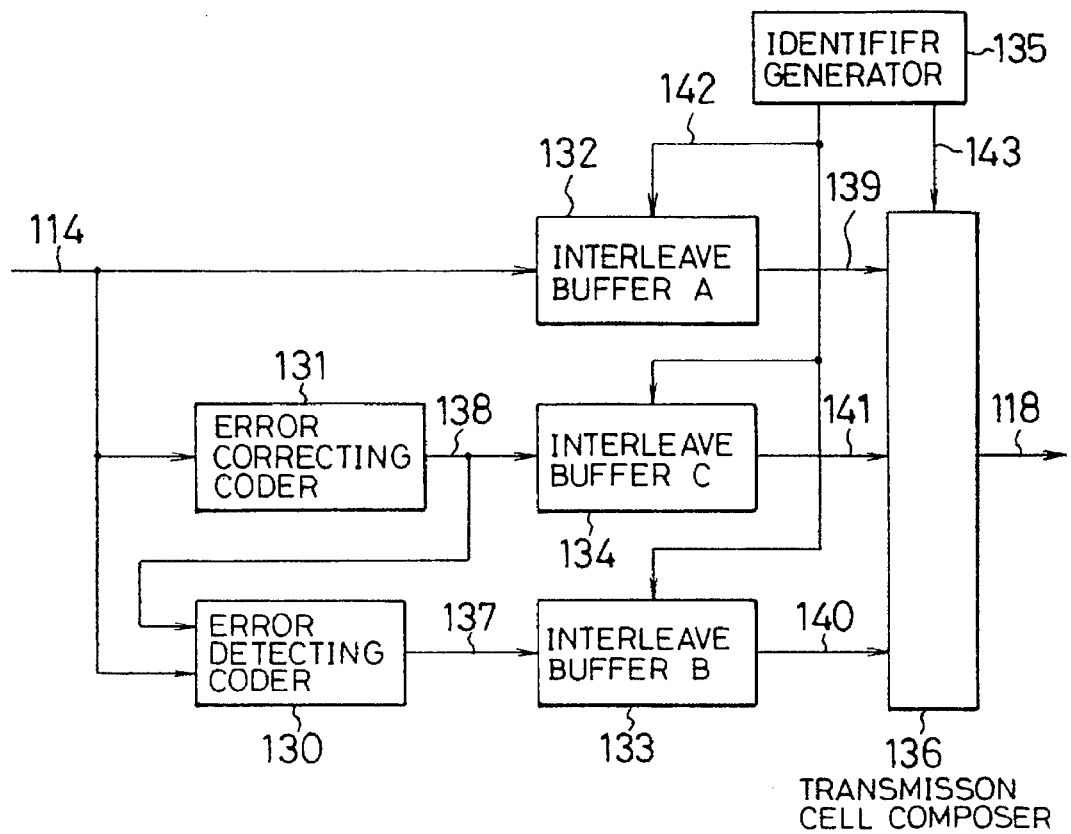
FIG. 23 shows a block diagram of the transmitter, according to a thirteenth embodiment of the present invention.
Figure 24:
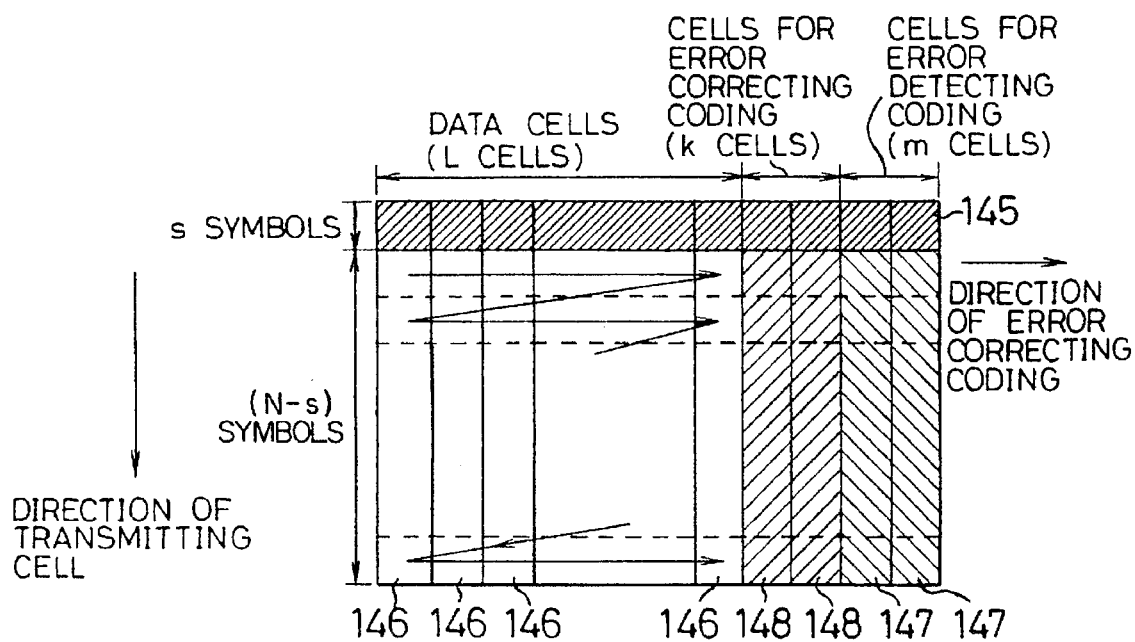
FIG. 24 shows the configuration of the transmission frame, according to said thirteenth embodiment.

In FIG. 23 there is shown an another embodiment of the transmitter for coding error correction codes on the transmission frame of the present invention. FIG. 24 illustrates a configuration of the transmission frame in this embodiment. The elements of the configuration in FIG. 23 are equivalent to those in FIG. 21.

The operation will be explained. In FIG. 23, the transmission data 114 is divided by every L symbols and the error correcting codes 138 of k symbols are generated first. In the error detecting coder 130, error detecting coding is performed for the divided transmission data 114 and the corresponding error correcting codes 138, that is, in units of (L+k) symbols and error detecting codes 137 of m symbols are generated. Other operations of each interleave buffer and the transmission frame composer 136 are the same as described in FIG. 21.

The transmitter for coding error correction codes on the transmission frame attaches identifiers which are used to detect cells lost during transmission. Error detecting codes which provide greater precision of detection and error correcting codes are generated in the orthogonal direction of transmission. In this case, either error correcting codes or error detecting codes can be generated first.

Further, in the above embodiments 11–13, there is shown the case that error correction coding and error detection for data in the transmission cell are performed in units of symbols. But, as stated before, it is possible to perform error correction coding and error detection in units of the N/p data blocks generated by dividing N data symbols into p.

Embodiment 14

In this embodiment, the length of the error detecting codes is extended by q times. Much greater precision can be provided in the detected data whose length is extended by q times. That is, the length of data isn't proportional to that of error detecting codes at the same detecting precision level. Relatively shorter code length is needed for the extended length of data. When the length of error detecting codes is extended, greater precision of detection can be achieved.

Figure 25:
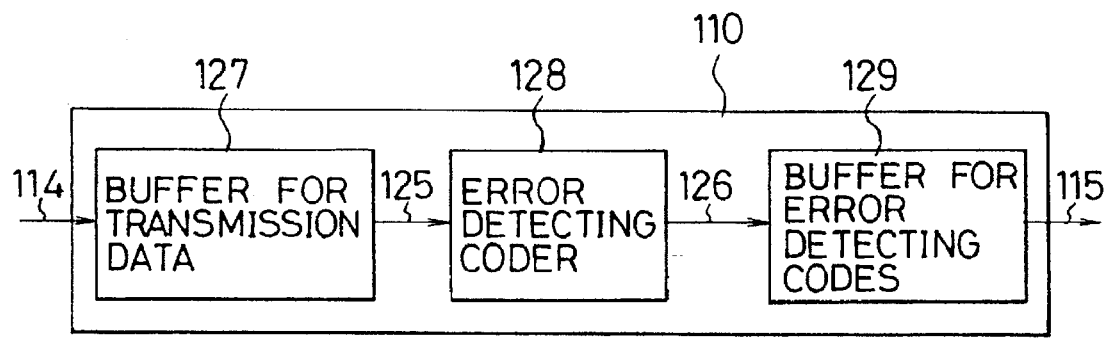
FIG. 25 shows a block diagram showing the configuration of the error detector, according to a fourteenth embodiment of the present invention.
Figure 26:
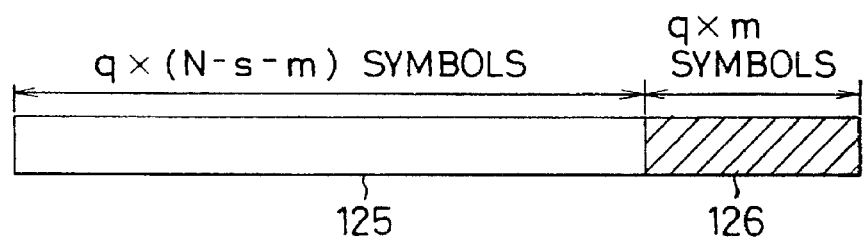
FIG. 26 shows a figure showing the coding area of the error detecting codes, according to said fourteenth embodiment of this invention.

In FIG. 25, there is shown another embodiment of the error detecting coder 110 of the present invention. FIG. 26 illustrates the configuration of error detecting codes which are used in this embodiment.

In FIG. 25, numeral 127 denotes the buffer for transmission data; 128 is an error detecting coder; and 129 is the buffer for error detecting codes. In FIG. 26, 125 is data having q×(N−s−m) symbol length, and 126 is an error detecting code having q×m symbol length.

That is, data of q cells are collected temporarily for generating error detecting codes.

Next, the operation will be described. In the error detecting coder 110 shown in FIG. 25, q transmission data 114 of (N−s−m) symbols is collected at the buffer for transmission data 127 for transmitting the data 125. Then, error detecting codes 126 of q×m symbols shown in FIG. 26 are generated in the error detecting coder 128 for each unit of the data 125.

Transmission is based on a predetermined rule. For example, the transmission cells need to be transmitted in units of N symbols. In the buffer for error detecting codes 129, the error detecting codes 126 having q×m symbols length are divided into q blocks by every m symbol. Thus, the error detecting codes 126 restored to N symbols are transferred to the transmission frame composer 113 as the error detecting codes 115. Hereby, it is possible to extend the symbol length of error detecting codes 126 by q times and provide greater precision of detection without damaging transmission efficiency because the transmission unit is restored to the original N data symbols. As has been described, error detecting codes are extended by q times in the transmission direction. The error detecting codes can also be extended by q times in the coding direction.

In the transmitter for coding error correction codes on the transmission frame based on Embodiment 14, data of q cells are collected temporarily so as to generate error detecting codes. A volume of error detecting codes which have q×m symbols generated from a volume of data corresponding to q cells can detect errors with greater precision even in q cells, compared to the case that errors are detected respectively. But in case of transmission, cells are transmitted in the original transmission units, that is, in units of N symbols.

Embodiment 15

Figure 27:
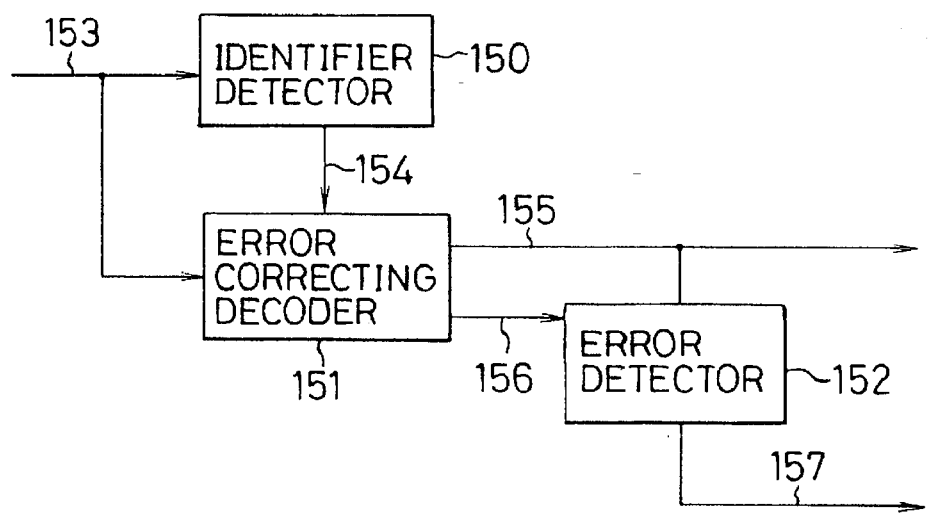
FIG. 27 shows a block diagram of the receiver, according to a fifteenth embodiment of the present invention.

The following is an example of an error correcting receiver, explained with reference to FIG. 27. In FIG. 27, there is shown an embodiment of the receiver which receives the transmission frame shown in FIG. 20. In FIG. 27, 150 denotes an identifier detector; 151 is an error correcting decoder; and 152 is an error detector.

The operation will now be described. In FIG. 27, in the receiving cell 153 having N symbol length transmitted in the communication line, identifiers of s symbol length included in the receiving cell 153 are detected. The identifier is examined to determine whether receiving cell 153 is received according to the transmission order without transmission loss. In the configuration of the transmission frame shown in FIG. 20, L data cells 123 and k error correcting coding cells 124 must be received. However, if a cell is lost during transmission, the location of the lost cell can be determined by the identifier and transferred to the error correcting encoder 151 as the receiving cell information 154. The receiving cell information 154 includes identifiers which identifies whether the receiving cell 153 is the data cell 123 or the error correcting coding cell 124.

In the error correcting decoder 151, random errors or cell losses caused during transmission in the data cell 123 of the receiving cell 153 are corrected by the error correction codes included in the cell for the error correction 124. In the error correcting decoder 151 in the present embodiment, a buffer of (L+k)×(N−s) symbols is provided, and transmission data transmitted after processing by the interleave methods are read out in (L+k) symbol units in the orthogonal direction of transmission, data area of L symbols is corrected by using error correction codes of k symbols.

In case of employing Reed Solomon error correction codes, random errors of k/2 symbols (omit fractions) can be corrected in L symbols. And if the location of cell loss is identified by the receiving information cell 154, it is possible to perform the error correction of k symbols. The receiving data 155 having (N−s−m) symbol length in the corrected data cell 123 and the error detecting code 156 having m symbol length are transferred to the error detector 152. Errors in the receiving data 155 are examined with the error detecting codes 156. In case that errors remain, the error flag 157 is set.

The receiver for decoding error correction codes on the transmission frame based on Embodiment 15, when the location of cell discard is notified by the identifier, data are recovered by the error correcting codes and errors are detected by the error detecting codes. The error correcting direction and the error detecting direction are equivalent to those at the transmitter site.

Embodiment 16

Figure 28:
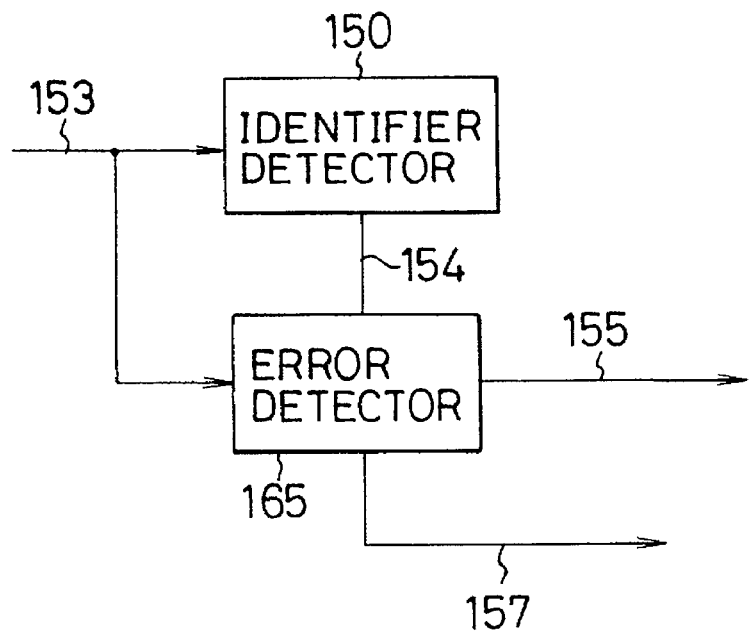
FIG. 28 shows a block diagram of the receiver, according to a sixteenth embodiment of the present invention.

The following is an example of the apparatus being small in scale by simplifying the receiver. In FIG. 28, there is shown another embodiment of the receiver for decoding error correction codes which receives a transmission cell the configuration shown in FIG. 20. In FIG. 28, 165 shows the error detector and other elements are equivalent to those in FIG. 27. The error correcting decoder in FIG. 27 is removed.

The operation will now be described. In FIG. 28, the error correcting decoder 151 in FIG. 27 isn't shown. Identifiers of s symbols included in the receiving cell 153 of N symbols are detected by the identifier detector 150 and transferred to the error detector 165 as the receiving cell information 154. In the error detector 165, the receiving cell information 154 identified as the data cell 123 are examined with receiving cell information 154 to determine whether transmission errors are in the receiving data 155 having (N−s−m) symbols length by using error detecting code of m symbol length. If errors are detected, the error flag 157 is set.

Further, in the above embodiments 15 or 16, there is shown the case that the error correction coding and other processing are performed in units of symbols. But it is possible to perform the processing in units of N/p data blocks generated by dividing N data symbols into p.

The receiver for decoding error correction codes on the transmission frame based on Embodiment 16 only has a facility for detecting errors and identifiers in use of error detection codes even when the transmitter provides a facility for appending error correction codes.

Embodiment 17

Figure 29:
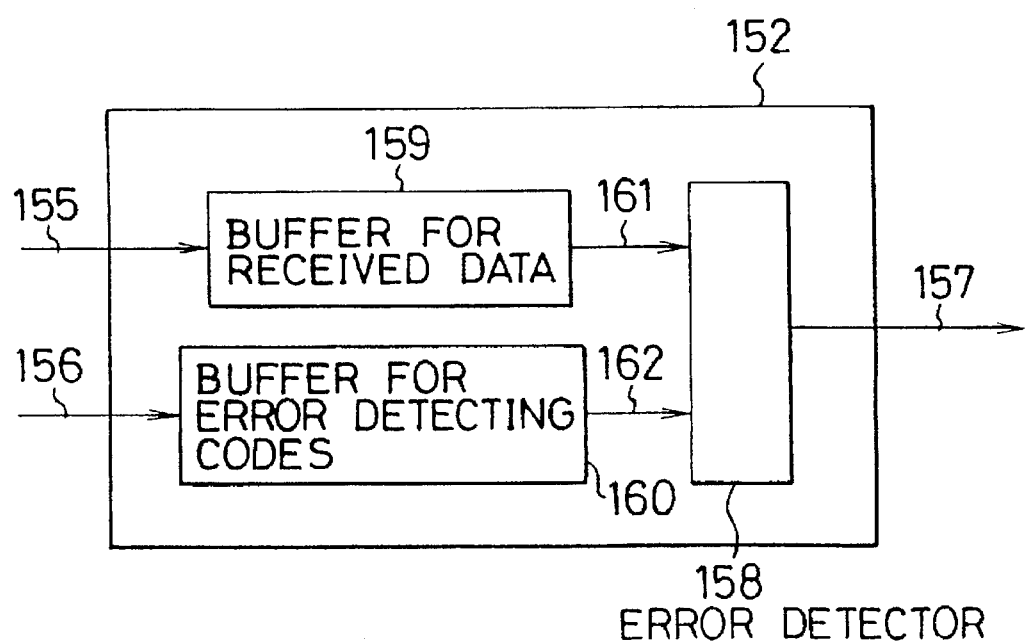
FIG. 29 shows a block diagram of the receiving error detector, according to a seventeenth embodiment of the present invention.

In FIG. 29, there is shown an embodiment of the internal configuration of the error detector 152 in case of receiving a transmission frame in which error detecting coding is performed according to Embodiment 14. In the figure, numeral 158 denotes an error detector; 159 is a buffer for received data; and 160 is a buffer for error detecting codes.

The operation will be explained, hereinafter. The received data 155 having (N–s–m) symbol length and the error detecting codes 156 of m symbols in the data cell 123 transferred to the error detector 152 are stored in the buffer for received data 159 and the buffer for error detecting codes 160, respectively. P cells of each data are stored in each buffer. The received data 161 having p×(N–s–m) symbol length are detected in the error detector 158 by the error detecting codes 162 having p×m symbol length. If errors remain, the error flag 157 is set.

As described before, this method is effective when the direction as for detecting errors is the same one of correcting errors.

The receiver for decoding error correction codes on the transmission frame based on Embodiment 17 collects p received cells temporarily. And it detects errors with greater precision in a volume of data corresponding to p received cells by using error detecting codes of p×m symbols.

Embodiment 18

Figure 30:
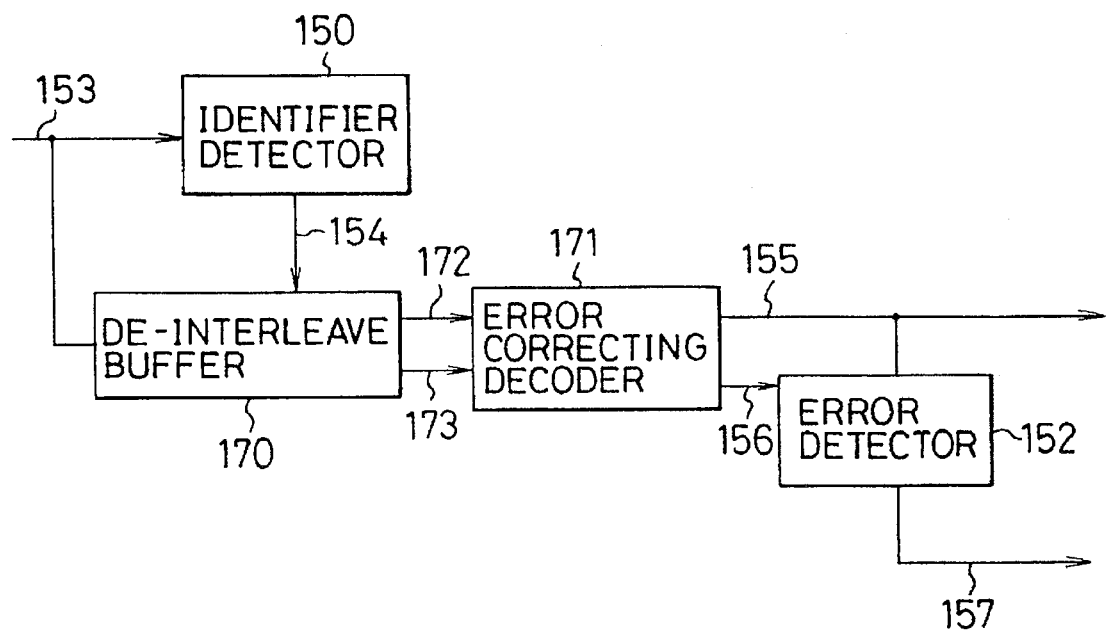
FIG. 30 shows a block diagram of the receiver, according to an eighteenth embodiment of the present invention.

In FIG. 30, there is shown another embodiment of the receiver which receives the transmission frame transmitted according to Embodiment 12. In the figure, numeral 170 shows a de-interleave buffer, and 171 shows an error correcting decoder. Other elements are equivalent to those in FIG. 27.

Next, the operation will now be described. In the transferred receiving cell 153 of N symbol length, identifiers of s symbol length are detected by the identifier detector 150. Then, the detector determines whether (L+m+k) receiving cells 153 are received orderly without transmission loss.

In the configuration of the transmission frame shown in FIG. 22, L data cells 146, m error detecting cells 147, and k cells for error correcting coding 148 should be received. But if cell loss occurs during transmission, the location of the lost cell is determined by the identifier 145 and transferred to the de-interleave buffer 170 as the receiving cell information 154. In the de-interleave buffer 170, which has a capability to store (L+m+k)×(N–s) data symbols, receiving cell 153 is stored. The lost cell as determined by the receiving cell information 154 is filled with dummy data of (N–s) symbol length.

When the de-interleave buffer 170 is filled, data of (L+m) symbol length 172 and the error correcting codes 173 of k symbol length are read out in the orthogonal direction of transmission to the error correcting decoder 171. This read out is repeated (N–s) times. In the error correcting decoder 171, the data 172 including error detection codes having m symbol length are corrected by the error correcting codes 173. Then, the received data 155 and error detecting codes 156 are transferred to an error detector 152. In the error detector 152, the error detecting codes 156 are used to determine whether the received data 155 has errors. If errors remain, the error flag 157 is set.

Embodiment 19

Figure 31:
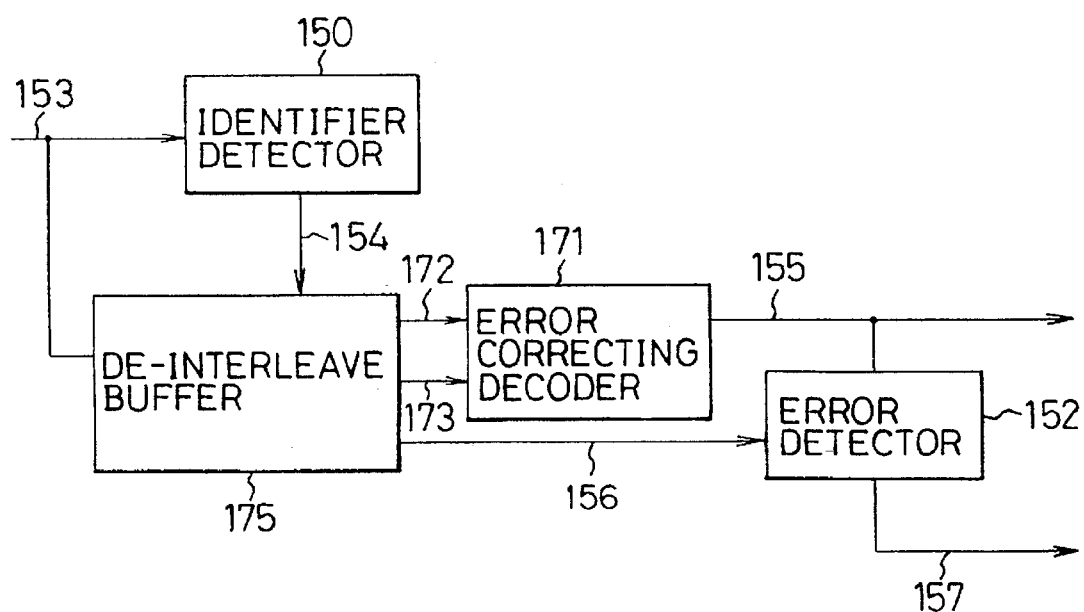
FIG. 31 shows a block diagram showing the transmission receiver, according to a nineteenth embodiment of the present invention.

In FIG. 31, there is shown another embodiment of the receiver for decoding error correction codes which receives the transmission frame transmitted according to Embodiment 13. In the figure, numeral 175 shows the de-interleave buffer and other elements are equivalent to those in FIG. 27.

The operation is explained, hereupon. As described in Embodiment 18, the identifier detector 150 determines whether (L+m+k) receiving cells 153 are received in order without transmission loss. In the de-interleave buffer 175, which has a capability to store (L+m+k)×(N–s) symbols, receiving cells 153 are stored. Any lost cell as determined by the receiving cell information 154 is filled with dummy data having (N–s) symbol length. When the buffer is filled, the data 172 having L symbol length and the error correcting codes 173 having k symbol length are read out to the error correcting decoder 171 in the orthogonal direction of transmission. And the error detecting codes 156 having m symbol length are read out to the error detector 152. This read out is performed (N–s) times. In the error correcting decoder 171, errors are corrected for the data 172 having L symbol length by error correction codes 173, and received data 155 is outputted. The error detector 152 determines whether errors are detected in the received data 155 by the error detecting codes 156. If errors remain, the error flag 157 is set.

Embodiment 20

Figure 32:
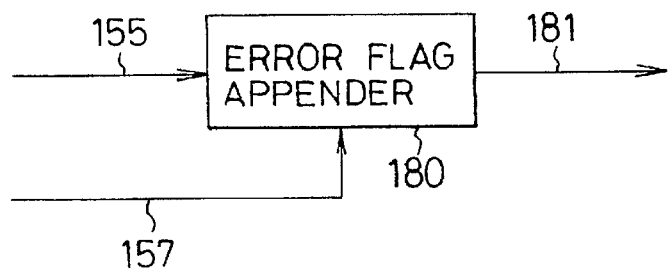
FIG. 32 shows a block diagram of the error flag adapter at the receiver site, according to a twentieth embodiment of the present invention.

In FIG. 32, there is shown another embodiment of the receiver for decoding error correction codes on the transmission frame described in Embodiment 15 to 19 the figure, 180 is an error flag appender.

The operation will be explained, hereafter. The received data 155 and the error flag 157 received in the receiver for decoding error correction codes on the transmission frame described in Embodiments 15 to 19 are transferred to the error flag appender 180 and data in the error flag 157 which indicates if there are errors or not is attached to the received data 155 and transferred as the output data 181.

Figure 33:
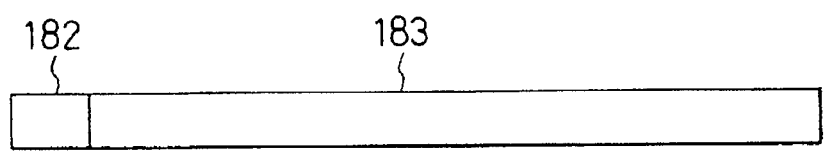
FIG. 33 shows a data format of input data, according to said twentieth embodiment.

FIG. 33 illustrates a data format in the output data 181. In the figure, numeral 182 shows an error indicating flag field which is assigned for the error flag 157; 183 is the data area which is assigned for the received data 155. If the received data 155 has errors and the error flag 157 is set, codes for indicating errors are noted in the error indicating flag field 182. On the other hand, if the received data 155 has no errors and the error flag 157 isn't set, codes for indicating there are no errors are noted in the error indicating flag field 182. The received data 155 is recorded in the data area 183 without being concerned with whether there are errors or not. In the receiver for decoding error correction codes on the transmission frame, when the received transmission cells are transferred to other circuits, output data 181 including the contents in the error flag 157 is transferred. In the receiver for decoding error correction codes on the transmission frame which has no facility of error correction or error detection, it is possible to examine for errors in the data area 183, by referring to the data contents in the error indicating flag field 182.

In the receiver for decoding error correction codes on the transmission frame based on Embodiment 20, when errors are detected at the receiver site, a flag, as a result of the error detection, is attached to the cell transferring to other circuits.

Embodiment 21

In the preceding embodiments, a frame for error correction is equal to one transmission frame. In this embodiment, the frame for error correction is equal to two consecutive transmission frames and is composed of cells which are shifted by one symbol.

Figure 34:
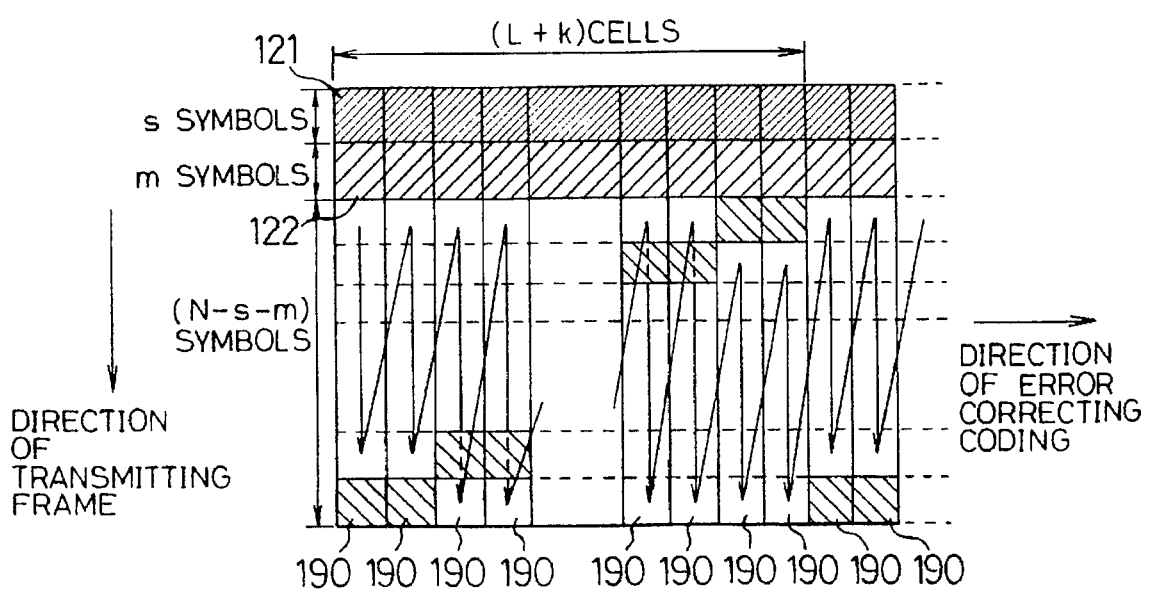
FIG. 34 shows the configuration of another transmission frame, according to a twenty-first embodiment of the present invention.

FIG. 34 illustrates another configuration of the transmission frame in Embodiment 11. In the figure, 121 is a field for identifiers of s symbols; 122 is a field for error detecting coding codes of m symbols; and 190 is an information cell.

In the figure, cells on the left side, that is, the first transmission cell and the consecutive transmission cell are attached check symbols at the latter step and a frame for error correction is composed for the L data symbols of the previous transmission frame.

The operation will now be described. In FIG. 34, the phase of interleave methods for error correction illustrated in FIG. 20 is shifted on the skew by each symbol of the transmission data and error correcting coding is performed In order. Transmission data is written in the arrow direction in the figure as well as read out. Error correcting coding is performed in the horizontal direction, that is, the orthogonal direction, from the left side to the right side when the transmission data of L symbols are collected. Hereby, whenever transmission frames are received a frame for error correction (in other words, transmission data of L symbols and the corresponding error correcting codes having k symbol length) is regenerated. Then, it is possible to decode error correction codes and the error correction decoder at the receiver site can be small in scale.

The object of coding for error detecting codes in the error detecting field 122 can be Just the transmission data in the transmission frame and it can include error correcting codes.

Embodiment 22

In this embodiment, there is shown the way of composing the transmission frame which has error correction codes and can correct errors of the same length of the error correction codes in the face of random or burst errors during the transmission. Ordinarily, transmission starts after collecting a frame for error correction for all the symbols in the transmission frame and generating error correction codes for each of the frames for error correction. But, in this embodiment, transmission starts when the transmission cell is composed and a frame for error correction is composed with the same data stored in the buffer memory. Then, error correction codes are generated for each of the frames for error correction and transmitted after the transmission cell (data cell).

Figure 35:
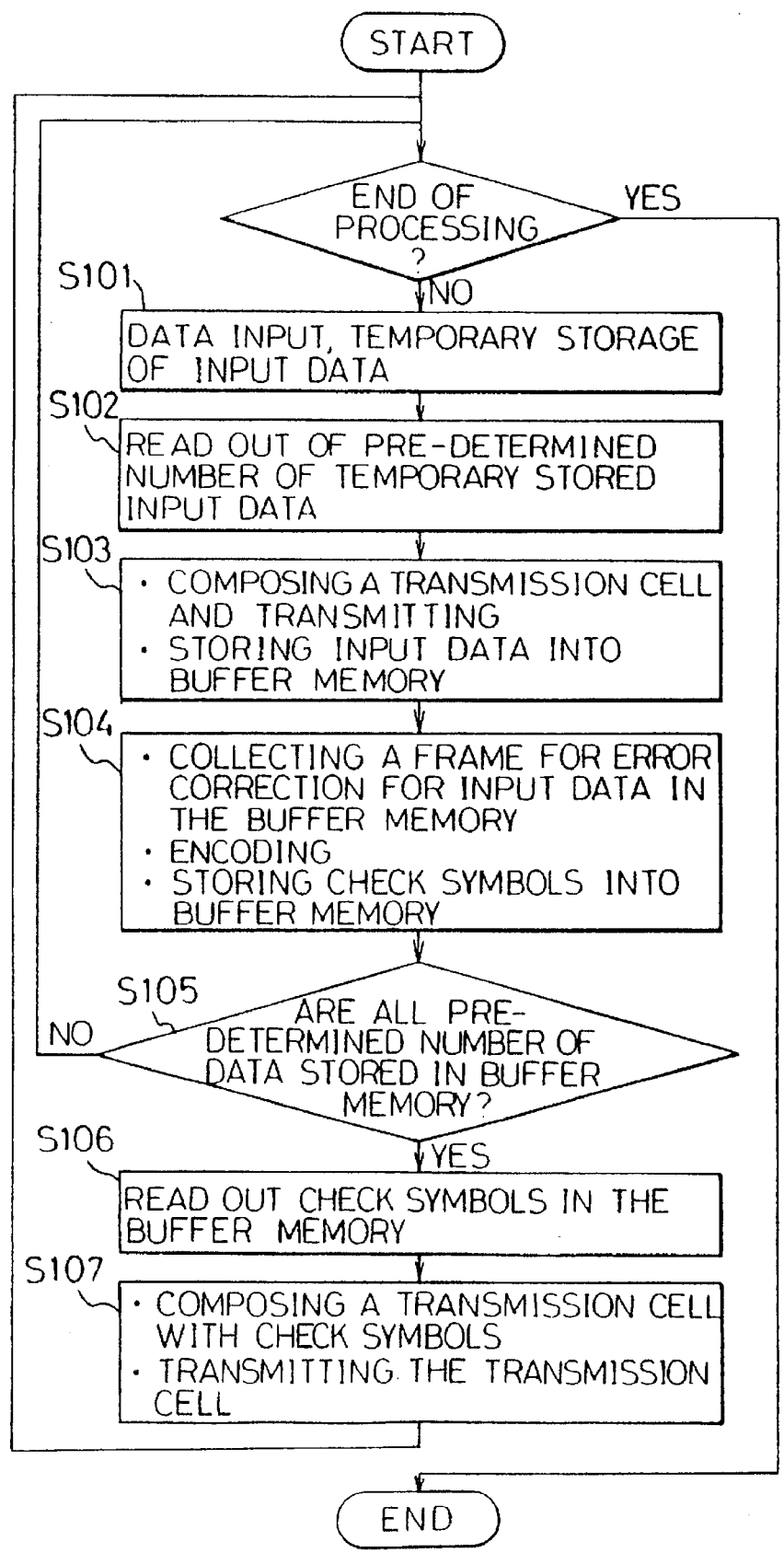
FIG. 35 shows a block flow diagram of operation of a transmitter for encoding error correction codes according to a twenty-second embodiment of the present invention.

FIG. 35 illustrates the operation of the flow chart of the way of transmitting the transmission frame having error correction codes according to the present embodiment. When the operation of transmission starts, the predetermined number of symbols of the transmission cell at Step S 101 and S 102, for example input data of N symbols are stored. Consecutively, data of the N symbols are composed as a transmission cell at Step S 103 and transmitted. At the same time, the data of N symbols are stored in the buffer memory.

At Step S 104, data of N symbols stored in the buffer memory are stored in the orthogonal direction of transmission so as to compose a frame for error correction. For example, when data of L symbols are configurated in the direction of a frame for error correction, the error correction codes (check symbols) are generated from the L data symbols and stored in the buffer memory.

At Step S 105, when L number of the transmission cell are transferred and data of all frames for error correction are stored in the buffer memory and then the error correction codes of all the frames for error correction are generated and stored in the buffer memory, error correction codes are read out at the Step S 106 and transmitted as the check cells.

Embodiment 23

In the present embodiment, identifiers are appended to each of the transmission cells so as to simplify the recovery of cell loss by detecting cell loss during the transmission.

Figure 36:
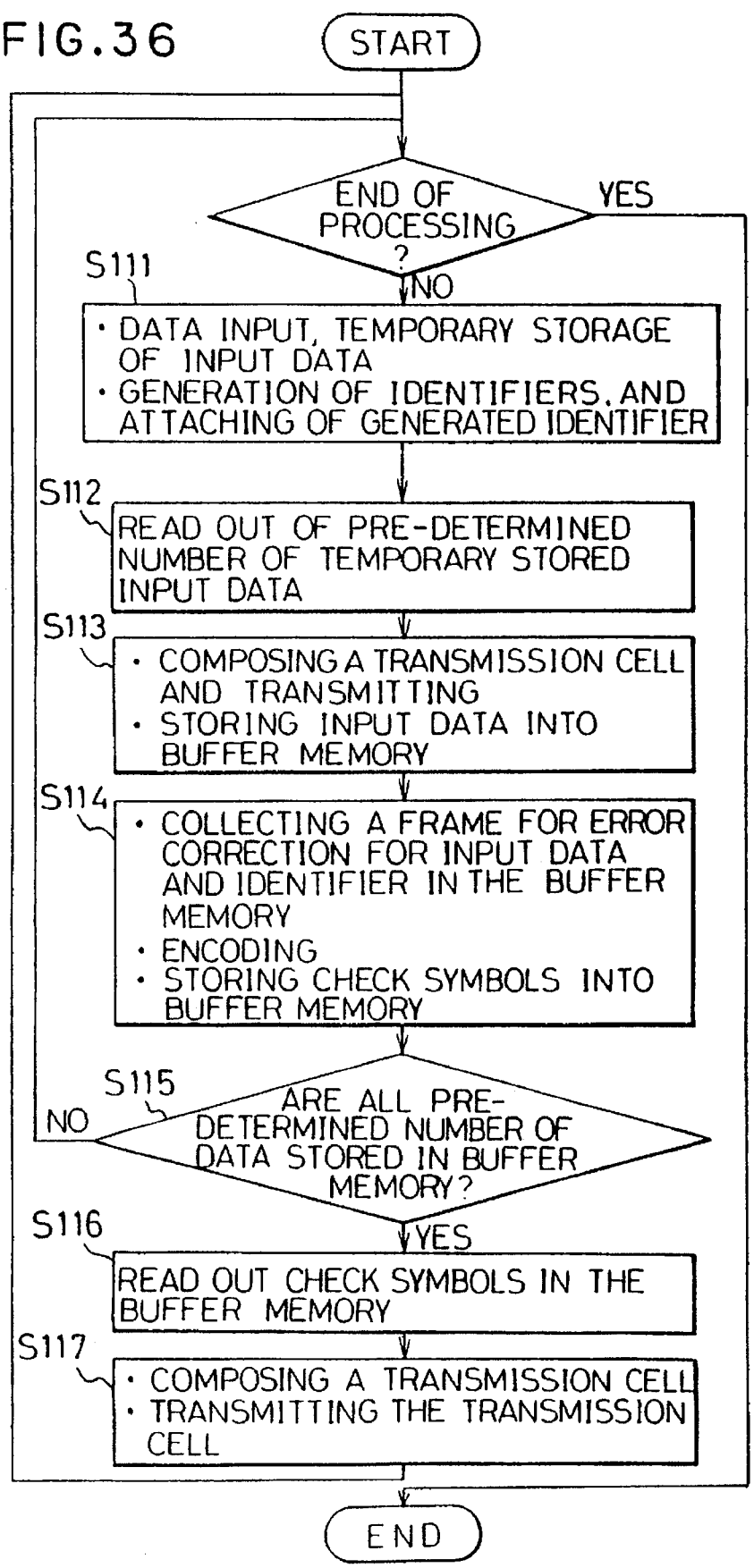
FIG. 36 shows a block flow diagram of operation of a transmitter for encoding error correction codes according to a twenty-third embodiment of the present invention.

FIG. 36 illustrates the operation of the flow chart of the way of transmitting the transmission frame with error correction codes according to the present embodiment.

The different step from the previous embodiment is Step S 111. That is, input data are decreased by the number of bits for identifiers and temporarily stored and the identifier bit is appended to the input data of N symbols, for example, to the top of the N symbols.

Thus, at Step S 112, all of the N data symbols with identifiers are read out, and transmitted as a transmission cell at Step S 113 and stored in the buffer memory at the same time.

As for the following steps, explanation is omitted because most of the operations are the same in the previous embodiments, for example, composing check symbols for each of the frames for error correction.

Embodiment 24

Because identifiers are provided for detecting and recovering cell loss during the transmission, a frame for error correction without identifiers can be used.

Figure 37:
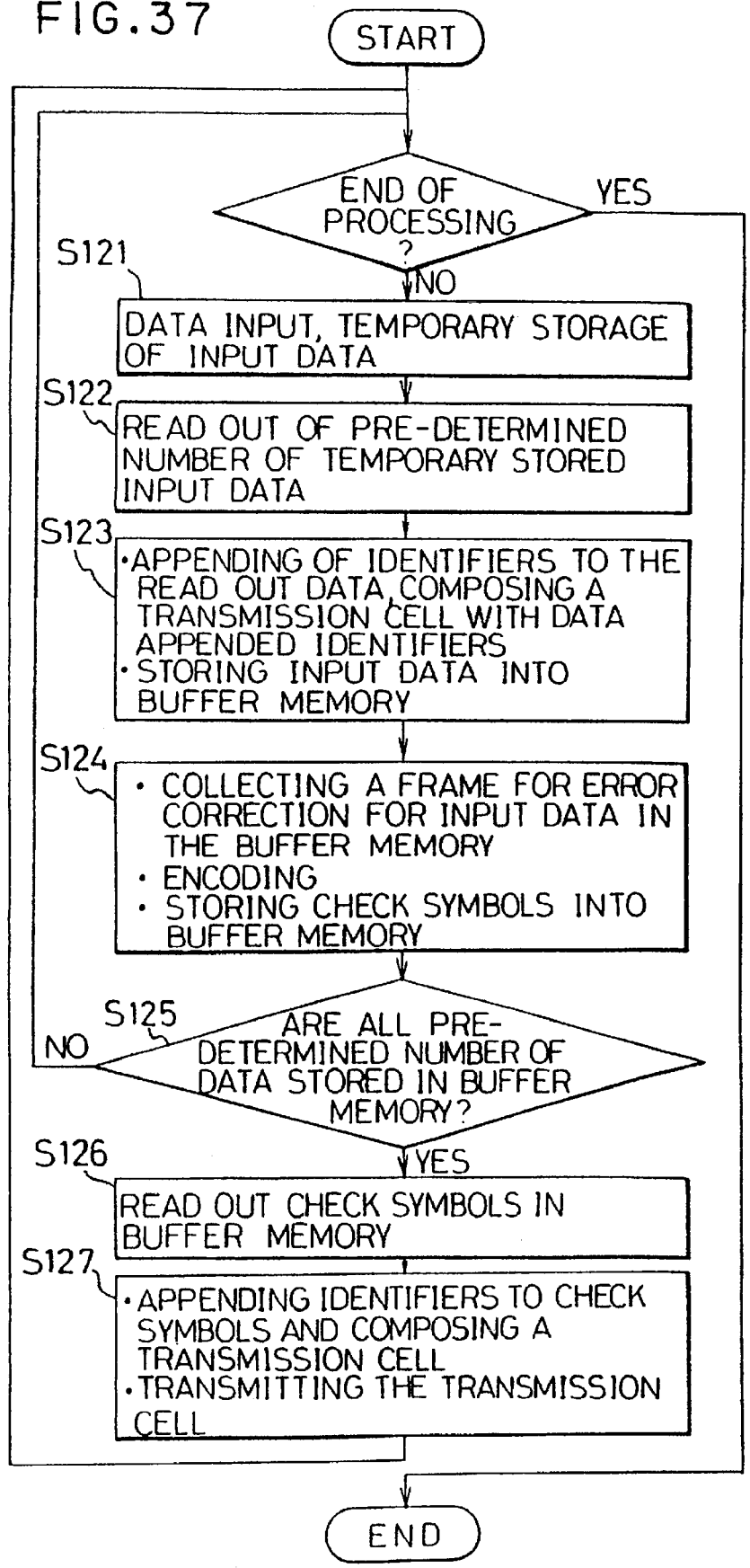
FIG. 37 shows a block flow diagram of operation of a transmitter for encoding error correction codes according to a twenty-fourth embodiment of the present invention.

FIG. 37 illustrates the operation of the flow chart of the way of transmitting a transmission frame with error correction codes, according to the present embodiment.

Input data are read out at Step S 121. And the number of read out data is decreased by the number of the identifier bits as in Embodiment 23. However, different from Embodiment 23, the identifier isn't appended at this step.

At Step S 123, the identifier bit is appended to the data for composing a transmission cell and transmitted as N symbols. The temporarily stored data without the identifiers are stored into the buffer memory.

At Step S 124, check symbols are generated from the frame for error correction when L symbols are collected in the orthogonal direction of transmission. Because the first symbol of the transmission cell at this time lacks the number of the identifier bits, check symbols generated in the frame for error correction lacks the number of the identifier bits.

After that, the same processing as in the previous embodiment is performed. At Step S 127, which is at the end of transmission of the transmission frame, identifiers are appended to the symbols which lacks the number of the identifier bits and composes a check cell of N symbols. Generally, when the check cell of N symbols is transmitted, the transmission of one transmission frame ends.

Embodiment 25

Figure 38:
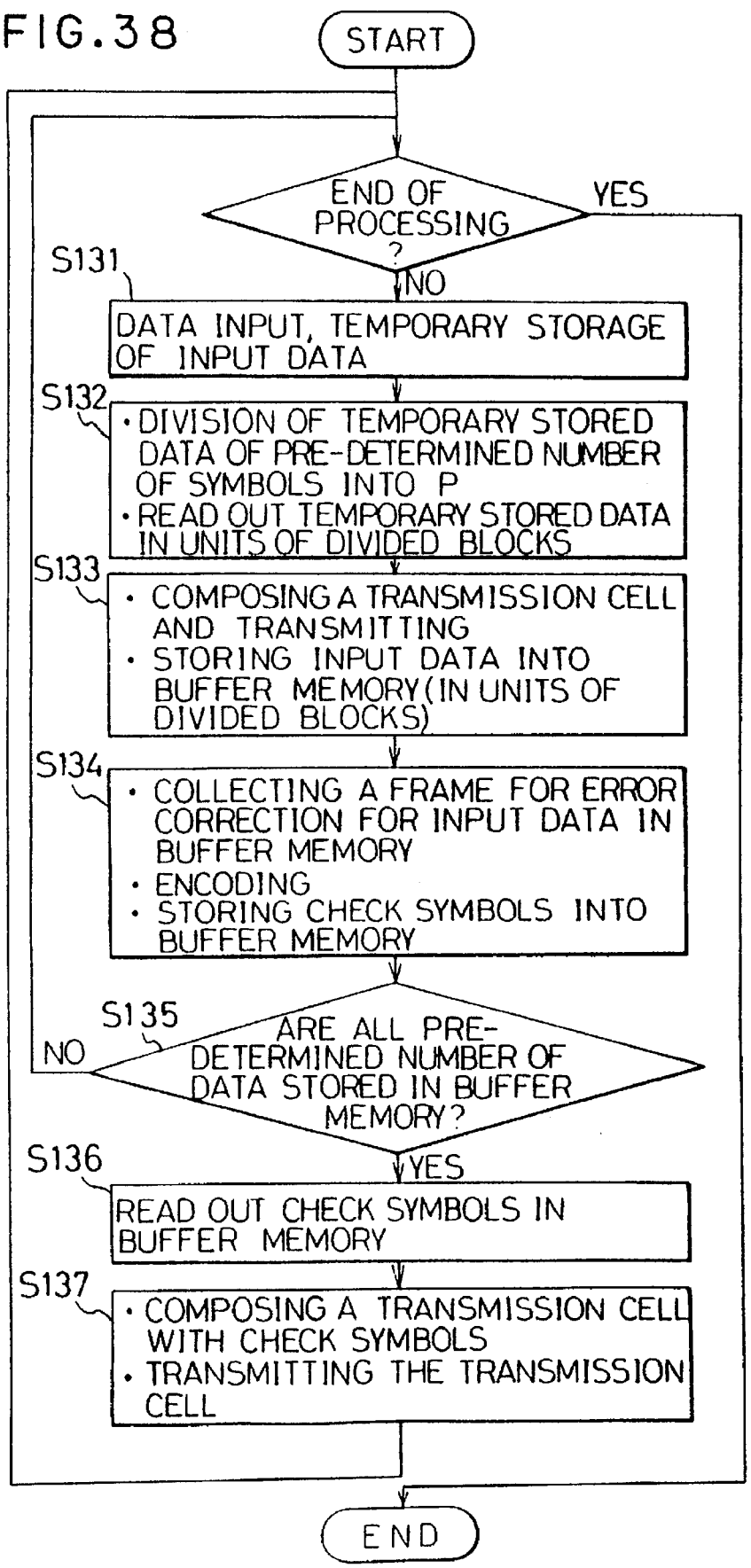
FIG. 38 shows a block flow diagram of operation of a transmitter for encoding error correction codes according to a twenty-fifth embodiment of the present invention.

Generation of the error correction codes is ordinarily performed by every symbol. However, when plural symbols are collected as data blocks, error correction codes (check symbols) can be generated by composing a frame for error correction in units of the data block. Thus, the error correcting encoder (generator of error correction codes) can became small in scale. For example, for encoding by every symbol, N number of circuits are needed but for encoding by every data block, it is possible to use p number of circuits. The number of bits for encoding in units of data blocks is larger than for encoding in units of symbols of data blocks. But, the effect of decreasing the number of circuits from N to p is much larger. FIG. 38 illustrates the operation of the flow chart of the way of transmitting the transmission frame with error correction codes according to the present embodiment.

The different step from Embodiment 22 is Step S 132. That is, input data of N symbols are divided into p blocks and generates p number of data blocks. After that, the processing of error correction and composing of the transmission cell are performed in p blocks units. That is, at Step S 133, p data blocks are collected and transmitted as one transmission cell. At the same time, p number of the data blocks are stored in the buffer memory. At Step S 134, a frame for error correction is collected in units of data blocks and error correction codes are generated. P number of error correction codes are generated in total. L number of the transmission cells are transferred and when all of the error correction codes are generated in storing all these data in the buffer memory at Step S 135, check symbols are transferred after composing the transmission cell with check symbols at Step S 137 and the processing ends.

Embodiment 26

Figure 39:
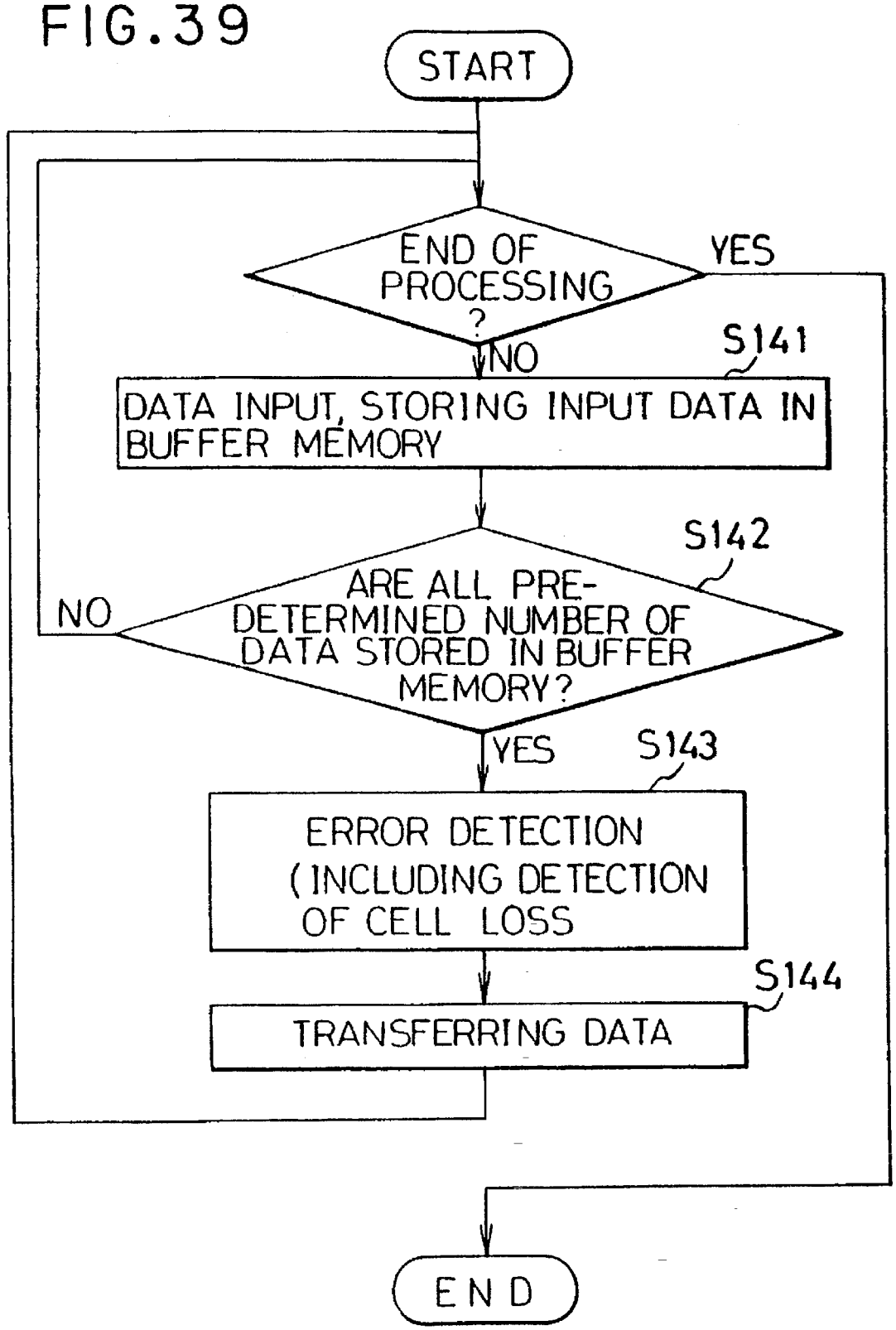
FIG. 39 shows a block flow diagram of operation of a receiver for detecting errors according to a twenty-sixth embodiment of the present invention.
Figure 40:
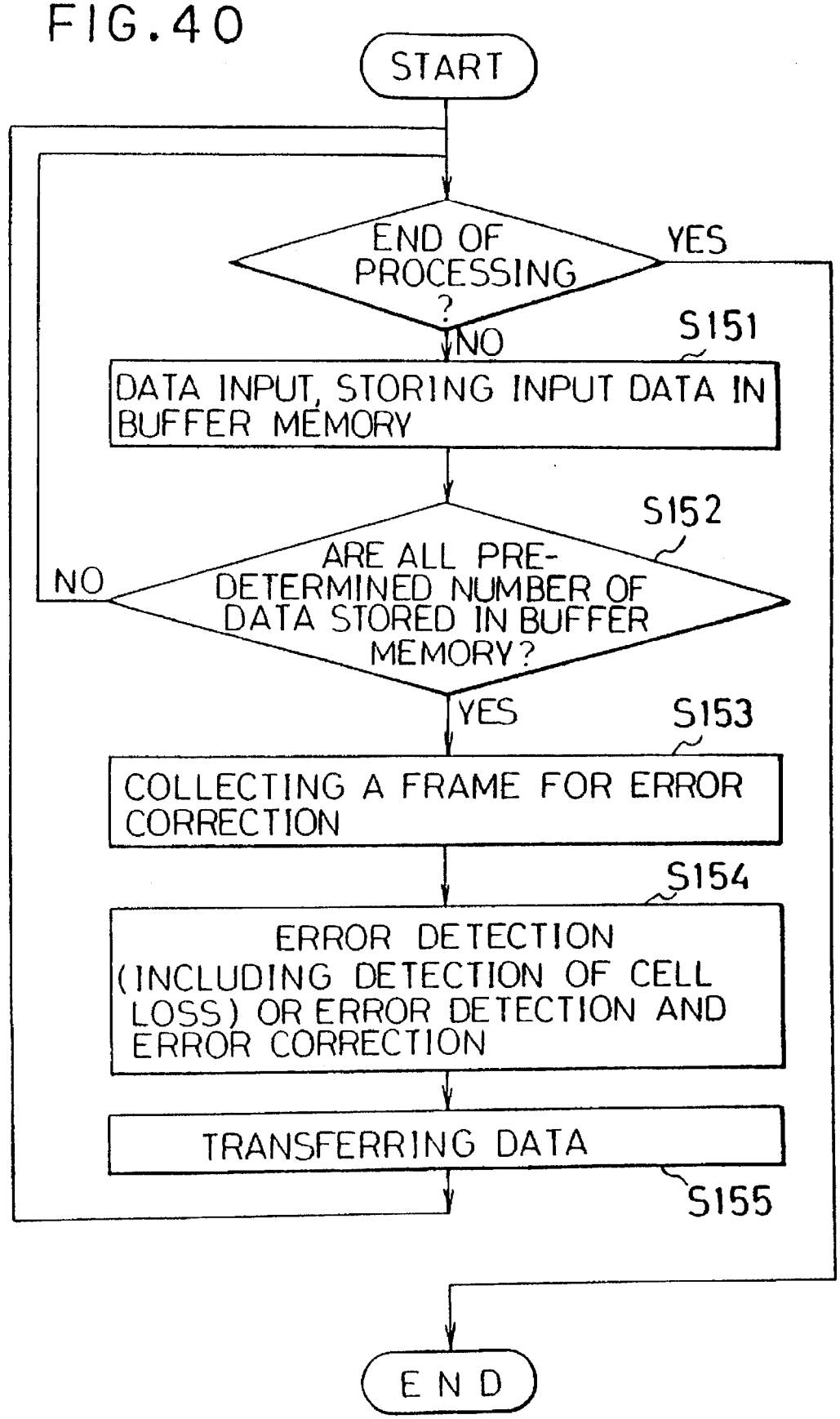
FIGS. 40 shows a block flow diagram of operation of a receiver for detecting and correcting errors according to said twenty-sixth embodiment of the present invention.

In the present embodiment, an explanation is made for the way of receiving data corresponding to the way of transmitting according to the above embodiment. FIG. 39 and FIG. 40 illustrate the operation of receiving the transmission frame with error correction codes according to the present embodiment. In FIG. 39, when the operation of receiving starts, the transmission cell received at Step S 141 is being stored in the buffer memory. At Step S 142, as a rule, all the data in one transmission frame are stored in the buffer memory. At Step 143, for example, by using cell loss in units of the transmission cell and error detection codes, error detection procedure in units of symbols in use of error detecting codes is performed in the direction of detecting errors. Further, detecting loss of the transmission cell is performed at the step before data being stored at the buffer memory.

If the receiving data doesn't have errors, at Step S 144, for example, data of one transmission frame are transferred to the circuit of the latter part. In an example of the operation of a flow chart shown in FIG. 40, compared to the FIG. 39, a frame for error correction shown in Step S 153 is composed and steps for correcting errors are increased. Other operations are equivalent to those in FIG. 39.

Embodiment 27

In the present embodiment, there is shown the case that error correction codes and identifiers are provided and the frame for error correction is determined to correct the cell loss of the same length of the error correction codes.

As has been described, if the location of the errors is known and the length of the error correction codes is for example, k symbols, an error correction procedure can be performed for the data of k symbols. Here, if k is settled to be two, errors of two data symbols can be corrected. Now that the same frame for error correction has two data symbols from the same transmission cell, it is possible to recover cell loss in one transmission cell. But if three symbols are arrayed from the same transmission cell so as to be included in the same frame for transmission, the cell loss for the transmission cell can't be recovered.

In the way described in the present embodiment, identifiers are provided for the check cells and transmission is performed for the frame for error correction so as to satisfy the pre-described conditions and not to damage the error correction. An explanation is made for the first case based on the present embodiment, referring to FIG. 12.

Figure 41:
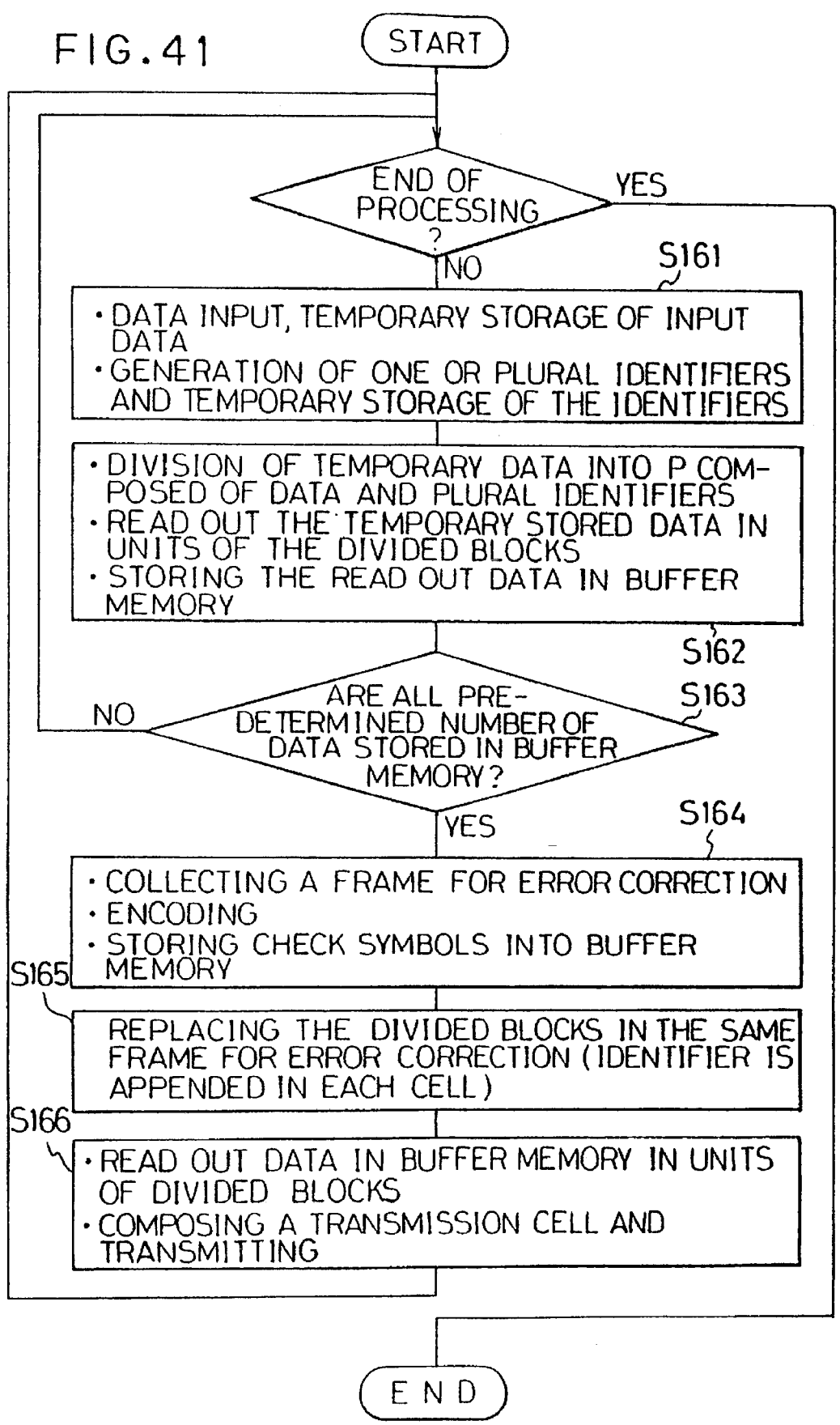
FIG. 41 shows a block flow diagram of operation of a transmitter for encoding error correction codes according to a twenty-seventh embodiment of the present invention.
Figure 43:
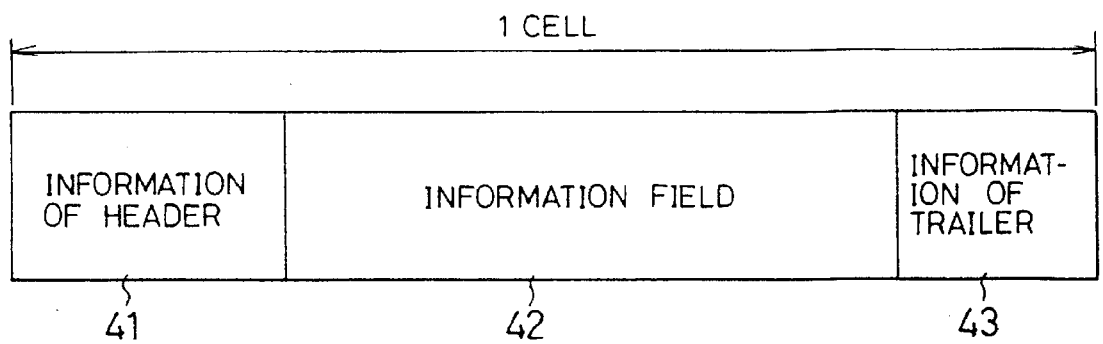
FIG. 43 shows the general configuration of the transmission cell of the related art; and, FIG. 44 shows the relationship between the transmission frame and interleave method according to the related art.
Figure 44:
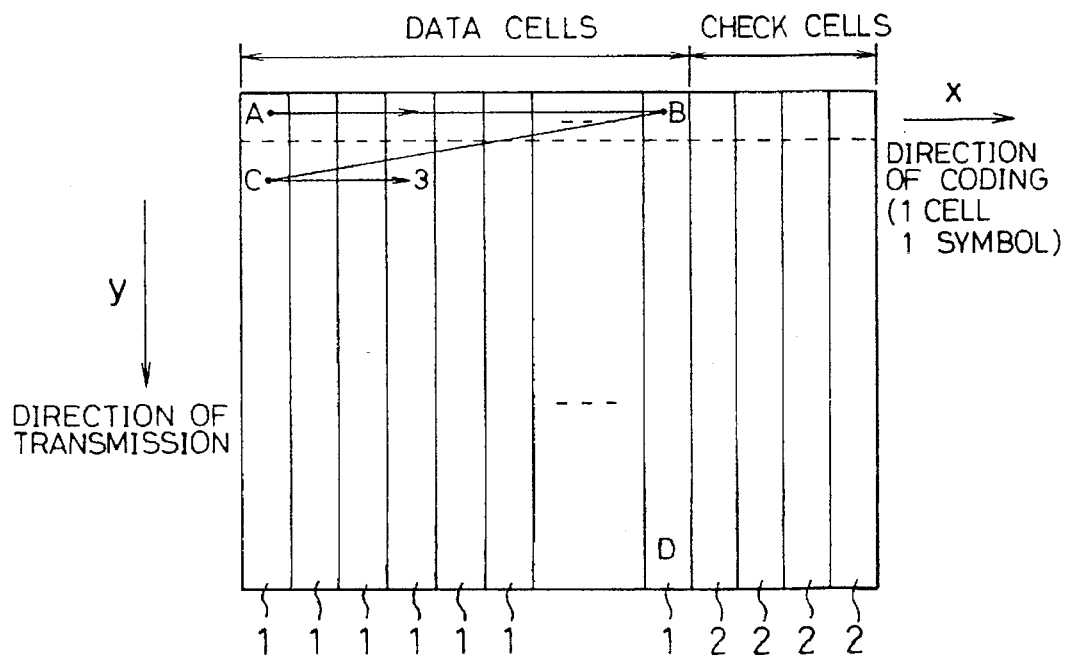

FIG. 41 illustrates the operation of the flow chart of the transmission frame with the error correction codes.

In FIG. 12, the direction of the transmission cell is the orthogonal direction of correcting errors in a frame for error correction. Though the data block 11-S3 and the check block F-S1 are replaced, a frame for error correction remains the same. Further, in this case, each transmission cell has only one data block. Therefore, if one transmission cell is lost, these lost block data can be recovered from the other block data.

At Step S 161 in FIG. 41, two identifiers are generated in case of replacing with check cells. At Step S 162, input data of N symbols are divided into p data blocks and stored in the buffer memory in units of data blocks.

At Step S 163, when the predetermined number of data are collected, at Step S 164, check symbols are generated by every frame of error correction and stored in the buffer memory. As has been described, at Step S 165, a data block in the check cell and the data block with the identifier are replaced, and all the transmission cells are transmitted with identifiers at Step S 166.

Description of the operation of the receiver is omitted but after all the data in one transmission frame are received, after replacing blocks based on the rule of the replacement on the buffer memory, decoding for the error correction is performed.

Further, according to the configuration of a frame for error correction in FIG. 34, error correction processing isn't performed in one transmission frame. However, according to the configuration, the direction of transmission and the direction of correcting errors are configurated, and the identifier is appended to all the transmission cells and the error correcting generator can become small in scale.

FIG. 42 Illustrates the configuration of the other transmission cell. FIG. 42(a) shows the relationship between data block and check symbols in one transmission frame. In this embodiment, check symbols have one data block and k symbols. And, identifiers aren't especially appended but they can be appended to the data block S1 at the end of each of the frames for error correction.

Therefore, in case of composing a transmission cell, data blocks are scanned aslant as shown in FIG. 42(a). And the transmission cell shown in FIG. 42(b) is composed. Thus, though identifiers aren't replaced, it is possible to comprise all the facilities described in the present embodiment.

What is claimed is:

1. An error-correcting transmitter for storing L data-cells of N data symbols (N>=2, L>=2), and for transmitting L number of data-cells of N symbols with k error-correction cells of N symbols, comprising:

(A) a first buffer memory for storing N symbols as a data cell, and for transmitting said data cell;

(B) a second buffer memory for receiving said data-cell from said first buffer memory, for storing L number of said data-cells, and storing k number of said error correction cells;

(C) a check-symbol generator means for generating said k number of said error-correction cells based on L number of said data-cells in said second buffer memory in a direction different from a direction of transmission, and for sending said error-correction cells to said second buffer memory; and, (D) a cell compose means for composing said data-cell from said first buffer memory, for transmitting L number of said data-cells consecutively from said first buffer memory, and for transmitting said k number of said error-correction cells from said second buffer memory following said L number of said data-cells.

2. The error-correcting transmitter according to claim 1 further comprising an attach means for attaching cell-identifiers to each of said L data-cells.

3. The error-correcting transmitter according to claim 2, wherein said attach means attaches a cell identifier to more than one symbol in K data-cells, and wherein said cell compose means exchanges a symbol having a cell-identifier with a symbol in each of said error-correction cells such that each of said data-cells and said error-correction cells includes one cell-identifier, and transmits each of said data-cells and said error-correction cells including said cell-identifiers.

4. The error-correcting transmitter according to claim 3, wherein said cell compose means exchanges said symbols having a cell-identifier in said data-cells with said symbols in said error-correction cells in a single error-correction frame.

5. The error-correcting transmitter according to claim 1, further comprising a third buffer memory for storing data-cells of a next information-transmission, and wherein said cell compose means alternately transmits a data-cell from said second buffer memory and a data-cell from said third buffer memory.

6. An error-correcting transmitter for storing (N/p)×p×L symbols (N>=2, p>=2, L>=2), wherein N/p is a number of symbols in a data-block, and for transmitting p×L data-blocks with k error-correction cells as a unit of information-transmission, comprising:

(A) a first buffer memory for storing and sending p number of said data-blocks as a data-cell;

(B) a second buffer memory for receiving said p number of data-blocks from said first buffer memory, for storing p×L number of said data-blocks, wherein the data-blocks are stored as an error-correction frame, and for storing k number of said error-correction cells;

(C) a check-symbol generator means for generating k number of said error-correction cells based on sets of L in the data-blocks of the error correction frame in a direction orthogonal to a direction of transmission, and for sending said error-correction cells to said second buffer memory; and, (D) a cell compose means for composing a data-cell with said p number of data-blocks from said first buffer memory, and for transmitting L number of data-cells before generating said k number of error-correction cells completely, and for transmitting said k number of said error-correction cells from said second buffer memory following said L number of said data-cells.

7. The error-correcting transmitter according to claim 6, further comprising an attach means for attaching cell-identifiers to each of said L data-cells.

8. The error-correcting transmitter according to claim 7, wherein said attach means attaches a cell-identifier to more than one data block in k data-cells, and wherein said cell compose means exchanges a data block having a cell-identifier with a data block in each of said error-correction cells, such that each of said data-cells and said error-correction cells includes one cell-identifier, and transmits each of said data-cells and said error-correction cells including said cell-identifiers.

9. The error-correcting transmitter according to claim 8, wherein said cell compose means exchanges said data blocks having cell-identifiers in said data-cells with data blocks in said correction cells in a single error-correction frame.

10. An error-correcting transmitter for storing (N/p)×p×L symbols (N>=2, p>=2, L>=2), wherein N/p is a number of symbols in a data-block, and for transmitting p×L data-blocks forming L number of data-cells with k error-correction cells as a unit of information-transmission, comprising:

(A) a first buffer memory for storing and sending p number of said data-blocks as a data-cell;

(B) a second buffer memory for receiving said data-cell from said first buffer memory, for storing L number of said data-cells, and for storing k number of said error-correction cells;

(C) a check-symbol generator means for generating k number of said error-correction cells based on L number of data-blocks in a direction in said second buffer memory different than a direction of transmission of said data-cells, and for sending said error-correction cells to said second buffer memory, wherein data-blocks of L direction perform an error-correction frame; and, (D) a cell compose means for transmitting L number of data-cells from said second buffer memory before said k number of error-correction cells are completely generated, and for transmitting said k number of said error-correction cells from said second buffer memory following said L number of said data-cells.

11. The error-correcting transmitter according to claim 10, wherein each data-block has an identical number of symbols.

12. The error-correcting transmitter according to claim 10, further comprising a third buffer memory for storing data-cells of a next information transmission, and wherein said cell compose means alternately transmits a data-cell from said second buffer memory and a data-cell from said third buffer memory.

13. The error-correcting transmitter according to claim 10, further comprising an attach means for attaching cell-identifiers to each of said L data-cells.

14. The error-correcting transmitter according to claim 13, wherein said attach means attaches a cell identifier to more than one data block in k data-cells, and wherein said cell compose means exchanges a data block having a cell-identifier with a data block in each of said error-correction cells such that each of said data-cells and said error-correction cells includes one cell-identifier, and transmits each of said data-cells and said error-correction cells including said cell-identifiers.

15. The error-correcting transmitter according to claim 14, wherein said cell compose means exchanges data-blocks having a cell-identifier with a data-block in a single error correction frame.

16. The error-correcting transmitter according to claim 14, further comprising a third buffer memory for storing data-cells of a next information-transmission, and wherein said cell compose means alternately transmits a data-cell from said second buffer memory and a data-cell from said third buffer memory.

17. An error-correcting receiver for receiving L data-cells of N×L data symbols including cell-identifiers (N>=2, L>=2) with k error-correction cells as a unit of information-transmission, and for decoding data from said data symbols, comprising:

(A) a buffer memory for storing N×L data symbols including attached cell-identifiers in each said data-cell, and for storing k error-correction cells;

(B) a cell-identifier detect means for detecting lost cells of said data-cells and error-correction cells by using said cell-identifiers;

(C) an error-correction frame collect means for collecting error correction frames, wherein said error correction frames each include symbols in one frame for error correction as a unit from said buffer memory, (D) cell-identifier exchange means for exchanging said cell-identifiers in said error-correction cells for symbols in said data-cells, based upon a predetermined rule, and, (E) an error-correction decode means for filling said lost cells in said buffer memory, for correcting data symbols in said data-cells by using said error-correction frames, and for decoding said N×L symbols of said data-cells.

18. The error-correcting receiver according to claim 17, further comprising synchronization detect means for detecting a synchronization state by monitoring said cell-identifiers.

19. The error-correcting receiver according to claim 17, further comprising a synchronization detect means for detecting error status with a plural error-syndrome detector of each error-correction frame, and for detecting synchronization state by monitoring outputs of said plural error-syndrome detectors.

20. An error-correcting receiver for receiving L number of p data-blocks including cell-identifiers (N>=2, L>=2) with k error-correction cells as a unit of information-transmission, and for correcting data-blocks in error using an error-correction frame, and for decoding data from said data-blocks, comprising:

(A) a buffer memory for storing said L number of p data-blocks and said k error-correction cells, including a cell-identifier in each p data-blocks and error correction cells, wherein each p data-blocks form a data-cell including N data symbols;

(B) a cell-identifier detect means for finding lost cells of said data-cells and error-correction cells by using said cell-identifiers;

(C) an error-correction frame collect means for collecting error correction frames, wherein said error correction frames each include symbols in one frame for error correction, (D) cell-identifier exchange means for exchanging said cell-identifiers in said error-correction cells for symbols in said data-cells, based upon a predetermined rule, and, (E) an error-correction decode means for filling said lost cells in said buffer memory, for correcting data-blocks in said data-cells by using said error-correction flames, and for decoding said N×L symbols of said data-blocks.

21. The error-correcting receiver according to claim 20, further comprising synchronization detect means for detecting a synchronization state by monitoring said cell-identifiers.

22. The error-correcting receiver according to claim 20, further comprising a synchronization detect means for detecting error status with a plural error-syndrome detector of each error-correction frame, and for detecting synchronization state by monitoring outputs of said plural error-syndrome detectors.

23. An error-correcting transmitter for storing N×L data symbols (N>=2, L>=2), wherein N data symbols for a data-cell, and for transmitting said data-cells with k error-correction cells as a unit of information-transmission, comprising:

(A) a memory for storing L number of said data-cells, and for storing k number of said error-correction cells;

(B) an error-detection symbol generator means for generating an error-detection-symbol in each data-cell;

(C) a check-symbol generator means for generating said k number of said error-correction cells based on L number of said data-cells in a direction of an error-correction frame which is different than a direction of transmission of said data-cells in said buffer memory, and for sending said error-correction cells to said buffer memory; and, (D) a cell compose means for composing said data-cells from said buffer memory including said error-detection symbols, for transmitting L number of said data-cells consecutively from said buffer memory, and for transmitting said k number of said error-correction cells from said buffer memory following said L number of said data-cells.

24. The error-correcting transmitter according to claim 23, further comprising an attach means for attaching cell-identifiers to each of said L data-cells.

25. The error-correcting transmitter according to claim 23, wherein said error-detection-symbol generator means generates q×m error-detection-symbols for q number of data-blocks.

26. An error-correcting transmitter for storing (N/p)×p×L symbols (N>=2, p>=2, L>=2), wherein N/p is a number of symbols in a data block, and for transmitting p×L data-blocks forming L number of data-cells and k error-correction cells as a unit of information-transmission, comprising:

(A) a buffer memory for storing L number of said data-cells, and for storing said k error-correction cells;

(B) an error-detection symbol generator means for generating an error-detection symbol in each data-cell;

(C) a check-symbol generator means for generating each of said error-correction cells based on L number of data-blocks arranged in a direction different from a direction of transmission in said buffer memory by unit of data-block, and for sending said error-correction cells to said buffer memory, wherein said L number of data-blocks form a portion of an error-correction frame; and, (D) a cell compose means for composing a data-cell from said buffer memory including an error-detection symbol, for transmitting L number of said data-cells before said k error-correction cells are completely generated, and for transmitting said k number of said error-correction cells from said buffer memory following said L number of said data-cells.

27. The error-correcting transmitter according to claim 26, further comprising attach means for attaching cell-identifiers to each of said L data-cells.

28. An error-correcting transmitter for storing N×L data symbols (N>=2, L>=2), wherein N data symbols form a data-cell, and for transmitting L number of said data-cells and k error-correction cells as a unit of information-transmission, comprising:

(A) a buffer memory for storing said L number of said data-cells and for storing said k error-correction cells;

(B) an error detection symbol generator means for generating error-detect symbols in a direction different from a direction of transmission;

(C) a check-symbol generator means for generating k number of said error-correction cells based on L number of symbols in said direction different from said direction of transmission, said L forming a portion of an error-correction frame in said buffer memory, and for sending said error-correction cells to said buffer memory; and, (D) a cell compose means for composing said data-cells from said buffer memory, for transmitting L number of said data-cells, and for transmitting m number of said error-detect cells, and for transmitting k number of said error-correction cells following to said L number of data-cells.

29. The error-correcting transmitter according to claim 28, further comprising attach means for attaching cell-identifiers to each of said L data-cells.

30. The error-correcting transmitter according to claim 28, wherein said error-detection symbol generator means generates q×m error-detection symbols for q number of data blocks.

31. An error-correcting receiver for receiving L data-cells of N×L data symbols including m error-detection symbols and cell-identifiers (N>=2, L>=2) with k error-correction cells as a unit of information-transmission, and for decoding data from said data symbols, comprising:

(A) a buffer memory for storing N×L data symbols including said cell-identifiers in said data-cells, and for storing k error-correction cells;

(B) a cell identifier detect means for detecting lost cells of said data-cells and error-correction cells by using said cell-identifiers;

(C) an error detect means for detecting a symbol error in said data-cells;

(D) error-flag attach means for attaching an error-flag to a data-cell in case of detecting a symbol error in said data-cell; and, (E) an error-correction decode means for filling said lost cells in said buffer memory, for correcting data symbols in said data-cells, and for decoding said N×L symbols of said data-cells.

32. The error correcting receiver according to claim 31, wherein said error-detect means detects errors in data-blocks by using q×m error-detect-symbols.

33. An error-correcting receiver for receiving L number of p data-blocks including cell-identifiers (L>=2, p>=2) with k error-correction cells as a unit of information transmission, for correcting data-blocks using an error-correction frame, and for decoding data from said data cells, comprising:

(A) a buffer memory for storing said L number of p data-blocks and said k error-correction cells, including a cell-identifier in each set of p data-blocks and error-correction cells, wherein each p data-blocks form a data-cell including N data symbols;

(B) a cell-identifier detect means for detecting lost data-cells and error-correction cells by u sing said cell-identifiers;

(C) an error detect means for detecting errors in data-blocks in said data-cells;

(D) error-flag attach means for attaching an error-flag to a data-cell in case of detecting a symbol error in said data-cell; and, (E) an error-correction decode means for filling said lost cells in said data-cells, and for decoding said N×L symbols of said data-blocks.

34. An error-correcting receiver for receiving L data-cells of N×L data symbols including m error-detection symbols and cell-identifiers (N>=2, L>=2) with k error-correction cells as a unit of information-transmission, and for decoding data from said data symbols, comprising:

(A) a buffer memory for storing N×L data symbols including said cell-identifiers in each data-cells;

(B) a cell-identifier detect means for detecting lost data-cells and error-correction cells by using said cell-identifiers;

(C) an error detect means for detecting symbol errors in said data-cells;

(D) error-flag attach means for attaching an error-flag to a data-cell in case of detecting a symbol error in said data-cell; and, (E) an error-correction decode means for decoding said N×L symbols of said data-cells.

35. A data transmission system for transmitting N×L data symbols with N×k error-correction, symbols, and for receiving said N×L data symbols, comprising;

(A) an error-correcting transmitter having a check-symbol generator means for generating k number of said error-correction symbols based on L data symbols in an error-correction frame which is in a direction different from a direction of transmission, a cell compose means for composing a transmission cell of N symbols including identifiers in each said transmission cell and for transmitting L number of said transmission cells before generating error-correction cells and for transmitting k error-correction cells; and, (B) an error-correcting receiver for receiving said N×L data symbols.

36. The data transmission system according to claim 35, wherein said cell compose means composes a transmission cell of p data-blocks including N symbols, and wherein said check-symbol generator means generates error-correction symbols in data-block units, and wherein said error-correcting receiver receives said transmission cells of p data-blocks.

37. The data transmission system according to claim 35, wherein said error-correcting transmitter further comprises an error-detection symbol generator means for generating an error-detection symbol in each transmission cell, and wherein said error-correcting receiver further comprises an error detect means for detecting symbol errors in said transmission cell.

38. A method for transmitting N×L data symbols (N>=2, L>=2) with k error-correction cells, comprising the steps of:

(A) storing N number of data symbols forming a data-cell;

(B) transmitting said data-cell;

(C) storing L number of said data-cells as an error-correction frame in a different direction than a direction of transmission;

(D) generating error-correction symbols to form error-correction cells based on said error-correction frame;

(E) attaching cell-identifiers to more than one symbol in some data cells;

(F) exchanging each of said additional symbols having a cell-identifier in a data cell with a symbol in an error-correction cell in said error-correction frame; and, (G) transmitting said error-correction cells.

39. The methods of claim 38, further comprising the step of attaching cell-identifiers to said data-cells and error-correction cells.

40. The method of claim 38, further comprising the step of generating error-detection symbols for each data-cell.

41. A method for transmitting N×L data symbols (N>=2, L>=2) with k error-correction cells, comprising the steps of:

(A) storing p number of data blocks forming a data-cell, wherein each of said data blocks includes N/p data symbols;

(B) transmitting said data-cell;

(C) storing L number of said data-cells forming a portion of an error-correction frame in a different direction than a direction of transmission;

(D) generating error-correction symbols by unit of data blocks to form error-correction cells based on said error-correction frame;

(E) attaching cell-identifiers to more than one symbol in some data cells;

(F) exchanging each of said additional symbols having a cell-identifier in a data cell with a symbol in an error-correction cell in said error-correction frame; and, (G) transmitting said error-correction cells.

42. The method of claim 25, further comprising the steps of:

attaching cell-identifiers to more than one data block in some data-cells, and exchanging each of said additional data blocks having a cell-identifier in a data cell with a data block in an error-correction cell in the same error-correction frame.

43. The method of claim 41, further comprising the step of generating error-detection symbols for each data-cell.

44. A method for receiving L data-cells of N×L data symbols (N>=2, L>=2) with k error-correction cells including error-detection symbols and identifiers in each data-cell and error-correction cell, comprising the steps of:

(A) storing said N×L data symbols and k error-correction cells forming an error correction frame;

(B) detecting lost data-cells and error-correction cells by using said identifiers;

(C) detecting erroneous symbols in said data-cells using said error-detection symbols;

(D) filling lost cells using error-correction symbols in said error correction frame; and (E) correcting data symbols in error using said error-correction symbols in said correction frame when a symbol error is detected.

45. An error-correcting transmitter for transmitting data, comprising:

a memory for storing a plurality of data-cells and a plurality of error-correction cells, each of said data-cells including a plurality of data units;

a check data generator means for forming a plurality of error-correction frames of data units of said data-cells stored in said second memory, for generating a plurality of check data for each of said error-correction frames, and for storing said check data in said memory as said error-correction cells; and cell compose means for composing and transmitting said data-cells and said error-correction cells; and wherein said cell compose means composes and transmits said data-cells before said check data generator means has completed generating and storing said check data.

46. The error-correcting transmitter according to claim 45, wherein said data unit is a single symbol, wherein each of said error-correction frames includes a unique selected symbol from each of said data-cells, and wherein said check data for each error-correction frame includes a single symbol stored in each error-correction cell.

47. The error-correcting transmitter according to claim 45, wherein said data unit is a data block having a plurality of symbols, wherein each of said error-correction frames includes a unique selected data block from each of said data-cells, and wherein said check data for each error-correction frame includes a single data block stored in each error-correction cell.

48. The error-correcting transmitter according to claim 45, wherein said memory includes a first memory for storing a plurality of symbols as a data-cell, and a second memory for storing a plurality of data-cells from said first memory and for storing said error-correction cells, wherein said cell compose means receives and transmits said data-cell from said first memory, and receives and transmits said error-correction cells from said second memory.

49. The error-correcting transmitter according to claim 45, further comprising error-detection means for generating at least one error-detection symbol for each data-cell.

50. The error-correcting transmitter according to claim 45, further comprising error-detection means for generating at least one error-detection symbol for each error-correction frame.

51. The error-correcting transmitter according to claim 45, further comprising cell-identifier means for attaching cell identifiers to said data-cells.

52. The error-correcting transmitter according to claim 51, wherein said cell-identifier means further attaches cell identifiers to said error-correction cells.

53. The error-correcting transmitter according to claim 52, wherein said cell-identifier means includes:

data-cell identifier means for attaching cell-identifiers to a plurality of data units in said data-cells, and data unit exchange means for exchanging data units in said data-cells having attached cell-identifiers with data units in said error-correction cells, such that each data-cell and error-correction cell has a cell-identifier attached to a data unit in that cell.

* * * * *